(12) United States Patent
Udagawa

(10) Patent No.: US 8,084,781 B2
(45) Date of Patent: Dec. 27, 2011

(54) COMPOUND SEMICONDUCTOR DEVICE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 545 days.

(21) Appl. No.: 12/066,055

(22) PCT Filed: Sep. 6, 2006

(86) PCT No.: PCT/JP2006/318098
§ 371 (c)(1),
(2), (4) Date: Jun. 23, 2008

(87) PCT Pub. No.: WO2007/029865
PCT Pub. Date: Mar. 15, 2007

(65) Prior Publication Data
US 2009/0309135 A1   Dec. 17, 2009

Related U.S. Application Data

(60) Provisional application No. 60/717,759, filed on Sep. 19, 2005, provisional application No. 60/718,331, filed on Sep. 20, 2005, provisional application No. 60/720,482, filed on Nov. 7, 2005, provisional application No. 60/721,592, filed on Sep. 29, 2005, provisional application No. 60/722,423, filed on Oct. 3, 2005, provisional application No. 60/725,323, filed on Oct. 12, 2005, provisional application No. 60/734,316, filed on Nov. 8, 2005.

(30) Foreign Application Priority Data

| Sep. 7, 2005 | (JP) | 2005-259042 |
|---|---|---|
| Sep. 9, 2005 | (JP) | 2005-261946 |
| Sep. 14, 2005 | (JP) | 2005-266418 |
| Sep. 16, 2005 | (JP) | 2005-269516 |
| Sep. 26, 2005 | (JP) | 2005-277536 |
| Sep. 30, 2005 | (JP) | 2005-286495 |
| Oct. 27, 2005 | (JP) | 2005-312758 |

(51) Int. Cl.
*H01L 33/00* (2010.01)
(52) U.S. Cl. ............ 257/103; 257/627; 257/628
(58) Field of Classification Search ........... 257/627, 257/628, 103
See application file for complete search history.

(56) References Cited

U.S. PATENT DOCUMENTS 6,072,197 A * 6/2000 Horino et al. .......... 257/103
(Continued)

FOREIGN PATENT DOCUMENTS

JP  55-3834 B2  1/1980
(Continued)

OTHER PUBLICATIONS

Takashi Udagawa, et al.; "Heteroepitaxial growth of boronphosphide III-V semiconductor on silicon by organometallic chemical vapor deposition"; Journal of Ceramic Processing Research; vol. 4, No. 2 (2003); pp. 80-83.

(Continued)

*Primary Examiner* — Kenneth Parker
*Assistant Examiner* — Dale E Page
(74) *Attorney, Agent, or Firm* — Sughrue Mion, PLLC

(57) ABSTRACT

A compound semiconductor device (1) includes a compound semiconductor having a stacked structure (100) of a hexagonal single crystal layer (101), a boron phosphide-based semiconductor layer (102) formed on a surface of the hexagonal single crystal layer and a compound semiconductor layer (103) disposed on the boron phosphide-based semiconductor layer, and electrodes (108, 109) disposed on the stacked structure, wherein the boron phosphide-based semiconductor layer is formed of a hexagonal crystal disposed on a surface formed of a (1.1.-2.0.) crystal face of the hexagonal single crystal layer.

16 Claims, 19 Drawing Sheets

U.S. PATENT DOCUMENTS

2004/0169184 A1 * 9/2004 Udagawa et al. ............... 257/86

FOREIGN PATENT DOCUMENTS

| JP | 02-275682 A | 11/1990 |
| JP | 2-275682 A | 11/1990 |
| JP | 02-288371 A | 11/1990 |
| JP | 2-288371 A | 11/1990 |
| JP | 2-288388 A | 11/1990 |
| JP | 03-024770 A | 2/1991 |
| JP | 03-211888 A | 9/1991 |
| JP | 4-84486 A | 3/1992 |
| JP | 4-213878 A | 8/1992 |
| JP | 09-232685 A | 9/1997 |
| JP | 10-287497 A | 10/1998 |
| JP | 2002-232000 A | 8/2002 |
| JP | 2002-368260 A | 12/2002 |
| JP | 2003-309284 A | 10/2003 |
| JP | 2004-146424 A | 5/2004 |
| JP | 2004-179444 A | 6/2004 |
| JP | 2004-186291 A | 7/2004 |
| JP | 2005-005657 A | 1/2005 |
| JP | 2005-093991 A | 4/2005 |

OTHER PUBLICATIONS

T. Udagawa, et al.; High resolution TEM characterization of MOVPE-grown (1 1 1)-BP layer on hexagonal 6H (0 0 0 1)-SiC; Applied Surface Science; No. 244 (2005); pp. 285-288.

Kimiyasu Saka; "Crystal Electronmicroscopy"; Material Engineering Series; Uchida Rokakuho Publishing Co., Ltd; Nov. 25, 1997; pp. 64-65.

Yoshihisa Abe, et al.; "SiC epitaxial growth on Si(0 0 1) substrates using a BP buffer layer"; Journal of Crystal Growth; No. 283 (2005); pp. 41-47.

Kimiyasu Saka; "Crystal Electronmicroscopy"; Material Engineering Series; Uchida Rokakuho Publishing Co., Ltd; Nov. 25, 1997; pp. 2-7.

Brian R. Pamplin; "Crystal Growth"; (International Series of monographs on the science of the solid state); vol. 6; 1975; pp. 4-5.

T. Udagawa, et al.; "Lattice-matched boronphosphide (BP)/hexagonal GaN heterostructure for inhibition of dislocation penetration"; phys. stat. sol. (c) 0; No. 7 (2003); pp. 2027-2030.

J.C. Phillips; "Bonds and Bands in Semiconductors"; Academic Press; 1973; pp. 50-51.

* cited by examiner

The c axis of the hexagonal BP ⟶

COMPOUND SEMICONDUCTOR DEVICE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Applications No. 60/717,759 filed Sep. 19, 2005, No. 60/718,331 filed Sep. 20, 2005, No. 60/720,482 filed Nov. 7, 2005, No. 60/721,592 filed Sep. 29, 2005, No. 60/722,423 filed Oct. 3, 2005, No. 60/725,323 filed Oct. 12, 2005 and No. 60/734,316 filed Nov. 8, 2005 and Japanese Patent Application No. 2005-259042 filed Sep. 7, 2005, No. 2005-261946 filed Sep. 9, 2005, No. 2005-266418 filed Sep. 14, 2005, No. 2005-269516 filed Sep. 16, 2005, No. 2005-277536 filed Sep. 26, 2005, No. 2005-286495 filed Sep. 30, 2005 and No. 2005-312758 filed Oct. 27, 2005 pursuant to 35 U.S.C. §111(b).

TECHNICAL FIELD

This invention relates to a compound semiconductor device configured by having electrodes disposed on a stacked structure provided with a hexagonal single crystal, a boron phosphide-based semiconductor layer formed on the surface of the single crystal, and a compound semiconductor layer formed of a compound semiconductor on the boron phosphide-based semiconductor layer, the compound semiconductor device being provided on the surface formed of a (1.1.-2.0.) crystal face of the aforementioned single crystal layer with the aforementioned boron phosphide-based semiconductor layer of a hexagonal crystal.

BACKGROUND ART

Heretofore, the boron phosphide-based semiconductor layer, as disclosed in JP-A HEI 2-288388, for example, has been formed on a substrate made of a cubic zinc-blende crystal gallium phosphide (GaP) or silicon carbide (SiC) single crystal.

In JP-A HEI 2-288371 and JP-A HEI 2-275682, it is disclosed that the Light-Emitting Diode (LED) of a compound semiconductor device is composed of such a a boron phosphide-based semiconductor layer formed thereon, and a Group III nitride semiconductor layer disposed as bonded thereto. In U.S. Pat. No. 6,194,744 B1, it is disclosed that a boron phosphide-based semiconductor layer such as of monomeric Boron Phosphide (BP) is formed on a silicon single crystal (silicon) as a substrate. In U.S. Pat. No. 6,069,021, a technique of configuring an LED from a stacked structure provided with a silicon substrate, a monomeric BP layer, and a Group III nitride semiconductor layer disposed thereon is disclosed.

As disclosed in JP-A HEI 2-275682, in the configuration of the LED by the use of a boron phosphide-based semiconductor layer formed on a single crystal substrate, the ohmic electrodes have been heretofore disposed on a cubic zinc-blende crystal boron phosphide layer. As disclosed in JP-A HEI 4-84486, even in the conventional laser diode (LD), the ohmic electrodes are disposed as held in contact with a cubic boron phosphide layer.

Further, as disclosed in JP-B SHO 55-3834, the blue- and green LED's have been heretofore configured by utilizing a stacked structure provided with a Group III nitride semiconductor layer formed of gallium nitride (GaN) and disposed on a single crystal substrate. In JP-A HEI 4-213878, for example, the light-emitting part of the short wavelength visible or near ultraviolet or ultraviolet LED configured by the hetero-junction of a clad layer formed of a Group III nitride semiconductor material and a light-emitting layer is disclosed.

It is disclosed in JP-A HEI 10-287497 that even the Field Effect Transistor (FET) operating in the high frequency is configured by utilizing a stacked structure provided with a Group III nitride semiconductor layer such as of aluminum-gallium nitride ($Al_xGa_{1-x}N$: $0 \leqq X \leqq 1$) disposed on a silicon substrate, for example.

Meanwhile, as disclosed in JP-A 2004-186291, an example of the technique of configuring the light-emitting part of a Double-Hetero (DH) structure using a cubic zinc blende crystal boron phosphide-based semiconductor layer as a clad layer has been known.

The light-emitting layer constituting a light-emitting part and the cubic boron phosphide-based semiconductor layer constituting a clad layer functioning as a barrier layer for the light-emitting layer can be formed, as disclosed in JP-A HEI 3-87019, by utilizing a cubic zinc-blende crystal gallium arsenide (GaAs) for an under layer.

Even when a substrate is formed of silicon and a boron phosphide-based semiconductor layer is grown on the surface formed of a (111) crystal face of the substrate, however, the layer consequently grown eventually contains crystalline defects, such as stacking faults and twins, in a large amount (T. Udagawa and G. Shimaoka, J. Ceramic Processing Res., (Republic of Korea), Vol. 4, No. 2, 2003, pp. 80-83). When a substrate is formed of a hexagonal 6H-type SiC and a monomeric BP layer is grown on a (0.0.0.1.) crystal face thereof, the layer consequently grown eventually contains crystalline defects, such as twins, in a large amount (T. Udagawa et al, Appl. Surf. Sci., (U.S.A), Vol 244, 2004, pp. 285-288). Even when using the stacked structure that is provided with the boron phosphide-based semiconductor layer containing such crystalline defects in a large amount, for example, there is the problem that the LED possessing high voltage in the reverse direction and manifesting a high efficiency in photoelectric conversion, for example, cannot be stably manufactured.

The GaN layer that is grown on a substrate of sapphire ($\alpha$-$Al_2O_3$ single crystal), for example, contains crystalline defects, such as dislocations, in a large amount. Even when using the Group III nitride semiconductor layer containing crystalline defects, such as dislocations, in a large amount for a functional layer, such as a light-emitting layer, there is the problem that the produced LED will not be enabled to increase the voltage in the reverse direction or to enhance the efficiency of photoelectric conversion. Furthermore, for example, the configuration of the FET by utilizing as an electron transporting layer (channel layer) the Group III nitride semiconductor layer containing crystalline defects in a large amount entails the problem that the high-frequency properties, such as power output, will not be enhanced fully satisfactorily because of the failure to acquire high electron mobility.

The thin layers made of the conventional boron phosphide-based semiconductor material and Group III nitride semiconductor materials contain anti-phase boundaries ("Crystal Electron Microscopy," written by Hiroyasu Saka and published by Uchida Rokakuho Co., Ltrd., on Nov. 25, 1997, first edition, pp. 64-65) (Y Abe et al, Journal of Crystal Growth (Holland), Vol 283, 2005, pp. 41-47). Heretofore, the compound semiconductor devices have not been always manufactured by utilizing semiconductor layers of superior quality excelling in crystallinity. Incidentally, the term "Anti-Phase Domain" (APD) or "Anti-Phase Boundary" (APB) used herein refers to a boundary in which the phase regarding the arrangement of atoms in a crystal is deviated by 180 degrees (half cycle). This boundary frequently occurs in the ordered phase of a binary alloy.

The boron phosphide-based crystal layer and the Group III nitride semiconductor layer which contain the anti-phase boundaries in a large amount and reveal inferior crystallinity hinder the effort to obtain the LED excelling in efficiency of light emission and the FET excelling in electrical properties with sufficient stability.

Even when the ohmic electrodes are disposed contiguously to a cubic boron phosphide-based semiconductor layer containing crystalline defects in a large amount, they entail the problem that the LED possessing a high voltage in the reverse direction and manifesting a high efficiency of photoelectric conversion will not be stably manufactured because the operating current for operating the device (device-operating current) incurs desirable leakage via crystalline defects, such as twins. Even when Schottky contact is disposed on the surface of a cubic boron phosphide-based semiconductor layer abounding in crystalline defects, they entail the problem that the FET excelling in high-frequency properties will not be stably produced because the gate electrode suffering from great leakage current and deficient breakdown voltage is formed eventually and the drain current manifests an inferior pinch-off property.

Though it has been disclosed as mentioned above that the light-emitting part of the short wavelength visible or near ultraviolet or ultraviolet LED can be configured by the hetero junction of a clad layer formed of a Group III nitride semiconductor material and a light-emitting layer, the boron phosphide-based semiconductor layer formed on the under layer made of the conventional cubic crystal eventually becomes a crystal layer which contains crystalline defects in a large amount because of insufficient lattice matching with the under layer. The layer in question, for example, entails the problem that, owing to the mismatching of lattice with the under layer, it will eventually become a crystalline layer containing plane defects, such as twins and stacking faults copiously. When the light-emitting part of the LED is manufactured by using as the clad layer, for example, the boron phosphide-based semiconductor layer copiously containing such crystalline defects, no success has yet been achieved in producing stably the LED of high luminance because the occurrence of the short-circuit flow of the current for operating the LED to the light-emitting layer prevents the surface area for light emission from being expanded.

This invention has been produced in view of the true state of the prior art mentioned above and is directed toward the following aims.

(1) This invention is aimed at providing a semiconductor device capable of enabling a boron phosphide-based semiconductor layer to contain crystalline defects, such as twins and stacking faults, only in a small density and excel in crystallinity and capable of enhancing the various properties of the device by making use of the boron phosphide-based semiconductor layer.

(2) This invention is further aimed at providing a compound semiconductor device capable of obtaining a stacking structure provided with a semiconductor layer excelling in crystallinity even when it is furnished on a substrate with a Group III nitride semiconductor layer containing crystalline defects in a large amount and capable of enhancing the characteristic properties of the device.

(3) This invention is further aimed at providing a compound semiconductor device capable of producing a compound semiconductor device excelling in optical properties and electrical properties by making use of a thin layer made of a boron phosphide-based semiconductor material of superior quality containing anti-phase boundaries only in a small amount or a Group III nitride semiconductor material.

(4) This invention is further aimed at providing a semiconductor device furnished with a boron phosphide-based semiconductor layer capable of decreasing the leak of the device-operating current, heightening the efficiency of photoelectric conversion as a light-emitting device, heightening the voltage in the reverse direction, imparting high breakdown voltage to the gate electrode as a field effect transistor, and improving the pinch-off property of the drain current.

(5) This invention is further aimed at providing a semiconductor light-emitting device capable of configuring a clad layer constituting the light-emitting part of a DH structure with a boron phosphide-based semiconductor layer of superior quality containing crystalline defects only in a small amount and enhancing the light-emitting property.

DISCLOSURE OF THE INVENTION

The first aspect of this invention, with a view to accomplishing the objects mentioned above, is directed toward a compound semiconductor device configured by having electrodes disposed on a stacked structure provided with a hexagonal single crystal, a boron phosphide-based semiconductor layer formed on the surface of the single crystal, and a compound semiconductor layer disposed on the boron phosphide-based semiconductor layer and formed of a compound semiconductor and is characterized by having the boron phosphide-based semiconductor layer formed of a hexagonal crystal and disposed on the surface formed of a (1.1.-2.0.) crystal face of the single crystal layer.

The second aspect of this invention is characterized by having the single crystal layer in the configuration of the first aspect of the invention mentioned above formed of sapphire α-alumina single crystal).

The third aspect of this invention is characterized by having the single crystal layer in the configuration of the first aspect of the invention formed of a hexagonal Group III nitride semiconductor.

The fourth aspect of this invention is characterized by having the boron phosphide-based semiconductor layer in the configuration of the first aspect of the invention formed of a crystal having a (1.1.-2.0.) crystal face as its surface.

The fifth aspect of this invention is characterized by having the boron phosphide-based semiconductor layer in the configuration of the first aspect of the invention formed of a crystal having a (1.0.-1.0.) crystal face as its surface.

The sixth aspect of this invention is characterized by having (0.0.0.1.) crystal faces inside the boron phosphide-based semiconductor layer in the configuration of the first aspect of the invention arranged substantially parallel to the direction of thickness of the layer and the distance of n (n denoting a positive integer of 2 or more) continuous (0.0.0.2.) crystal faces of the layer substantially equalized to the length of the c-axis of the single crystal.

The seventh aspect of this invention is characterized by causing the number n of the aforementioned (0.0.0.2.) crystal faces in the configuration of the sixth aspect of the invention to be 6 or less.

The eighth aspect of this invention is characterized by having the aforementioned compound semiconductor layer in the configuration of the first aspect of the invention formed of a hexagonal semiconductor material.

The ninth aspect of this invention is characterized by having the aforementioned boron phosphide-based semiconductor layer and the aforementioned compound semiconductor layer in the configuration of the first aspect of the invention joined along a (1.1.-2.0.) crystal face as the interface.

The tenth aspect of this invention is characterized by having the aforementioned boron phosphide-based semiconductor layer and the aforementioned compound semiconductor layer in the configuration of the first aspect of the invention joined along a (1.0.-1.0.) crystal face as the interface.

The eleventh aspect of this invention is characterized by having the (0.0.0.1.) crystal face constituting the aforementioned compound semiconductor layer and the (0.0.0.1.) crystal face constituting the aforementioned boron phosphide-based semiconductor layer in the configuration of the ninth or tenth aspect of the invention arranged parallel to the stacking direction of the aforementioned compound semiconductor.

The twelfth aspect of this invention is characterized by having the aforementioned boron phosphite-based semiconductor layer in the configuration of the first aspect of the invention formed of a hexagonal boron phosphide-based semiconductor containing no anti-phase boundary.

The thirteenth aspect of this invention is characterized by having the aforementioned electrodes in the configuration of the first aspect of the invention disposed so as to cause the device-operating current to flow in a direction substantially parallel to both the (0.0.0.1.) crystal face constituting the aforementioned boron phosphide-based semiconductor layer and the (0.0.0.1.) crystal face constituting the aforementioned compound semiconductor layer.

The fourteenth aspect of this invention is characterized by having the aforementioned electrodes in the configuration of the first aspect of the invention disposed so as to cause the device-operating current to flow in a direction substantially perpendicular to both the (0.0.0.1.) crystal face constituting the aforementioned boron phosphide-based semiconductor layer and the (0.0.0.1.) crystal face constituting the aforementioned compound semiconductor layer.

The fifteenth aspect of this invention is characterized by having the aforementioned boron phosphide-based semiconductor layer in the configuration of the first aspect of the invention formed of a hexagonal monomeric boron phosphide.

The sixteenth aspect of this invention is characterized by having the length of the c-axis of the aforementioned hexagonal monomeric boron phosphide in the configuration of the $14^{th}$ aspect of the invention fall in the range between 0.52 nm or more and 0.53 nm or less.

According to the first aspect of this invention, since the compound semiconductor device configured by having electrodes disposed on a stacked structure provided with a hexagonal single crystal, a boron phosphide-based semiconductor layer formed on the surface of the single crystal, and a compound semiconductor layer disposed on the boron phosphide-based semiconductor layer and formed of a compound semiconductor is provided on the surface formed of a (1.1.-2.0.) crystal face of the aforementioned single crystal layer with the aforementioned boron phosphide-based semiconductor layer formed of a hexagonal crystal, the boron phosphide-based semiconductor layer containing crystalline defects, such as twins and stacking faults, only in a small density and excelling in crystallinity can be formed. As a result, the boron phosphide-based semiconductor layer excelling in crystallinity can be utilized for providing a semiconductor device of high performance.

According to the second aspect of this invention, since the hexagonal single crystal layer is formed of sapphire (α-alumina single crystal) and the hexagonal boron phosphide-based semiconductor layer is disposed on the surface of the sapphire formed of a (1.1.-2.0.) crystal face, the hexagonal boron phosphide-based semiconductor layer having the <1.-1.0.0.> direction thereof oriented parallel to the <1-1.0.0.> direction of the sapphire and having a (1.1.-2.0.) crystal face as its surface can be stably formed.

According to the third aspect of this invention, since the hexagonal single crystal layer is formed of a Group III nitride semiconductor and provided with a first stacked structural part composed of a hexagonal Group III nitride semiconductor having a (1.1.-2.0.) crystal face as its surface and a hexagonal boron phosphide-based semiconductor layer disposed as bonded to the surface of the Group III nitride semiconductor, the dislocation included in the Group III nitride semiconductor can be suppressed from being further permeated through the interface of the stacked structural part and propagated toward the boron phosphide-based semiconductor layer side. Further according to the third aspect of this invention, the hexagonal boron phosphide-based semiconductor layer constituting the aforementioned first stacked structural part can be provided on the upper-side surface thereof with a second stacked structural part by causing a hexagonal Group III nitride semiconductor to be further bonded to the upper-side surface. By further providing the second stacked structural part, it is made possible to produce a Group III nitride semiconductor having the density of such crystalline defects as penetrating dislocation further decreased. The third aspect of this invention, therefore, allows production of a stacked structure furnished with a semiconductor layer excelling in crystallinity and manifests an effect of enabling manufacture of a compound semiconductor device excelling in characteristic properties.

According to the fourth aspect of this invention, since the hexagonal boron phosphide-based semiconductor layer is disposed on the surface formed of a (1.1.-2.0.) crystal face of the hexagonal single crystal layer and formed of a crystal having a (1.1.-2.0.) crystal face as its surface, the hexagonal boron phosphide-based semiconductor layer having as a (1.1.-2.0.) crystal face the surface having the <1.-1.0.0.> direction thereof oriented parallel to the <1-1.0.0.> direction of the hexagonal single crystal layer can be obtained stably. The boron phosphide-based semiconductor layer mentioned above contains crystalline defects, such as twins, only in a small density and excels in crystallinity. As a result, the hexagonal boron phosphide-based semiconductor layer excelling in crystallinity can be utilized for stably providing a semiconductor device of high performance. Further, the fourth aspect of this invention is capable of forming on the (1.1.-2.0.) crystal face constituting the surface of the hexagonal single crystal layer the hexagonal boron phosphide-based semiconductor layer having a (1.1.-2.0.) crystal face bonded to the surface, having a (1.1.-2.0.) crystal face as its surface, and having a (0.0.0.1.) crystal face arranged therein in a perpendicular direction and also capable of forming on a (1.1.-2.0.) crystal face constituting the surface of the boron phosphide-based semiconductor layer the compound semiconductor layer composed of the hexagonal Group UIII nitride semiconductor which has a (1.1.-2.0.) crystal face bonded to the surface thereof, having a (1.1.-2.0.) crystal face as its surface, and having a (0.0.0.1.) crystal face arranged therein in a perpendicular direction. The fourth aspect of this invention, therefore, enables the boron phosphide-based semiconductor layer and the compound semiconductor layer each to become a layer showing virtually no discernible sign of crystalline defects, such as anti-phase boundaries, stacking faults or twins and excelling in crystallinity and exhibits an effect of producing a semiconductor light-emitting device emitting light of high intensity.

According to the fifth aspect of this invention, since the hexagonal boron phosphide-based semiconductor layer is disposed on the surface formed of a (1.1.-2.0.) crystal face of the hexagonal single crystal layer and formed of a crystal having a (1.0.-1.0.) crystal face as its surface, the hexagonal boron phosphide-based semiconductor layer having as a (1.0.-1.0.) crystal face the surface having the <1.-1.0.0.> direction thereof oriented parallel to the <1.-1.0.0.> direction of the hexagonal single crystal layer can be obtained stably. The boron phosphide-based semiconductor layer contains crystalline defects, such as twins, only in a small density and excels in crystallinity. The fifth aspect of this invention, therefore, can provide stably a semiconductor device of high performance by utilizing the hexagonal boron phosphide-based semiconductor layer thus excelling in crystallinity. Further, the fifth aspect of this invention is capable of forming on the (1.1.-2.0.) crystal face constituting the surface of the hexagonal single crystal layer the hexagonal boron phosphide-based semiconductor layer having the (1.0.-1.0.) crystal face thereof bonded to the surface, having the (1.0.-1.0.) crystal face as its surface, and having a (0.0.0.1.) crystal face arranged therein in a perpendicular direction and also capable of forming on the (1.0.-1.0.) crystal face constituting the surface of the boron phosphide-based semiconductor layer the compound semiconductor layer formed of a hexagonal Group III nitride semiconductor having the [1.1.-2.0.) crystal face thereof bonded to the surface, having the (1.1.-2.0.) crystal face as its surface, and having a (0.0.0.1.) crystal face arranged therein in a perpendicular direction. The fifth aspect of this invention, therefore, enables the boron phosphide-based semiconductor layer and the compound semiconductor layer each to become a layer showing virtually no discernible sign of crystalline defects, such as anti-phase boundaries, stacking faults or twins and excelling in crystallinity and exhibits an effect of producing a semiconductor light-emitting device emitting light of high intensity.

According to the sixth aspect of this invention, the aforementioned boron phosphide-based semiconductor layer has the (0.0.0.1.) crystal face arranged therein substantially parallel to the direction of thickness of the layer and the distance of n (n denoting a positive integer of 2 or more) continuous (0.0.0.2.) crystal faces of the layer substantially equalized to the length of the c-axis of the aforementioned single crystal. Since the hexagonal boron phosphide-based semiconductor excels in the long period matching property with the hexagonal single crystal, this hexagonal boron phosphide-based semiconductor finally contains crystalline defects only in a small amount and excels in crystallinity. The sixth aspect of this invention, therefore, is capable of forming a compound semiconductor device with a hexagonal boron phosphide-based semiconductor containing crystalline defects only in a small amount and excelling in crystallinity and, therefore, manifesting an effect of enhancing the characteristic properties of the compound semiconductor device.

According to the seventh aspect of this invention, since the boron phosphide-based semiconductor layer is so formed that the number n of the (0.0.0.2.) crystal planes may be 6 or less, the hexagonal boron phosphide-based semiconductor layer to be obtained contains misfit dislocations only in a small amount and possesses superior quality. Owing to this configuration, the seventh aspect of this invention manifests an effect of allowing fabrication of an LED excelling in electrical breakdown voltage.

According to the eighth aspect of this invention, since the compound semiconductor layer is formed of a hexagonal semiconductor material, the utilization of a Group III nitride semiconductor layer containing anti-phase boundaries only in a small density and excelling in crystallinity brings an effect of enabling production of a short wavelength visible LED abounding in intensity of light emission.

According to the ninth aspect of this invention, since the boron phosphide-based semiconductor layer and the compound semiconductor layer are so formed as to be bonded along the (1.1.-2.0.) crystal face as the interface, a stacked structure consisting of a hexagonal boron phosphide-based semiconductor layer containing no anti-phase boundary and a hexagonal compound semiconductor layer containing no anti-phase boundary can be formed stably. Owing to the stacked structure, therefore, the ninth aspect of this invention brings an effect of enabling stable production of a semiconductor device, such as a short wavelength visible LED, which excels in optical and electrical properties.

According to the tenth aspect of this invention, since the boron phosphide-based semiconductor layer and the compound semiconductor layer are so formed as to be bonded along the (1.0.-1.0.) crystal face as the interface, a stacked structure consisting of a hexagonal boron phosphide-based semiconductor layer containing no anti-phase boundary and a hexagonal compound semiconductor layer containing no anti-phase boundary can be stably formed. The tenth aspect of this invention, therefore, brings an effect of enabling stable production of a short wavelength visible LED, for example, which excels in optical and electrical properties owing to the stacked structure.

According to the eleventh aspect of this invention, since the (0.0.0.1.) crystal face constituting the compound semiconductor layer and the (0.0.0.1.) crystal face constituting the boron phosphide-based semiconductor layer are arranged parallel to the stacking direction of the compound semiconductor, the resistance to the flow of the device-operating current can be decreased. The eleventh aspect of this invention, therefore, brings an effect of enabling production of an LED exhibiting a high efficiency of photoelectric conversion and a high-frequency Field Effect Transistor (FET) suffering insignificantly from loss of electric power.

According to the twelfth aspect of this invention, since the boron phosphide-based semiconductor is formed of a hexagonal boron phosphide-based semiconductor containing no anti-phase boundary, for example, the product resulting from bonding this boron phosphide-based semiconductor to a compound semiconductor layer formed of a compound semiconductor can be effectively used as a material layer for disposing a hexagonal compound semiconductor layer containing no anti-phase boundary. Further, the twelfth aspect of this invention brings an effect of enabling a hexagonal compound semiconductor layer containing no anti-phase boundary to be utilized, for example, as a light-emitting layer and consequently allowing production of a semiconductor light-emitting device giving light emission of high intensity.

According to the thirteenth aspect of this invention, since the electrodes are so disposed that the device-operating current may flow in a direction substantially parallel to both the (0.0.0.1.) crystal face constituting the boron phosphide-based semiconductor layer and the (0.0.0.1.) crystal face constituting the compound semiconductor layer, the device-operating current can be made to flow more smoothly. The thirteenth aspect of this invention, therefore, brings an effect of enabling production of an LED having a small current in the forward direction, for example.

According to the fourteenth aspect of this invention, since the electrodes are so disposed that the device-operating current may be made to flow in a direction substantially perpendicular to both the (0.0.0.1.) crystal face constituting the boron phosphide-based semiconductor layer and the (0.0.0.1.) crystal face constituting the compound semiconductor layer, the device-operating current may be made to flow while encountering only small resistance. The fourteenth aspect of this invention, therefore, brings an effect of enabling production of a high-frequency power FET that suffers from only small loss of output due to heat generation.

According to the fifteenth aspect of this invention, since the boron phosphide-based semiconductor layer is formed of a hexagonal monomeric boron phosphide, the ohmic electrodes or the Schottky contact which incur or incurs only small current leakage can be conveniently formed by disposing the electrodes on the surface of a hexagonal monomeric boron phosphide layer containing crystalline defects in a particularly small density. The fifteenth aspect of this invention, therefore, brings an effect of enabling convenient provision of a light-emitting device having a high efficiency of photoelectric conversion or an FET furnished with a gate electrode of high breakdown voltage and endowed with an enhanced drain current pinch off property.

According to the sixteenth aspect of this invention, since the boron phosphide-based semiconductor layer is so formed of a hexagonal monomeric boron phosphide that the length of the c-axis of the boron phosphide may fall in the range between 0.52 nm or more and 0.53 nm or less, the layer (boron phosphide layer) formed of a hexagonal monomeric boron phosphide crystal containing crystalline defects, such as twins and stacking faults, only in a small amount can be produced. Further, the compound semiconductor layer of superior quality can be obtained by using the boron phosphide layer excelling in crystallinity. The sixteenth aspect of this invention, therefore, is capable of forming a compound semiconductor device with a boron phosphide-based semiconductor layer excelling in crystallinity and consequently bringing an effect of enhancing the characteristic properties of the compound semiconductor device.

BEST MODE FOR CARRYING OUT THE INVENTION

Figure 1:
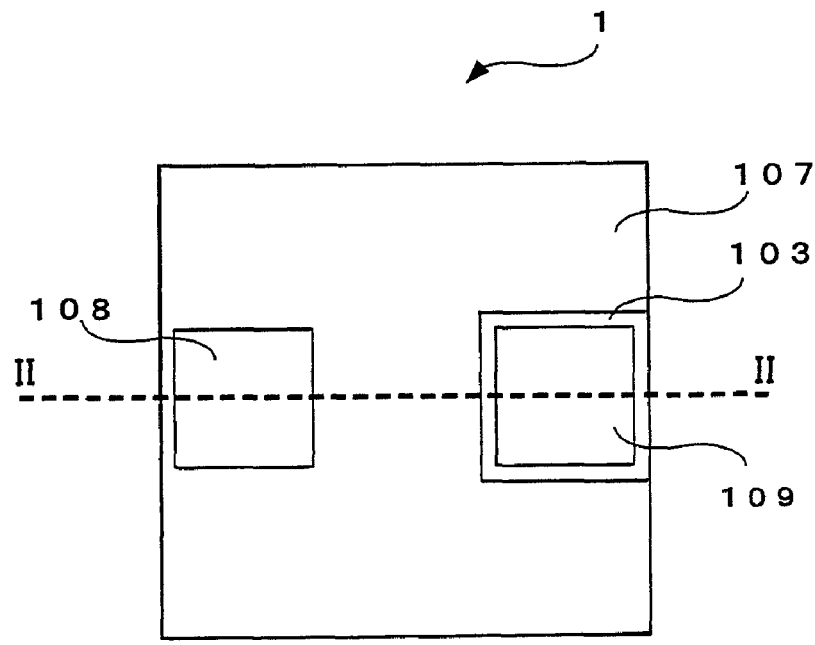
FIG. 1 is a schematic plan view illustrating the LED described in Example 1.

This invention relates to a compound semiconductor device configured by having electrodes disposed on a stacked structure provided with a hexagonal single crystal, a boron phosphide-based semiconductor layer formed on the surface of the single crystal, and a compound semiconductor layer disposed on the boron phosphide-based semiconductor layer and formed of a compound semiconductor, the compound semiconductor device being provided on the surface formed of a (1.1.-2.0.) crystal face of the single crystal layer with the aforementioned boron phosphide-based semiconductor layer formed of a hexagonal crystal.

The boron phosphide-based semiconductor layer mentioned above is a crystal layer formed of a Group III-V compound semiconductor material containing boron (B) and phosphorus (P) as essential component elements. For example, it is the semiconductor layer that is formed of monomeric boron phosphide (BP) or polymeric $B_6P$ ($B_{12}P_2$) or of such multi-unit mixed crystals as boron aluminum phosphide ($B_{1-X}Al_XP$ wherein $0<X<1$), boron gallium phosphide ($B_{1-X}Ga_XP$ wherein $0<X<1$), and boron-indium phosphide ($B_{1-X}In_XP$ wherein $0<X<1$) which contain boron (B) and other Group III elements than boron as component elements. Otherwise, the semiconductor layer is formed of mixed crystals, such as boron nitride phosphide ($BN_YP_{1-Y}$ wherein $0<Y<1$) and boron arsenide phosphide ($BP_{1-Y}As_Y$ wherein $0<Y<1$), that contain other Group V elements than phosphorus (P) as component elements. In the mixed crystal containing other Group III elements than boron (B), the preferred composition ratio of the other Group III elements than boron (B) (the element X in the formula of composition mentioned above) is 0.40 or less. This is because the boron phosphide-based semiconductor layer of not hexagonal but cubic crystal is liable to form suddenly when the composition ratio (=X) exceeds 0.40.

The expression "boron phosphide-based semiconductor layer formed of a hexagonal crystal" used above refers to a hexagonal crystal layer containing boron (B) and phosphorus (P) as essential component elements. In consideration of factors, such as the ease of crystal growth and the complexity of composition control, the hexagonal boron phosphide-based semiconductor layer is preferably formed of a monomeric boron phosphide (BP). As concrete examples of the hexagonal single crystal layer, Group III nitride semiconductor single crystals such as sapphire ($\alpha$-$Al_2O_3$ single crystal) and wurtzite AlN and bulk single crystals such as zinc oxide (ZnO) single crystal, 2H-type (wurtzite-type) or 4H-type or 6H-type silicon carbide (SiC) or single crystal layers thereof may be cited. Besides, the Group III nitride semiconductor layers having a non-polar crystal face as its surface and disposed on such a cubic crystal as $LiAlO_2$ may be cited as examples. Especially for the purpose of forming a hexagonal boron phosphide-based semiconductor layer contemplated by this invention, a sapphire ($\alpha$-alumina single crystal) substrate can be utilized most advantageously.

The expression "hexagonal boron-phosphide-based semiconductor layer" used above refers to a hexagonal boron phosphide-based semiconductor material having a hexagonal Bravais lattice as a unit lattice thereof ("Crystal Electron Microscopy," written by Hiroyasu Saka and published by Uchida Rokakuho, on Nov. 25, 1997, first edition, pp. 3-7). Of the hexagonal boron phosphide-based semiconductor layers, particularly the hexagonal boron phosphide-based semiconductor layer that contains no anti-phase boundary is preferably formed by using a hexagonal single crystal for an under layer.

The surface on which the boron phosphide-based semiconductor layer is disposed is preferably formed of a (1.1.-2.0.) crystal face. Particularly, this layer is preferably disposed on the surface called a (1.1.-2.0.) crystal face of sapphire, namely the A-plane. By using the (1.1.-2.0.) crystal face (A-plane) of sapphire, not the ordinary zinc blende but the hexagonal boron phosphide-based semiconductor layer can be stably obtained. This may be explained by supposing that the atoms constituting the crystal in the non-polar crystal face such as the (1.1.-2.0.) crystal face of sapphire are arranged conveniently for the sake of producing a hexagonal boron phosphide-based semiconductor layer possessing a high covalent bonding property.

The aforementioned (1.1.-2.0.) crystal face of sapphire may be the A-plane of the bulk single crystal grown by the CZ (Czochralski) method, Vernouil method, or EFG (edge-defined film-fed growth) method (refer, for example, to BRAIAN R PAMPLIN edi., "CRYSTAL GROWTH," 1975, Pergamon Press Ltd.) or the A-plane of an alumina single crystal film grown by the Chemical Vapor Deposition (CVD) method or by such a physical means as the sputtering method.

The aforementioned hexagonal boron phosphide-based semiconductor layer can be formed by such vapor-phase growth means as the halogen method, hydride method, or MetalOrganic Chemical Vapor Deposition (MOCVD) method. It may be formed, for example, by the MOCVD method that uses triethyl boron (($C_2H_5)_3B$) as a boron (B) source and triethyl phosphorus (($C_2H_5)_3P$) as a phosphorus (P) source. It may be formed by the halogen CVD method that uses boron trichloride ($BCl_3$) as a boron source and phosphorus trichloride ($PCl_3$) as a phosphorus source. Regardless of the combination of a boron source and a phosphorus source, the growth temperature used for the formation of the hexagonal boron phosphide-based semiconductor layer is preferably 700° C. or more and 1200° C. or less. By these means of growth, the hexagonal boron phosphide-based semiconductor layer having a (1.1.-2.0.) crystal face as its surface can be formed on the surface of the hexagonal single crystal layer formed of a (1.1.-2.0.) crystal face.

When the hexagonal boron phosphide-based semiconductor layer is formed, for example, on the surface formed of a (1.1.-2.0.) crystal face of sapphire, the hexagonal boron phosphide-based semiconductor layer uniquely oriented in a specific crystal orientation can be formed by starting supply of a phosphorus source first to the surface and subsequently supplying the raw material of Group III element such as boron. When the formation of a boron phosphide-based semiconductor layer is started in accordance with the MOCVD method by supplying phosphine ($PH_3$) temporally prior to triethyl boron (($C_2H_5)_3B$) to the surface formed of a (1.1.-2.0.) crystal face of sapphire, for example, a hexagonal boron phosphide-based semiconductor layer having a <1.-1.0.0.> direction thereof extend parallel to the <1.-1.0.0.> direction of sapphire can be obtained. The investigation as to the question whether the formed boron phosphide-based semiconductor layer is a hexagonal crystal layer or not and the investigation regarding the orientation of the hexagonal boron phosphide-based semiconductor layer relative to the surface of the hexagonal single crystal layer can be carried out by such analytical means as electron diffraction or X-ray diffraction, for example.

When the hexagonal boron phosphide-based semiconductor layer has the surface thereof formed of a (1.1.-2.0.) crystal face and the <1.-1.0.0.> direction thereof extended parallel to a <1.-1.0.0.> direction of a hexagonal single crystal layer, this hexagonal boron phosphide-based semiconductor layer is characterized by containing such crystalline defects as twins and stacking faults only in a small amount because it is disposed on the surface formed of a (1.1.-2.0.) crystal face of sapphire, for example, and is oriented in a direction excelling in lattice matching property. Particularly when the hexagonal boron phosphide-based semiconductor layer is formed of a monomeric boron phosphide (BP) layer possessing the relation of orientation with the surface mentioned above, the hexagonal boron phosphide-based semiconductor layer containing virtually no twin can be obtained in a region surpassing the interface with the hexagonal single crystal layer with a distance of about 50 nm to 100 nm. The situation in which the density of boundaries due to twins is reduced by a decrease in the density of twins can be observed by an ordinary cross-sectional TEM technique.

The hexagonal boron phosphide-based semiconductor layer excelling in crystallinity such as, for example, the semiconductor layer made of a hexagonal monomeric BP layer, can be utilized as an under layer for forming thereon the single crystal layer excelling in crystallinity such as, for example, the Group III nitride semiconductor layer. As concrete examples of the Group III nitride semiconductor layer advantageously disposed as bonded to the hexagonal boron phosphide-based semiconductor layer, wurtzite GaN, AlN, indium nitride (InN), and the mixed crystal thereof, namely aluminum-gallium-indium nitride ($Al_XGa_YIn_ZN$ wherein $0 \leq X, Y, Z \leq 1$ and $X+Y+Z=1$) may be cited. Further, the wurtzite gallium nitride phosphide ($GaN_{1-Y}P_Y$ wherein $0 \leq Y \leq 1$) that contains nitrogen (N) and such Group V elements as phosphorus (P) and arsenic (As) other than nitrogen may be cited.

The hexagonal BP layer which contains such crystalline defects as twins only in a small amount, owing to the excellent crystallinity, can be effectively utilized as the under layer for forming thereon the hexagonal compound semiconductor layer of superior quality. As concrete examples of the hexagonal compound semiconductor layer, 2H-type (wurtzite-type), 4H-type or 6H-type SiC, ZnO (zinc oxide), wurtzite GaN, AlN, indium nitride (InN), and a mixed crystal thereof, namely aluminum-gallium-indium nitride ($Al_XGa_YIn_ZN$: $0 \leq X, Y, Z \leq 1$, $X+Y+Z=1$) may be cited. Further, the wurtzite hexagonal gallium nitride phosphide ($GaN_{1-Y}P_Y$: $0 \leq Y < 1$) that contains nitrogen (N) and such Group V elements as phosphorus (P) and arsenic (As) other than nitrogen may be cited.

The Schottky barrier FET that is not limited to the compound semiconductor light-emitting device can be configured by using the hexagonal Group III nitride semiconductor layer containing crystalline defects in a decreased density and excelling in crystallinity as an electron transporting layer (channel layer). The channel layer can be formed of an undoped n-type GaN layer i.e., the layer resulting from avoiding intentional addition of an impurity. The hexagonal Group III nitride semiconductor layer containing crystalline defects in a decreased density is advantageous for producing the FET excelling in high frequency properties because it is capable of manifesting high electron mobility.

This invention is capable of implementing the configuration thereof mentioned above so that the (0.0.0.1.) crystal face of the compound semiconductor layer and the (0.0.0.1.) crystal face constituting the boron phosphide-based semiconductor layer may be arranged parallel to the stacking direction of the compound semiconductor.

This invention is capable of implementing the configuration thereof mentioned above so that the electrodes mentioned above may enable the device-operating current to flow in a direction substantially parallel to both the (0.0.0.1.) crystal face constituting the boron phosphide-based semiconductor layer and the (0.0.0.1.) crystal face constituting the compound semiconductor layer.

Further, this invention is capable of implementing the configuration thereof mentioned above so that the electrodes mentioned above may enable the device-operating current to flow in a direction substantially perpendicular to both the (0.0.0.1.) crystal face constituting the boron phosphide-based semiconductor layer and the (0 0.0.1.) crystal face constituting the compound semiconductor layer.

Further, this invention is capable of implementing the configuration thereof mentioned above so that the length of the c-axis of the hexagonal monomeric boron phosphide may fall in the range between 0.52 nm or more and 0.53 nm or less.

During the formation of the hexagonal BP layer on the non-polar surface of the hexagonal signal crystal, such as the (1.1.-2.0.) crystal face, (A) the temperature for growing the BP layer is 750° C. or more and 900° C. or less and (B) the concentration ratio of the phosphorus source to the boron source to be supplied to the growth reaction system (the so-called V/III ratio) is in the range between 250 or more and 550 or less. Furthermore, (C) when the rate of growth of the BP layer is made to fall in the range between 20 nm or more per minute and 50 nm or less per minute, the hexagonal BP layer having the (0 0.0.1.) crystal faces thereof regularly arranged as spaced parallel to the direction of increasing the layer thickness (the perpendicular and stacking direction relative to the surface of the aforementioned single crystal) can be stably formed.

The rate of growth of the hexagonal BP layer, when the concentration of the boron source supplied per unit time to the growth reaction system is increased, can be increased substantially proportionately to the concentration within the aforementioned range of growth temperature. When the concentration of the boron source to be supplied per unit time to the growth reaction system is fixed, the rate of growth is increased in accordance as the temperature of growth is heightened. If this temperature falls short of 750° C., since the thermal decomposition of the boron source and the phosphorus source does not sufficiently proceed, the rate of growth suddenly falls and fails to reach the advantageous rate of growth mentioned above.

When the hexagonal BP layer is formed by the MOCVD method using phosphine (molecular formula: $PH_3$) as a phosphorus source and triethyl boron (($C_2H_5)_3B$) as a boron source, for example, this formation is implemented by fixing the growth temperature at 800° C., the $PH_3/(C_2H_5)_3B$ ratio, i.e., the concentration ratio of the raw materials supplied to the growth reaction system at 400, and the rate of growth at 35 nm per minute. If the temperature of growth exceeds 900° C., the excess will be at a disadvantage in possibly inducing sudden formation of such polymeric boron phosphide crystals of the formula of composition $B_6P$, for example.

If the rate of growth falls short of 20 nm per minute or if the rate exceeds 50 nm per minute, either case will render it difficult to obtain stably the hexagonal semiconductor layer that is formed of a monomeric BP having a stoichiometric composition. If the rate of growth steeply falls short of 20 nm per minute, the degree with which the BP layer of a nonstoichiometric composition containing phosphorus (P) copiously as compared with boron (B) is finally formed will be suddenly heightened. If the rate of growth is so high as to exceed 50 nm per minute, the excess will be at a disadvantage in suddenly heightening the degree with which the BP layer of a nonstoichiometric composition containing boron (B) copiously as compared with phosphorus (P) is finally formed.

The length of the c-axis in the hexagonal unit lattice of the hexagonal BP layer possessing a substantially stoichiometric composition (refer, for example, to "Crystal Electron Microscopy for Material Research Worker," written by Hiroyasu Saka and published by Uchida Rokakuho, on Nov. 25, 1997, first edition, pp. 3 to 7) and formed under the conditions of growth satisfying the advantageous temperature of growth set forth in the item (A) and the advantageous V/III ratio set forth in the item (B) and further satisfying the advantageous rate of growth set forth in the item (C) falls in the range between 0.52 nm or more and 0.53 nm or less.

Figure 3:
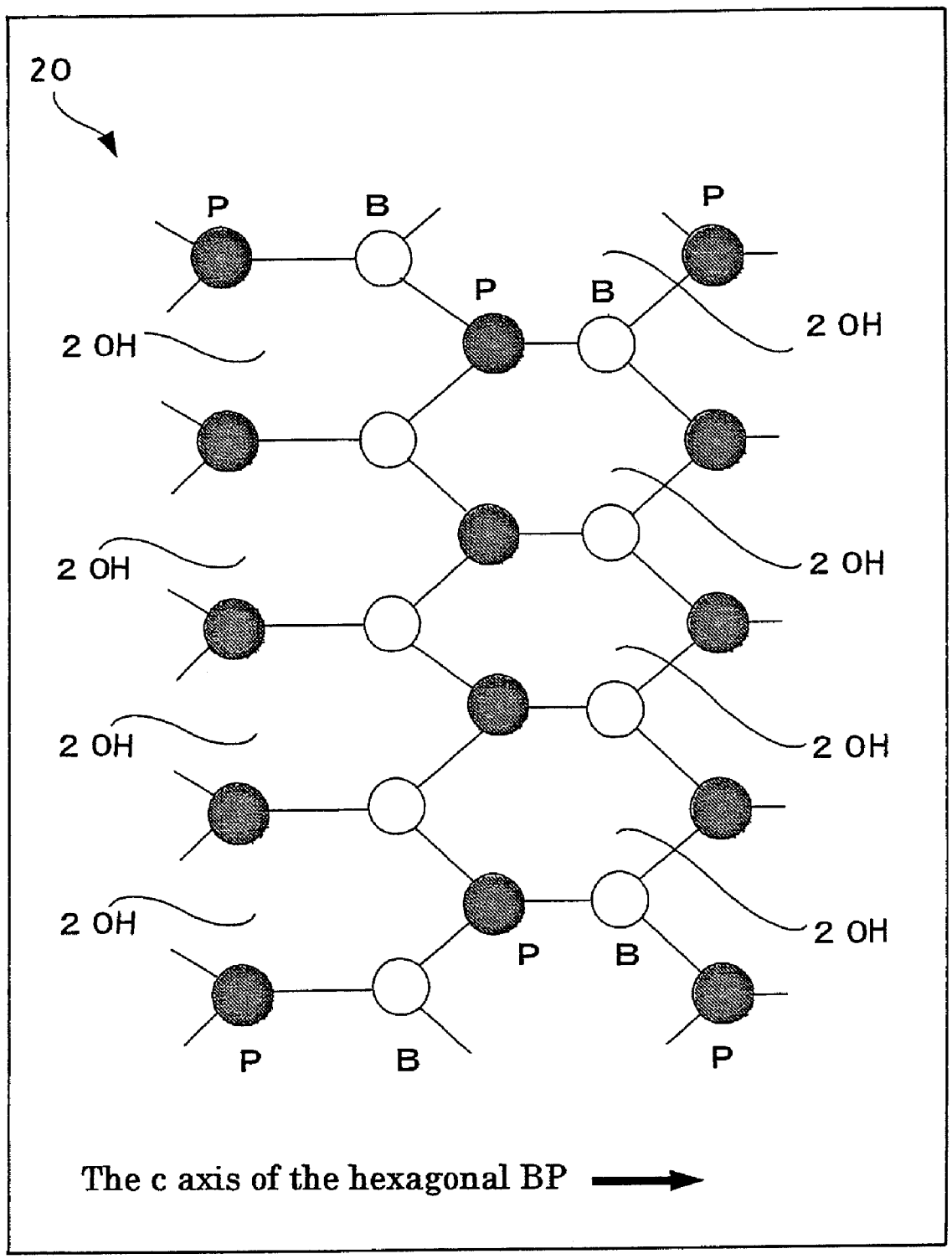
FIG. 3 is a schematic diagram illustrating the arrangement of atoms of a hexagonal BP crystal layer as viewed from a direction perpendicular to the c-axis.

In the hexagonal BP layer having the (0.0.0.1.) crystal faces thereof arranged in a mutually parallel relation in the perpendicular direction (the direction of growth of the BP layer, the stacking direction), the current for operating the device (device-operating current) can be made to flow readily in a direction parallel to the (0.0.0.1.) crystal face. FIG. 3 schematically illustrates the arrangement of phosphorus atoms (P) and boron atoms (B) as viewed from a direction perpendicular to the direction of the c-axis of the hexagonal BP layer 20. Incidentally, the direction of the c-axis is perpendicular to the (0.0.0.1.) crystal face. In the direction perpendicular to the c-axis of the hexagonal BP layer 20, gaps 20H exists as illustrated in FIG. 3, depending on the arrangement of the phosphorus atoms (P) and the boron atoms (B). By the phosphorus and boron atoms (P and B) of which the hexagonal BP layer 20 is composed, the current (electrons), after passing through the gaps 20H existing on the (0.0.0.1.) crystal face without being appreciably scattered, is made to flow conveniently in a direction parallel to the (0.0.0.1.) crystal face.

Figure 4:
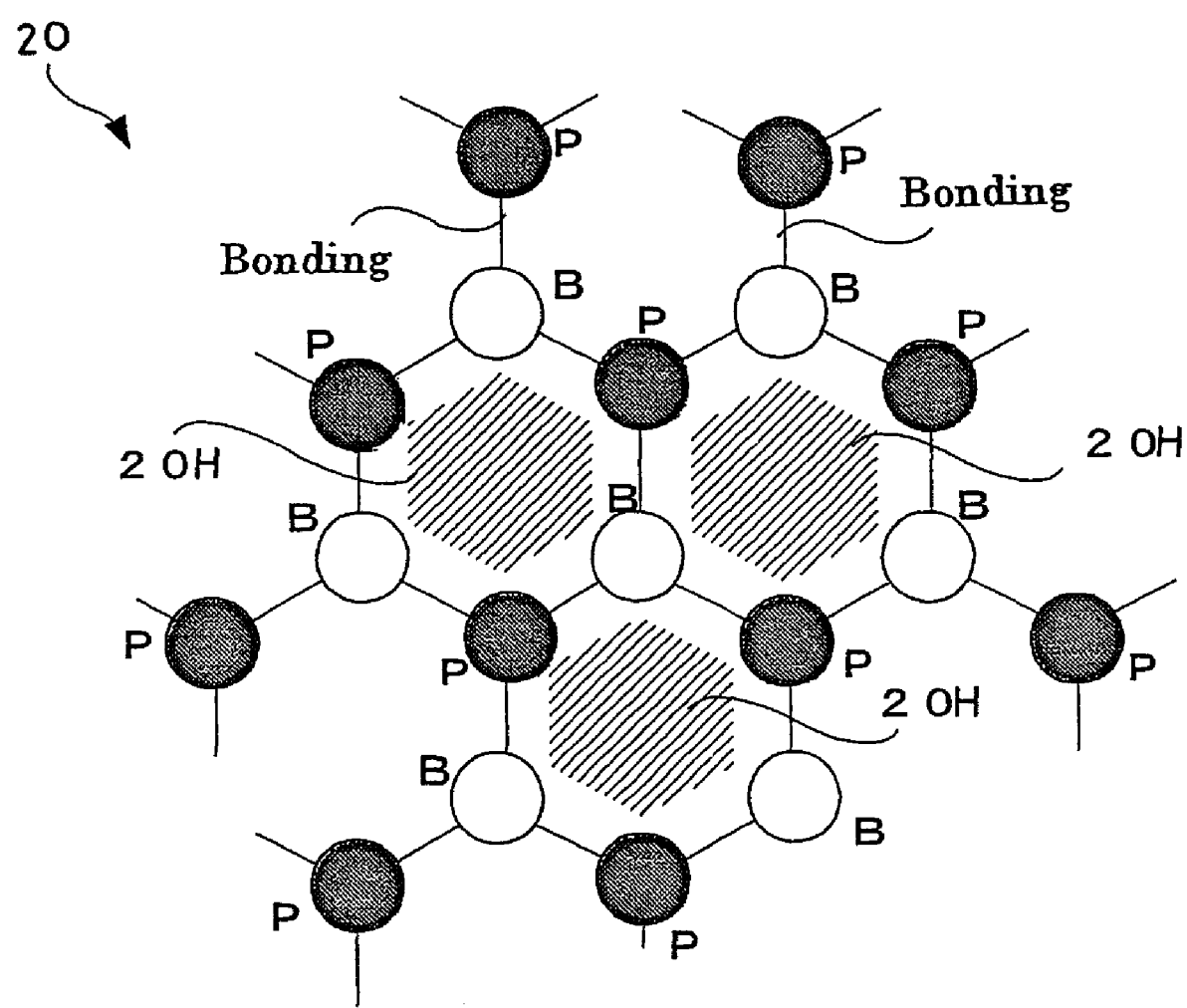
FIG. 4 is a schematic diagram for illustrating the arrangement of atoms of a hexagonal BP crystal layer as viewed from a direction parallel to the c-axis.

The gaps originating in the arrangement of phosphorus and boron atoms in the crystal mentioned above exist in the hexagonal BP layer in a direction parallel to the (0.0.0.1.) crystal face. In FIG. 4, the arrangement of the phosphorus atom (P) and boron atom (B) crystals as viewed from a direction parallel to the direction of the c-axis of the hexagonal BP layer 20. As illustrated in FIG. 4, the space 20H assuming an orthohexagonal shape in a plan view exists. The phosphorus and boron atoms that exist on the periphery, therefore, attain predominance in causing the device-operating current to flow without being scattered. The c-axis of the hexagonal BP layer 20 is perpendicular to the page of FIG. 4.

The hexagonal BP layer formed on a hexagonal single crystal with the (0.0.0.1.) crystal faces thereof regularly arranged in a mutually parallel relation in a direction perpendicular on the surface of the single crystal is characterized by containing such crystalline defects as twins and stacking faults only in a small amount. This is explained by supposing that the BP layer is disposed on the surface of small polarity having the (0.0.0.1.) crystal faces of the hexagonal single crystal regularly arranged in a mutually parallel relation. This configuration is convenient for the purpose of causing the device-operating current to flow in a direction parallel or perpendicular to the (0.0.0.1.) crystal face in the hexagonal BP layer without being hindered by twin boundaries. The situation in which the density of boundaries due to twins is reduced by a decrease in the density of twins can be observed by an ordinary cross-sectional TEM technique.

The hexagonal monomeric BP layer is particularly useful as an under layer for forming a Group III nitride semiconductor layer possessing a lattice constant approximating closely to the a-axis thereof. The a-axis of the hexagonal monomeric BP measures about 0.319 nm and coincides with the a-axis of the hexagonal GaN. On the hexagonal monomeric BP layer, therefore, the GaN layer excelling in crystallinity can be formed owing to the excellent lattice matching. By utilizing the Group III nitride semiconductor layer excelling in crystallinity, it is made possible to form a p-n junction hetero structure capable of producing light emission of high intensity. For example, the hetero-junction light-emitting part for use in the LED having a GaN layer as a clad layer and a $Ga_XIn_{1-X}N$ (0<X<1) as a light-emitting layer can be formed. By utilizing the light-emitting part formed of the Group III compound semiconductor layer excelling in crystallinity, it is made possible to provide a compound semiconductor light-emitting device exhibiting high luminance and excelling in such electrical properties as the voltage in the reverse direction.

The hexagonal monomeric BP layer is particularly useful as an under layer for the purpose of forming a wurtzite hexagonal aluminum-gallium nitride (formula of composition: $Al_XGa_YN$: $0 \leq X, Y \leq 1$, $X+Y=1$) possessing the length of the c-axis approximating closely to the length of the c-axis thereof (0.52 nm to 0.53 nm). The $Al_XGa_YN$ ($0 \leq X, Y \leq 1$, $X+Y=1$) layer formed by utilizing the hexagonal BP layer as the under layer is enabled to excel in crystallinity by having the (0.0.0.1.) crystal faces thereof regularly arranged parallel to the (0.0.0.1.) crystal face of the hexagonal BP layer owing to the superior lattice matching.

The compound semiconductor layer having the (0.0.0.1.) crystal faces thereof regularly arranged in a mutually parallel relation, similarly to the hexagonal BP layer mentioned above, is capable of causing the device-operating current to flow readily in the direction of the c-axis, i.e. a direction perpendicular to the (0.0.0.1.) crystal face. It is also capable of causing the device-operating current to flow readily in a direction parallel to the (0.0.0.1.) crystal face. The hexagonal compound semiconductor layer having the (0.0.0.1.) crystal faces thereof so arranged, therefore, can be utilized as a functional layer intended to form a compound semiconductor device.

For example, by utilizing the $Al_XGa_YN$ ($0 \leq X, Y \leq 1$, $X+Y=1$) layer which is enabled to excel in crystallinity by having the (0.0.0.1.) crystal faces thereof regularly arranged in a mutually parallel relation, it is made possible to form a p-n junction hetero structure capable of producing a light emission of high intensity. For example, the hetero-junction light-emitting part for use in the LED having a GaN layer as a clad layer and a $Ga_XIn_{1-X}N$ (0<X<1) as a light-emitting layer can be formed. By utilizing the light-emitting part formed of a compound semiconductor layer allowing easy flow of the device-operating current and having the (0.0.0.1.) crystal faces regularly arranged in a mutually parallel relation, it is made possible to provide a compound semiconductor light-emitting device having a low voltage in the reverse direction.

When the stacked structure for use in the compound semiconductor device that is furnished with a hexagonal BP layer and a light-emitting part formed thereon as described above is provided with ohmic electrodes in such a manner that the device-operating current may be made to flow in a direction parallel to the (0.0.0.1.) crystal face of the hexagonal BP layer or the hexagonal compound semiconductor layer constituting the light-emitting part (in the direction perpendicular to the c-axis), the compound semiconductor light-emitting device giving only low resistance to the flow of the device-operating current can be produced.

Figure 5:
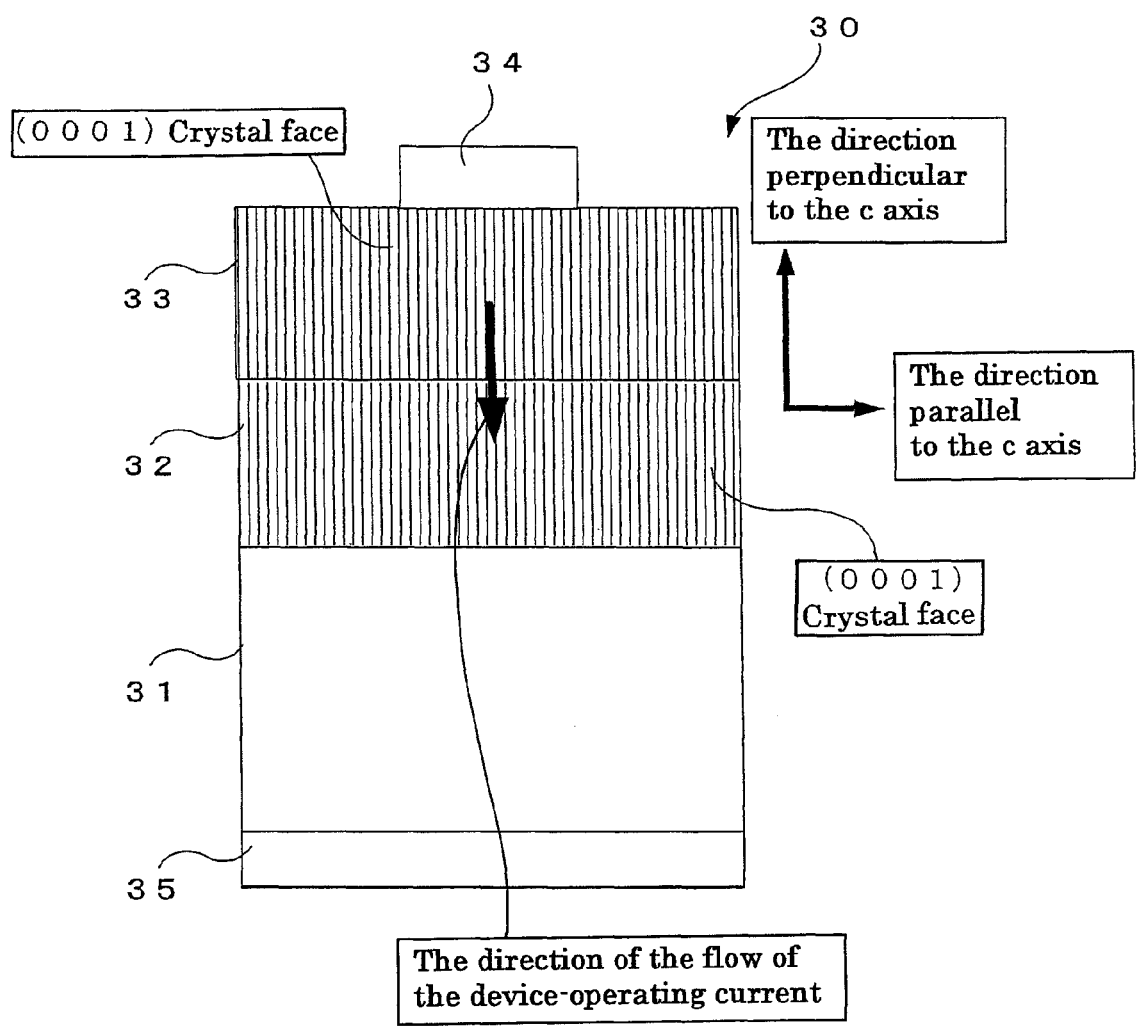
FIG. 5 is a schematic diagram illustrating the cross-sectional structure of a device for enabling a current to flow in a direction parallel to a (0.0.0.1.) crystal face of a hexagonal single crystal layer.

For example, a stacked structure 30 which is provided, as illustrated in FIG. 5, with a hexagonal BP layer 32 disposed on an electrically conductive hexagonal AlN substrate 31 and a light-emitting part 33 disposed thereon and formed of $Al_XGa_YIn_ZN$ ($0 \leq X, Y, Z \leq 1$, $X+Y+Z=1$) can be produced by disposing one polarity ohmic electrode 34 on the light-emitting part and the other polarity ohmic electrode 35 on the reverse side of the substrate 31. In other words, this production is accomplished by having the electrodes disposed severally on and beneath the stacked structure 30 in such a manner that they may nip the substrate 31, the hexagonal BP layer 32, and the light-emitting part 33.

Figure 6:
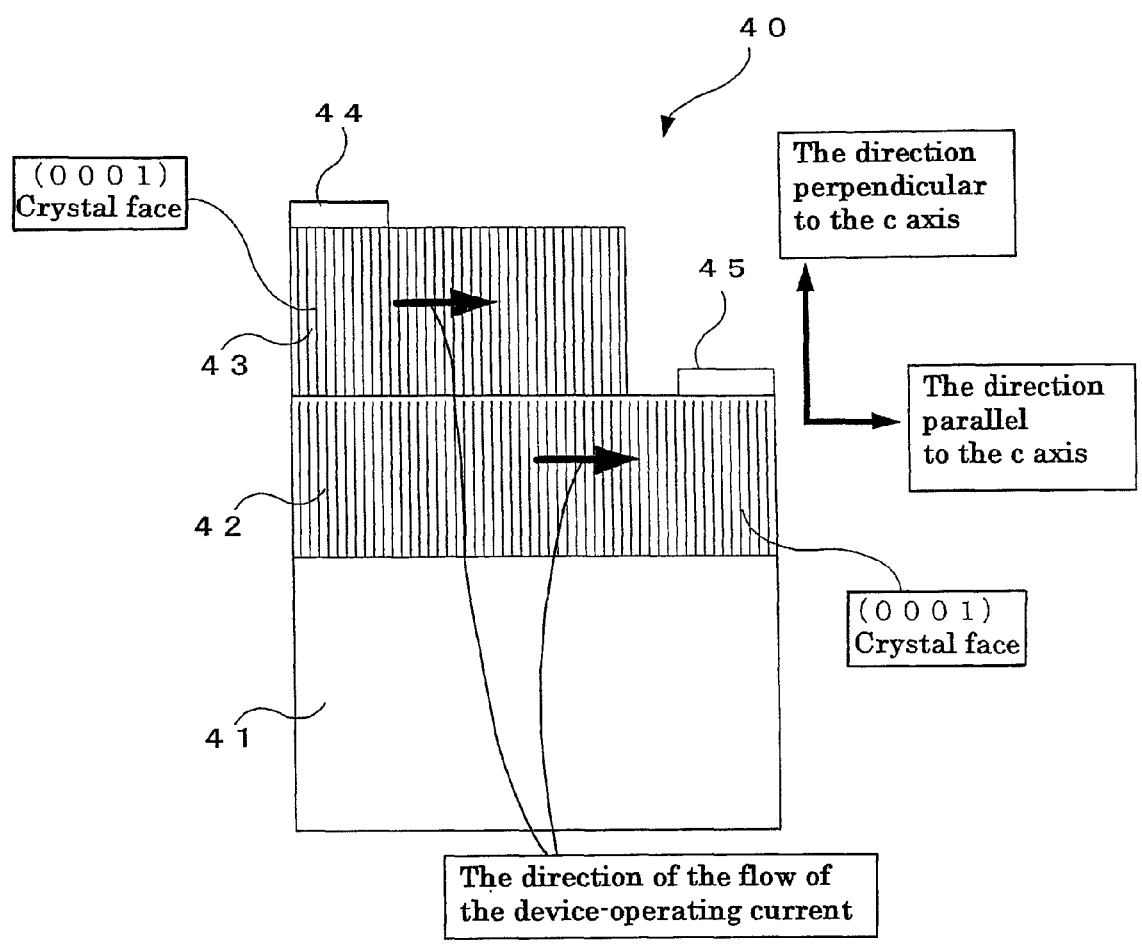
FIG. 6 is a schematic diagram illustrating the cross-sectional structure of a device for enabling a current to flow in a direction perpendicular to a (0.0.0.1.) crystal face of a hexagonal single crystal layer.

For example, a stacked structure 40 which is provided, as illustrated in FIG. 6, with a hexagonal BP layer 42 disposed on an electrically conductive hexagonal GaN substrate 41 and a light-emitting part 43 disposed thereon and formed of $Al_XGa_YIn_ZN$ ($0 \leq X, Y, Z \leq 1$, $X+Y+Z=1$) can be made to produce a compound semiconductor light-emitting device capable of making the device-operating current to flow with only low resistance thereto in a direction perpendicular to the (0.0.0.1.) crystal face by disposing one polarity ohmic electrode 44 on the light-emitting part and the other polarity ohmic electrode 45 on the surface of the hexagonal BP layer 42 intervening between the light-emitting part 43 and the substrate 41.

Instead of the compound semiconductor light-emitting device, the Schottky barrier MESFET can be produced by utilizing the hexagonal compound semiconductor layer containing crystalline defects only in a lowered density and excelling in crystallinity as an electron transporting layer (channel layer). The channel layer can be formed of an undoped n-type GaN layer of high purity resulting from avoiding intentional addition of an impurity, for example. The hexagonal Group III nitride semiconductor layer containing crystalline defects only in a lowered density is convenient for the production of an MESFET excelling in high-frequency properties because it is capable of realizing high electron mobility.

Figure 7:
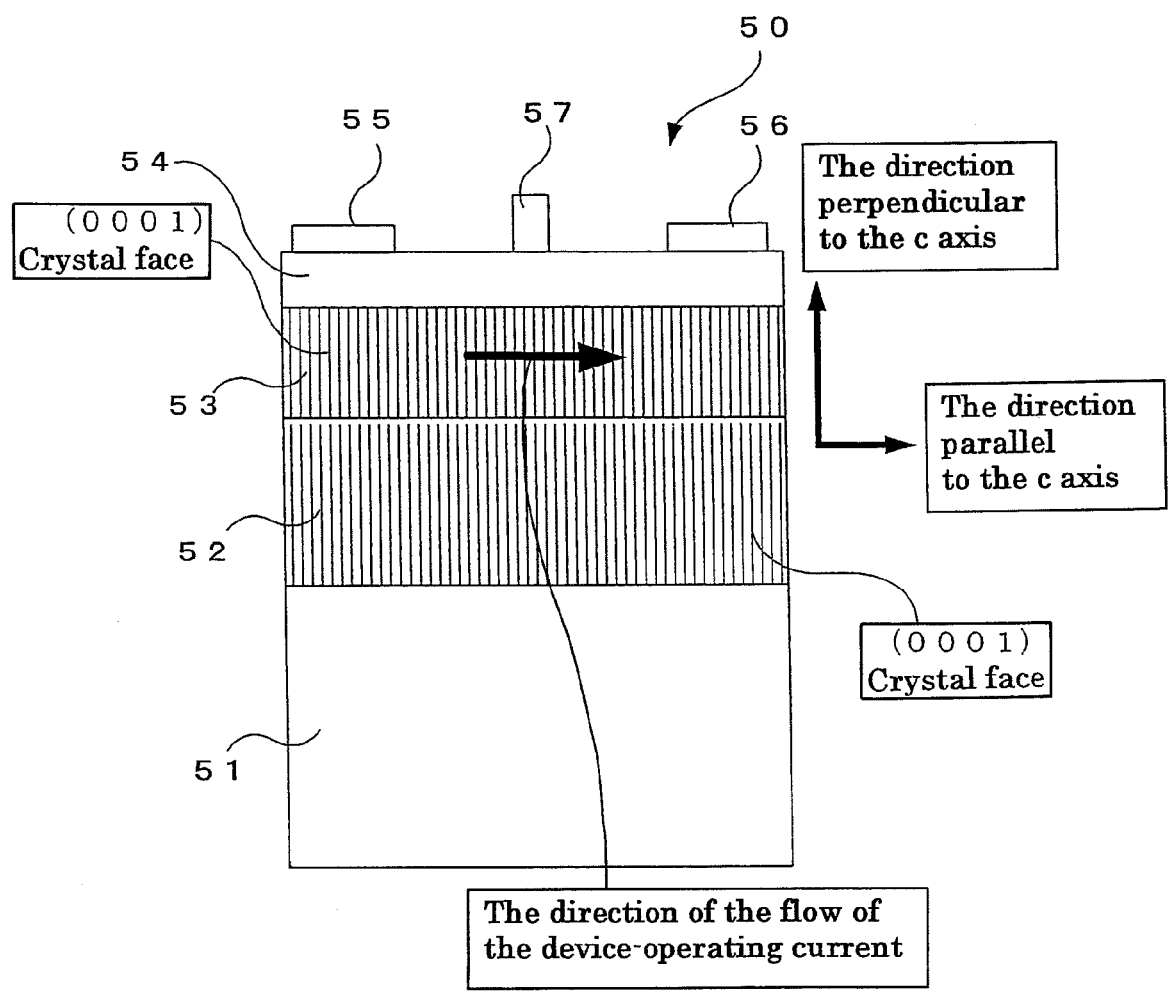
FIG. 7 is a schematic diagram illustrating the cross-sectional structure of a MESFET for enabling a current to flow in a direction perpendicular to a (0.0.0.1) crystal face of a hexagonal crystal layer.

On the occasion of manufacturing the MESFET, for the sake of securing a large saturation current, a source electrode 55 and a drain electrode 56 adapted for enabling the device-operating current to flow in a direction perpendicular to the (0.0.0.1.) crystal face of the hexagonal compound semiconductor layer disposed as an electron transporting layer (channel layer) 53 bonded on the surface of the hexagonal BP layer 52 on the substrate 51 (the direction parallel to the c-axis) are opposed in the lateral direction on the surface of the electron supplying layer 54 in a stacked structure 50 as illustrated in FIG. 7.

Thus, this invention has discovered the preferable arrangement of crystal planes regarding the crystalline structure of a hexagonal boron phosphide layer and has succeeded, owing to the use of this discovery, in decreasing the resistance to the flow of the device-operating current and enabling the pertinent device to enhance the performance thereof.

This invention is capable of configuring a structure which forms a hexagonal single crystal layer with a Group III nitride semiconductor and is furnished with a first stacked structure part consisting of a hexagonal Group III nitride semiconductor having a (1.1.-2.0.) crystal face as its surface and a hexagonal boron phosphide-based semiconductor layer disposed as bonded to the surface of the Group III nitride semiconductor or capable of configuring a structure which is furnished with a second stacked structure part resulting from having a hexagonal Group III nitride semiconductor bonded to the upper side surface of the hexagonal boron phosphide-based semiconductor layer constituting the first stacked structure part.

The boron phosphide-based semiconductor layer to be used for forming the first stacked structure part is in the form of either an n-type or a p-type electrically conductive layer, depending on the kind of the device aimed at. Otherwise, in view of the device aimed at, a n-type or a v-type high-resistive boron phosphide-based semiconductor layer is used.

The function of suppressing the penetration of dislocations that is displayed by the boron phosphide-based semiconductor layer constituting the first stacked structure part is manifested even by the cubic zinc blende boron phosphide-based semiconductor layer disposed as bonded to the Group III nitride semiconductor layer such as of a cubic or hexagonal 3C-type, 4H-type or 6H-type silicon carbide (SiC) or GaN (refer, for example, to T. Udagawa et al., Phys. Stat. Sol., 0(7) (2003), page 2027). It is when the hexagonal boron phosphide-based semiconductor layer disposed on the hexagonal crystal layer such as SiC having a (1.1.-2.0.) crystal face as its surface or zinc oxide (ZnO) is used that the function mentioned above is manifested more efficiently. It is when the hexagonal boron phosphide-based semiconductor layer disposed on the hexagonal Group III nitride semiconductor layer having a (1.1.-2.0.) crystal face as its surface is used that the aforementioned function is manifested particularly conspicuously. This is because the crystal systems are identical and the arrays of crystal faces forming these crystal layers excel in matching property.

Specifically, this invention contemplates providing the compound semiconductor device incorporating the Group III nitride semiconductor layer therein with the first stacked structure part that consists of the hexagonal Group III nitride semiconductor layer having a (1.1.-2.0.) crystal face as its surface and the boron phosphide-based semiconductor layer disposed as bonded to the surface of the Group III nitride semiconductor layer.

The hexagonal Group III nitride semiconductor layer having a (1.1.-2.0.) crystal face as its surface can be formed, for example, on the surface formed of a (1.-1.0.2.) crystal face such as of silicon carbide or GaN single crystal which is devoid of polarity. It can be formed, for example, on the (1.-1.0.2.) crystal face of sapphire (R-plane) by the Molecular Beam Epitaxial (MBE) method.

The boron phosphide-based semiconductor layer constituting the first stacked structure part is most preferably formed of a hexagonal monomeric BP. The hexagonal monomeric BP layer can be formed on the under layer that is formed of a hexagonal crystal having a crystal face of small polarity as the surface thereof. Particularly, it is preferably formed on the hexagonal Group III nitride semiconductor layer having a (1.1.-2.0.) crystal face as its surface. This is because the hexagonal BP layer can be readily and stably formed on the non-polar crystal face of the hexagonal crystal. The fact that the hexagonal $Al_xGa_{1-x}N$ ($0 \leq X \leq 1$) layer having a (1.1.-2.0.) crystal face as its surface is at an advantage in enabling formation thereon of the hexagonal monomeric BP layer of superior quality containing twins and stacking faults only in a small amount and excelling in crystallinity. This is because the hexagonal BP having an axis of about 0.319 nm and the hexagonal $Al_xGa_{1-x}N$ ($0 \leq X \leq 1$) have substantially a-axis lattice constants coinciding together.

The hexagonal BP layer containing crystalline defects only in a lowered density and constituting the first stacked structure part can be formed by the aforementioned means to effect vapor phase growth of the hexagonal boron phosphide-based semiconductor layer. No matter what means may be adopted for the vapor phase growth, the boron phosphide-based semiconductor layer preferably has the <1.-1.0.0.> direction thereof oriented in a direction parallel to the <1.-1.0.0.> direction of the hexagonal Group III nitride semiconductor layer serving as the under layer. The relation of orientation of both these layers can be investigated, for example, based on the electron diffraction image.

Then, the hexagonal boron phosphide-based semiconductor layer disposed for the purpose of forming the first stacked structure part on the under layer formed of a hexagonal crystal having a (1.1.-2.0.) crystal face as its surface is endowed with the function of suppressing propagation of dislocations contained in the under layer formed of the hexagonal crystal. In the first stacked structure part that is composed of the hexagonal $Al_xGa_{1-x}N$ ($0 \leq X \leq 1$) layer and the hexagonal BP layer formed by using the layer as the under layer, the dislocations existing in the hexagonal $Al_xGa_{1-x}N$ ($0 \leq X \leq 1$) layer are prevented by the interface with the hexagonal BP layer from attaining permeation and propagation in the upward direction. The effect of suppressing permeation of dislocations that is manifested by the hexagonal BP layer constituting the first stacked structure part can be clearly confirmed by the cross-sectional TEM observation of the region near the interface of the first stacked structure part.

When the hexagonal boron phosphide-based semiconductor layer containing twins and dislocations only in a small amount and disposed in the hexagonal Group III nitride semiconductor layer having a (1.1.-2.0.) crystal face as its surface is used, the Group III nitride semiconductor layer containing such crystalline defects as permeating dislocations in a particularly lowered density can be formed thereon. Thus, in compliance with the purpose, this invention is capable of optionally configuring a structure which is provided with a second stacked structure part composed of a boron phosphide-based semiconductor layer constituting the first stacked structure part mentioned above and a hexagonal Group III nitride semiconductor layer disposed as bonded on the upper-side surface of the boron phosphide-based semiconductor layer. The Group III nitride semiconductor layer forming the second stacked structure part, for example, is $Al_XGa_{1-X}N$ ($0 \leqq X \leqq 1$) or gallium-indium nitride (formula of composition: $Ga_XIn_{1-X}N$ ($0<X<1$) and is fated to excel in crystallinity.

Since the hexagonal boron phosphide-based semiconductor layer constituting the first stacked structure part is disposed on the hexagonal Group III nitride semiconductor layer having a (1.1.-2.0.) crystal face as its surface, it similarly has a (1.1.-2.0.) crystal face as its surface. Consequently, the hexagonal nitride semiconductor layer having a (1.1.-2.0.) crystal face as its surface can be used as an under layer effective for the formation thereon of the hexagonal Group III nitride semiconductor layer of the second stacked structure part having a (1.1.-2.0.) crystal face as its surface. When the hexagonal BP layer having a (1.1.-2.0.) crystal face as its surface is used as an under layer, for example, the hexagonal Group III nitride semiconductor layer having a (1.1.-2.0.) crystal face as its surface and containing crystalline defects only in a small density can be stably obtained in the second stacked structure part.

When the Group III nitride semiconductor layer of excellent crystallinity which, in conjunction with the hexagonal boron phosphide-based semiconductor layer, constitutes the second stacked structure part is used, the p-n junction heterostructure formed of the Group III nitride semiconductor layer excelling in crystallinity can be formed thereon. For example, the p-n junction hetero structure that is provided with the n-type $Ga_XIn_{1-X}N$ ($0 \leqq X \leqq 1$) layer as a light-emitting layer and the n-type and p-type $Al_XGa_{1-X}N$ ($0 \leqq X \leqq 1$) layer as a clad layer is capable of forming a double hetero (DH) junction light-emitting part for use in the LED. The light-emitting layer mentioned above may be formed of a single layer or may be in a single or a multi-quantum-well structure. In any event, the use of the Group III compound semiconductor layer of excellent crystallinity constituting the second stacked structure part enables formation of the light-emitting part with the Group III compound semiconductor layer excelling in crystallinity and consequently permits provision of a compound semiconductor light-emitting part exhibiting high luminance and excelling in such electrical properties as the voltage in the reverse direction.

When a p-n junction hetero structure to be disposed on the hexagonal Group III nitride semiconductor layer containing crystalline defects only in a small density and constituting the second stacked structure part is formed by using a Group III nitride semiconductor layer differing in composition from the hexagonal Group III nitride semiconductor layer constituting the second stacked structure part, the propagation of crystalline defects in the interface with the two kinds of Group III nitride semiconductor layers differing in composition can be inhibited. As a result, the light-emitting part can be formed with the Group III nitride semiconductor layer excelling further in crystallinity. It is inferred that the stacking of the Group III nitride semiconductor layers differing in composition results in inducing stress in these semiconductor layers and this stress takes part in the crystallinity of these semiconductor layers.

As the p-n junction hetero structure formed by stacking Group III nitride semiconductor layers differing in composition, a light-emitting part of a p-n junction DH structure can be obtained by forming a Group III nitride semiconductor layer constituting the second stacked structure part with a wurtzite n-type GaN and stacking thereon a light-emitting layer of a quantum well structure having an n-type $Al_{0.20}Ga_{0.80}$ layer of an aluminum composition of 0.20 as a lower clad layer, an n-type $Ga_{0.90}In_{0.10}N$ layer as a well layer, and an n-type $Al_{0.10}Ga_{0.90}N$ layer as a barrier layer, and a p-type $Al_{0.05}Ga_{0.95}N$ layer as an upper clad layer in the order mentioned. The expression "Group III nitride semiconductor layers differing in composition" as used herein refers to crystal layers differing in component elements or to crystal layers having identical component elements and differing in composition ratio.

By forming only the layer bonded to the surface of the hexagonal Group III nitride semiconductor layer constituting the second stacked structure part with a layer differing in composition from the hexagonal Group III nitride semiconductor layer constituting the second stacked structure part, the effect of suppressing propagation of crystalline defects can be attained. Further, by forming the individual layers composing the p-n junction DH structure as in the structure of the light-emitting part illustrated above with Group III nitride semiconductor layers mutually differing in composition of Group III elements, the effect for suppressing propagation of crystalline defects can be further enhanced. In any event, the p-n junction DH structure that is formed of the Group III nitride semiconductor layer of excellent crystallinity based on the second stacked structure part of this invention is capable of stably providing a compound semiconductor light-emitting part exhibiting high luminance and excelling in such electrical properties as the voltage in the reverse direction.

Instead of the compound semiconductor light-emitting device, the n-type Group III nitride semiconductor layer disposed on the hexagonal group III nitride semiconductor layer containing crystalline defects only in a lowered density and constituting the second stacked structure part also excels in crystallinity and can be utilized as an electron transporting layer (channel layer) for use in the Schottky barrier FET. This channel layer can be formed with an undoped n-type $Ga_XIn_{1-X}N$ ($0 \leqq X \leqq 1$) obtained by avoiding intentional addition of an impurity, for example. The n-type Group III nitride semiconductor layer that is disposed on the hexagonal Group III nitride semiconductor layer containing crystalline defects in a lowered density and constituting the second stacked structure part, therefore, can manifest a high electron mobility. The configuration of this invention mentioned above, therefore, is capable of providing an FET excelling in high-frequency properties.

This invention, in the aforementioned configuration of invention, enables formation of the aforementioned boron phosphide-based semiconductor layer with a crystal having a (1.1.-2.0.) crystal face as its surface.

This invention, in the aforementioned configuration of invention, enables formation of the aforementioned boron phosphide-based semiconductor layer with a crystal having a (1.0.-1.0.) crystal face as its surface.

This invention, in the aforementioned configuration of invention, enables formation of the aforementioned compound semiconductor layer with a hexagonal semiconductor material.

This invention, in the aforementioned configuration of invention, enables the aforementioned boron phosphide-based semiconductor layer and the aforementioned compound semiconductor layer to be formed as bonded to a (1.1.-2.0.) crystal face as the interface.

This invention, in the aforementioned configuration of invention, enables the aforementioned boron phosphide-based semiconductor layer and the aforementioned compound semiconductor layer to be formed as bonded to a (1.0.-1.0.) crystal face as the interface.

This invention, in the aforementioned configuration of invention, enables formation of the aforementioned boron phosphide-based semiconductor layer with a hexagonal boron phosphide-based semiconductor containing no anti-phase boundary.

Particularly, the hexagonal boron phosphide-based semiconductor layer to be used in the aforementioned configuration of invention is preferably formed of the aforesaid hexagonal material single crystal bulk or single crystal layer and disposed on a material having a (1.1.-2.0.) crystal face or a (1.0.-1.0.) crystal face as its surface and having (0.0.0.1.) crystal faces thereof arranged in a direction perpendicular to the surface. It is preferably disposed, for example, on the surface formed of a (1.1.-2.0.) crystal face of the wurtzite hexagonal GaN or on the surface formed of a (1.0.-1.0.) crystal face. Otherwise, it is preferably disposed, for example, on the surface formed of a (1.1.-2.0.) crystal face of an aluminum nitride (AlN) single crystal substrate or single crystal layer or on the surface formed of a (1.0.-1.0.) crystal face.

For example, the hexagonal GaN single crystal layer or AlN single crystal layer having a (1.1-2.0.) crystal face as its surface can be formed by such means of vapor phase growth as the MBE method using a solid source or a gaseous source, for example, on the under layer formed of a sapphire having a (1.-1.0.2.) crystal face as its surface.

The surface formed of a (1.1.-2.0.) crystal face or a (1.0.-1.0.) crystal face of the hexagonal single crystal has (0.0.0.1.) crystal faces regularly arranged in a direction perpendicular to the surface. This fact will be explained below with reference to the crystal structure of the section of a hexagonal material schematically illustrated in FIG. 13.

Figure 13:
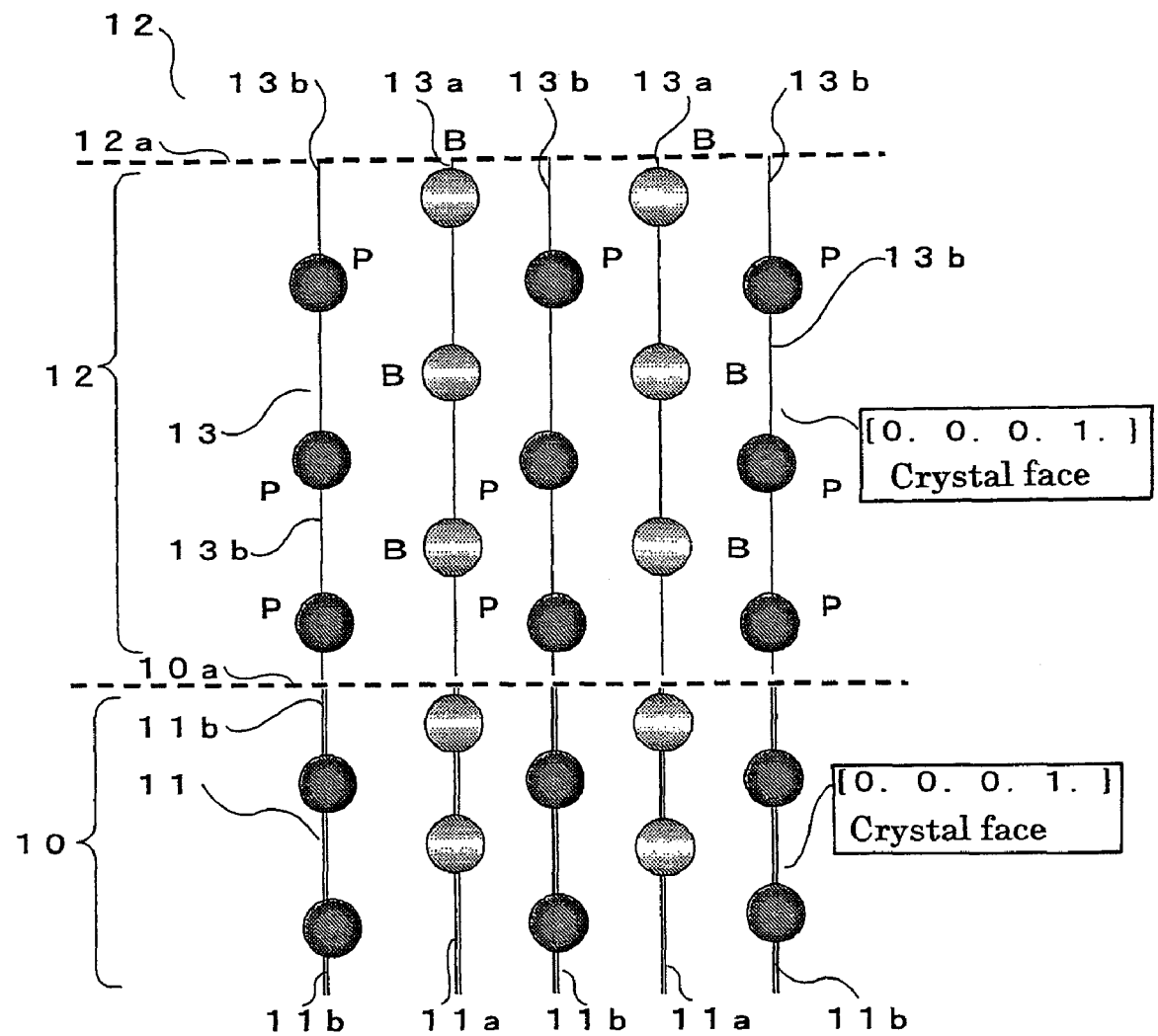
FIG. 13 is schematic diagram illustrating the arrangement of atoms in a joined region.

FIG. 13 is a schematic diagram illustrating the arrangement of atoms in the bond region. Referring to FIG. 13, a hexagonal compound semiconductor material 10 and a hexagonal boron phosphide-based semiconductor material 12 are formed as bonded to each other and the wurtzite hexagonal compound semiconductor material 10 has (0.0.0.1) crystal faces 11 formed perpendicularly to the surface 10a formed of the (1.0.-1.0.) crystal face thereof. In the (0.0.0.1.) crystal faces 11, Group II atomic planes 11a having Group III elements regularly arranged and Group V atomic planes 11b having Group V elements regularly arranged are alternately formed. On a surface 10a having regularly exposed alternately the rows of atomic planes 11a and 11b formed of mutually different elements composing the hexagonal compound single crystal 10, a boron phosphide-based semiconductor layer 12 devoid of an anti-phase boundary can be efficiently formed just the same for the purpose of having the atomic planes containing such Group III atoms as boron (B) and the atomic planes containing such Group V atoms as phosphorus (P) to be regularly arranged alternately.

Incidentally, the expression "containing no anti-phase boundary" or "devoid of an anti-phase boundary" as used in this invention refers to the fact that the boundaries exist at a density of 5 boundaries/cm$^2$ or less, inclusive of the case of absence of an anti-phase boundary.

The hexagonal boron phosphide-based semiconductor layer devoid of an anti-phase boundary can be formed by the aforementioned means of vapor phase growth of the hexagonal boron phosphide-based semiconductor layer. In the case of implementing this formation by the MOCVD method, for example, the temperature of growth is preferably 750° C. or more and 1200° C. or less. If the temperature falls below 750° C., it will prove to be disadvantageous for the purpose of promoting the growth of the hexagonal boron phosphide-based semiconductor layer devoid of an anti-phase boundary because it prevents the boron source and the phosphorus source from undergoing thermal decomposition sufficiently. The growth at a high temperature exceeding 1200° C. proves to be unfavorable because it incurs an obstacle in obtaining a single crystal layer devoid of an anti-phase boundary owing to the lack of the crystal faces forming the hexagonal boron phosphide-based semiconductor layer. It particularly incurs difficulty in stably forming the boron phosphide-based semiconductor layer devoid of an anti-phase boundary because it induces the lack of the atomic planes formed of phosphorus (P) that constitute the hexagonal boron phosphide-based semiconductor layer.

Then, on the occasion of forming the hexagonal boron phosphide-based semiconductor layer devoid of an anti-phase boundary by the MOCVD method, the concentration ratio of the phosphorus (P) source to the boron (B) source (the so-called V/III ratio) for supply to the growth reaction system is preferably 120 or less for the purpose of forming a p-type electrically conductive layer. Further, the V/III ratio is preferably in the range between 20 or more and 50 or less. Then, for the purpose of forming a hexagonal boron phosphide-based semiconductor layer devoid of a non-phase boundary manifesting an n-type conduction, the V/III ratio mentioned above is preferably 150 or more. Further, the V/III ratio is preferably 400 or more and 1400 or less.

When a hexagonal single crystal having a (1.1.-2.0.) crystal face as its surface is used, the surface allows formation thereon of a hexagonal boron phosphide-based semiconductor layer bonded via a (1.1.-2.0.) crystal face thereof to the surface, epitaxially grown by inheriting the arrangement of atoms on the surface of the hexagonal single crystal, and enabled to have a (1.1.-2.0.) crystal face as its surface. When a hexagonal single crystal having a (1.0.-1.0.) crystal face as its surface is used, the surface allows formation thereon of a hexagonal boron phosphide-based semiconductor layer bonded via a (1.0.-1.0.) crystal face thereof to the surface, epitaxially grown by inheriting the arrangement of atoms on the surface of the hexagonal single crystal, and enabled to have a (1.0.-1.0.) crystal face as its surface.

To add an explanation with reference to the schematic diagram of FIG. 13, in the inside of the hexagonal boron phosphide-based semiconductor material 12 having a (1.1.-2.0.) crystal face or a (1.0.-1.0.) crystal face as its surface 12a, (0.0.0.1.) crystal faces 13 are regularly arranged in a direction perpendicular to the surface 12a thereof. The (0.0.0.1.) crystal faces 13 have alternately formed therein Group III atomic planes 13a having Group III elements of boron (B) regularly arranged and Group V atomic planes 13b having group V elements of phosphorus (P) regularly arranged. That is, in the surface 12a of the hexagonal boron phosphide-based semiconductor layer 12 formed of (1.1.-2.0.) crystal faces or (1.0.-1.0.) crystal faces, the Group III atomic planes 13a and the Group V atomic planes 13b constituting the (0.0.0.1.) crystal faces 13 are regularly arranged alternately repeatedly.

As a result, the hexagonal boron phosphide-based semiconductor layer having a (1.1.-2.0.) crystal face or a (1.0.-1.0.) crystal face as its surface serves effectively as an under layer for the purpose of forming a hexagonal Group III nitride semiconductor layer devoid of an anti-phase boundary, for example.

On the hexagonal boron phosphide-based semiconductor layer having a (1.1.-2.0.) crystal face as its surface, the hexagonal Group III nitride semiconductor layer bonded via a (1.1.-2.0.) crystal face thereof to the surface and having a non-polar (11.-2.0.) crystal face as its surface can be formed. The term "non-polar surface" as used herein refers to the surface in which the electric charge attendant on the Group III atomic planes and the electric charge attendant on the Group V atomic planes are neutralized owing to the exposure of the Group III atomic planes and the Group V atomic planes in equal amounts through the surface and the polarity is consequently cancelled.

In the inside of the hexagonal compound semiconductor layer disposed as bonded to the hexagonal boron phosphide-based semiconductor layer having a (1.1.-2.0.) crystal face as its surface and having a non-polar (1.1.-2.0.) crystal face as its surface, the (0.0.0.1.) crystal faces are regularly arranged in a direction perpendicular to the surfaces. Moreover, they are arranged parallel to the (0.0.0.1.) crystal faces inside the hexagonal boron phosphide-based semiconductor layer. This mode of bonding, therefore, allows a hexagonal compound semiconductor layer of superior quality containing anti-phase boundaries in a very small amount and containing twins and stacking faults only in a small amount and excelling in crystallinity to be formed as bonded.

Then, on the hexagonal boron phosphide-based semiconductor layer having a (1.0.-1.0.) crystal face as its surface, a hexagonal Group III nitride semiconductor layer bonded via a (1.0.-1.0.) crystal face thereof to the surface and having a non-polar (1.0.-1.0.) crystal face as its surface can be formed.

In the inside of the hexagonal compound semiconductor layer disposed as bonded to the hexagonal boron phosphide-based semiconductor layer having a (1.0.-1.0.) crystal face as its surface and having a non-polar (1.0.-1.0.) crystal face as its surface, the (0.0.0.1.) crystal faces are regularly arranged in a direction perpendicular to the surfaces. Moreover, they are arranged parallel to the (0.0.0.1) crystal faces inside the hexagonal boron phosphide-based semiconductor layer. This mode of bonding, therefore, allows a hexagonal compound semiconductor layer of superior quality containing anti-phase boundaries in a very small amount and containing twins and stacking faults only in a small amount and excelling in crystallinity to be formed as bonded.

Particularly, the hexagonal boron phosphide-based semiconductor layer is advantageously formed with a monomeric boron phosphide (P) layer. This is because the number of component elements required in this case is small as compared with the case of forming the boron phosphide-based multi-mixed crystal mentioned above and consequently the formation can be implemented conveniently without entailing the complexity encountered in controlling the composition ratio of the component elements. Further, when the formation of the hexagonal compound semiconductor layer with aluminum-gallium nitride (formula of composition: $Al_X Ga_{1-X}N$: $0 \leq X \leq 1$) is elected, the $Al_X Ga_{1-X}N$ ($0 \leq X \leq 1$) layer consequently formed contains crystalline defects only in a small amount owing to the good lattice constant matching between boron phosphide and aluminum-gallium nitride.

For example, the GaN layer which is bonded via a (1.1.-2.0.) crystal face thereof to the BP layer having a (1.1.-2.0.) crystal face as its surface and has a (1.1.-2.0.) crystal face as its surface has virtually no discernible sign of twins. The produced layer has superior quality and is devoid of anti-phase boundary. Even the AlN layer that is bonded via a (1.0.-1.0.) crystal face to the BP layer having a (1.0.-1.0.) crystal face as its surface and has a (1.0.-1.0.) crystal face as its surface shows virtually no discernible sign of twins and turns out to be a layer of superior quality devoid of an anti-phase boundary.

The presence of anti-phase boundaries inside the hexagonal boron phosphide-based semiconductor layer and the hexagonal compound semiconductor layer, for example, can be discerned by the visual observation of the cross-sectional TME image. The expression "devoid of anti-phase boundary" as used in this invention, for example, refers to the fact that the density of boundaries is 5 boundaries/$cm^2$ or less, inclusive of the case having no anti-phase boundary. By the electron diffraction method utilizing TEM, the presence of twins and stacking faults inside the hexagonal boron phosphide-based semiconductor layer and the hexagonal compound semiconductor layer can be investigated. This invention adopts the rule of announcing absence of twin or stacking fault when the electron diffraction image shows no discernible sign of extra spots due to twins or diffuse-scatters due to stacking faults.

The hexagonal compound semiconductor layer such as, for example, the hexagonal Group III nitride semiconductor layer which possesses such a non-polar crystal face as mentioned above can be effectively utilized as a function layer for forming the light-emitting part of a nitride semiconductor light-emitting device capable of inducing light emission in the visible band or the ultraviolet band of high intensity. It can be also utilized effectively as an electron channel layer (electron transporting layer) or an electron supply layer for the manufacture of a Field Effect Transistor (FET) or as a contact layer for the formation of an ohmic electrode such as a source or a drain electrode.]

This invention, in the configuration of invention mentioned above, enables the inside of the above boron phosphide-based semiconductor layer to be so formed that the (0.0.0.1.) crystal faces may be arranged substantially parallel to the direction of thickness of the layer and the distance of n continuous (0.0.0.2.) crystal faces (n denoting a positive integer of 2 or more) may substantially equal the length of the c-axis of the single crystal mentioned above. Incidentally, in the configuration of invention mentioned above, the number n of the (0.0.0.2.) crystal faces mentioned above is preferably 6 or less.

In the configuration of invention mentioned above, when the hexagonal single crystal to be used is in the form of a bulk single crystal or single crystal layer, the hexagonal single crystal having (0.0.0.1.) crystal faces arranged in a direction substantially parallel to the direction of increasing its layer thickness (the direction of growth) is particularly preferably used. The surface of this single crystal, therefore, is formed of a (1.0.-1.0.) crystal face or a (1.1.-2.0.) crystal face, for example. The expression "the direction of increasing the layer thickness" as used herein refers to the direction in which the individual layers are stacked. In the following description, it may be occasionally expressed as a "perpendicular direction." The (0.0.0.1.) crystal faces are arranged substantially parallel to the direction of increasing the layer thickness of the single crystal. The expression "substantially parallel" refers to the direction that preferably falls in the range of ±10 degrees relative to the perpendicular direction. If this direction deviates from this range, the deviation will induce plentiful occurrence of twins and crystalline defects in the layer stacked thereon.

In the configuration of invention mentioned above, the single crystal is furnished, on the surface formed of a (1.0.-1.0.) crystal face or a (1.1.-2.0.) crystal face, with the hexagonal boron phosphide-based semiconductor layer. On the surface formed of a (1.0.-1.0.) crystal face or a (1.1.-2.0.) crystal face of the single crystal made of a 2H-type, 4H-type, or 6H-type hexagonal silicon carbide single crystal, for example, the hexagonal boron phosphide-based semiconductor layer is disposed. Then, on the surface formed of a (1.0.-1.0.) crystal face or a (1.1.-2.0.) crystal face of the single crystal made of a wurtzite hexagonal aluminum nitride (AlN) or made similarly of a wurtzite hexagonal GaN, the hexagonal boron phosphide-based semiconductor layer is disposed.

The hexagonal boron phosphide-based semiconductor layer is preferably disposed on the surface formed of a (1.0.-1.0.) crystal face (commonly called "M plane or m plane") or a (1.1.-2.0.) crystal face (commonly called "A-plane or a-plane") of the single crystal made of sapphire (α-alumina single crystal).

Then, the hexagonal boron phosphide-based semiconductor, as described in detail herein below, causes the (0.0.0.2.) crystal faces thereof to be arranged substantially perpendicularly to the surface of the single crystal and also causes the spacing of n continuous (0.0.0.2.) crystal faces (n denoting a positive integer of 2 or more) to be substantially equalized to the length of the c-axis of the single crystal (the interval of the (0.0.0.1.) crystal faces). The spacing of n continuous (0.0.0.2.) crystal faces of the boron phosphide-based semiconductor layer and the length of the c-axis of the single crystal are matched in terms of long period. Incidentally, the hexagonal boron phosphide-based semiconductor layer has its (0.0.0.2.) crystal faces arranged substantially perpendicularly to the surface of the single crystal as described above, the expression "substantially perpendicularly" refers preferably to the range of ±10 degrees relative to the perpendicular direction. If this direction deviates from this range, this deviation induces copious occurrence of twins and crystalline defects in the layer to be stacked thereon.

The hexagonal boron phosphide-based semiconductor layer can be formed on the surface formed of such preferable crystal faces as mentioned above by the aforementioned vapor-phase growth method. This formation can be implemented by such growth means of forming a layer under a vacuum environment as the gas source MBE method or the Chemical Beam Epitaxy (CBE) method.

On the occasion of forming the hexagonal boron phosphide-based semiconductor layer by the normal pressure (substantially atmospheric pressure) or reduced pressure MOCVD method, for example, on the surface formed of the preferable crystal faces of the hexagonal single crystal, the hexagonal boron phosphide-based semiconductor layer having (0.0.0.2.) crystal faces arranged regularly as spaced in a direction parallel to the direction of increasing the layer thickness (the perpendicular direction to the surface of the single crystal mentioned above) can be formed by (a) causing the temperature of growth to be 750° C. or more and 850° C. or less, (b) causing the concentration ratio of the phosphorus (P) source to the boron (B) source to be supplied to the growth reaction system (the so-called V/III ratio) to fall in the range between 400 or more and 500 or less, and (c) causing the rate of growth of the boron phosphide-based semiconductor layer to be 20 nm or more per minute and 30 nm or less per minute.

The rate of growth of the hexagonal boron phosphide-based semiconductor layer, when the concentration of such Group III component element source as boron (B) supplied per unit time to the growth reaction system is increased, is increased substantially proportionately to the concentration within the range of the temperature of growth mentioned above. Then, when the concentration of such Group III component element source as born supplied per unit time to the growth reaction system is fixed, the rate of growth is increased in accordance as the temperature of growth is heightened. At a low temperature falling below 750° C., since the boron (B) source and the phosphorus (P) source do not undergo thermal decomposition sufficiently, the rate of growth suddenly falls and the preferable rate of growth mentioned above will not be attained. Meanwhile, the elevation of the temperature of growth beyond 850° C. is at a disadvantage as in suddenly inducing formation of such a polymeric boron phosphide crystal as the crystal having the formula of composition $B_6P$.

In the case of forming the hexagonal BP layer by the MOCVD method using phosphine ($PH_3$) as a phosphorus source and triethyl boron (($C_2H_5)_3B$) as a boron source, for example, this formation is implemented by fixing the temperature of growth at 800° C., the concentration ratio of the source materials supplied to the growth reaction system, namely the $PH_3/(C_2H_5)_3B$ ratio, at 450, and the rate of growth at 25 nm per minute.

For the purpose of stably forming the hexagonal boron phosphide-based semiconductor layer having its (0.0.0.2) crystal faces arranged parallel in the direction perpendicular to its surface on the surface formed of the preferable crystal faces of the hexagonal single crystal, the growth of the boron phosphide-based semiconductor layer is preferably started after the unnecessary substance adsorbed on the surface has been desorbed. The boron phosphide-based semiconductor layer is preferably grown, for example, after the hexagonal single crystal is heated to a temperature exceeding the temperature preferable for the growth of the hexagonal boron phosphide-based semiconductor layer, namely to a temperature exceeding 850° C. so as to induce desorption of the molecules adsorbed on the surface of the hexagonal single crystal. The hexagonal boron phosphide-based semiconductor layer, subsequent to the desorption of the adsorbed molecules, is preferably grown on the surface of the hexagonal single crystal while the surface cleaned in consequence of the desorption is retained in the cleaned state intact. As a means to grow the hexagonal boron phosphide-based semiconductor layer, the MBE method or the CBE method that carries out the growth under an environment of high vacuum or the reduced-pressure Chemical Vapor Deposition (CVD) method that carries out the growth under an environment of reduced pressure proves to be suitable.

Figure 18:
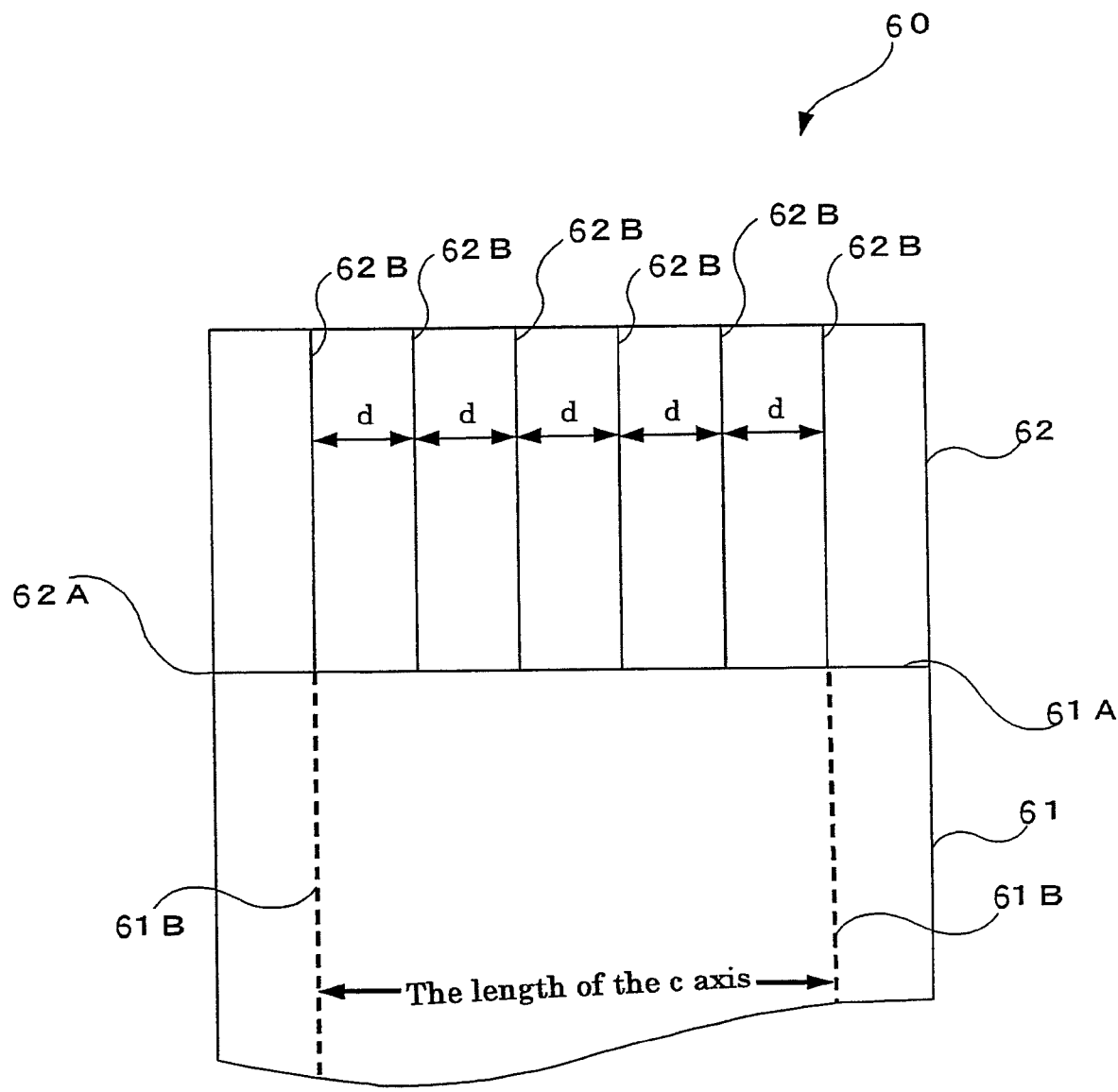
FIG. 18 is a schematic diagram for illustrating a long period matching junction system.

On the cleaned surface of the hexagonal single crystal formed of such preferable crystal faces as mentioned above, the hexagonal boron phosphide-based semiconductor layer that manifests long period matching relative to the length of the c-axis of the hexagonal single crystal as mentioned above can be stably formed. FIG. 18 illustrates conceptually the appearance of the long period matching exhibited by the hexagonal boron phosphide-based semiconductor layer and designated by this invention. This diagram illustrates the appearance of the long period matching that occurs when a hexagonal single crystal 61 is sapphire having a (1.0.-1.0.) crystal face as its surface 61A and a hexagonal boron phosphide-based semiconductor layer 62 disposed as bonded on the surface 61A is a $B_{0.98}Al_{0.02}P$ layer. As shown in the diagram, (0.0.0.1.) crystal faces 61B are regularly arranged in a mutually parallel state in a direction perpendicular to the surface 61A. In the inside of the hexagonal boron phosphide-based semiconductor layer 62 bonded via a joint surface 62A to the surface 61A of the hexagonal single crystal, a total of six (0.0.0.2.) crystal faces 62B are arranged parallel to the (0.0.0.1.) crystal face 61B of sapphire. Specifically, in a junction system 60 between the single crystal 61 and the boron phosphide-based semiconductor layer 62, the surface 61A of the cleaned sapphire has a total of six (0.0.0.2.) crystal faces 62B arranged in an interval equaling the length of the c-axis of sapphire (1.30 nm) (the "length of the c-axis" shown in FIG. 18) as shown in FIG. 18.

In other words, on the hexagonal single crystal 61, the hexagonal boron phosphide-based semiconductor layer can be formed in such a state that the length of the c-axis thereof and the total length ($=(n-1) \times d$) of (0.0.0.2.) crystal planes 62B (n denoting a positive integer of 2 or more, such as 2, 3, 4, 5, or 6 and d denoting the spacing between adjacent (0.0.0.2) planes) may equal, namely in the state of long period matching. The number of the (0.0.0.2.) crystal planes is required to be at least 2 because the value of d is given by the spacing between two adjacent (0.0.0.2.) crystal planes. That is, the value of n is 2 or more.

In the $B_{0.98}Al_{0.02}P$ mixed crystal layer or the $B_{0.99}Ga_{0.01}P$ mixed crystal layer disposed as bonded on the surface formed of a (1.0.-1.0.) crystal face of sapphire, the number of (0.0.0.2.) crystal faces constituting the long period matching structure is 6, namely n is 6, as mentioned above. In the BP layer disposed as bonded on the surface formed of a (1.0.-1.0) crystal face of GaN, however, n is 2. Also in the BP layer disposed as bonded on the surface formed of a (1.0.-1.0.) crystal face of AlN, n is 2. Then, in the BP layer disposed as bonded on the (1.1.-2.0.) crystal face of the single crystal made of GaN or AlN, n is 2.

If the surface of the hexagonal single crystal on which the hexagonal boron phosphide-based semiconductor layer is to be disposed has not been given sufficient cleaning, the hexagonal boron phosphide-based semiconductor layer having the (0.0.0.2.) crystal faces orderly arranged as illustrated in FIG. 18 will encounter a hindrance in being obtained with fully satisfactory stability owing to the adverse effects of the adsorbed molecules of oxygen (O) or water ($H_2O$) persisting on the surface, for example. Likewise, when such unnecessary molecules as carbon monoxide (CO), carbon dioxide ($CO_2$), and nitrogen ($N_2$) that are not the molecules of the source materials for the growth of the hexagonal boron phosphide-based semiconductor layer are persisting in an adsorbed state on the surface of the hexagonal single crystal they are at a disadvantage in disabling the hexagonal boron phosphide-based semiconductor layer possessing the aforementioned long period matching structure from being obtained with fully satisfactory stability.

The disadvantage incurred in stably obtaining the hexagonal boron phosphide-based semiconductor layer capable of fulfilling the aforementioned long period matching is caused by the fact that the adsorbed unnecessary molecules disturb the orderly arrangement of the (0.0.0.2.) crystal faces constituting the hexagonal boron phosphide-based semiconductor layer. Another cause for the disadvantage resides in the fact that the adsorbed molecules possibly originate ultimately the formation of crystal faces differing in plane index from the (0.0.0.2.) crystal faces. As yet another cause for the disadvantage, the fact that the hexagonal boron phosphide-based semiconductor crystal does not grow on the region in which the adsorbed molecules persist may be cited. On the occasion of causing the hexagonal boron phosphide-based semiconductor layer possessing the long period matching structure to be disposed in a bonded state, therefore, it is important that the surface of the hexagonal single crystal be given a cleaning treatment.

In the case of the MBE method or the CBE method that forms a layer under an environment of vacuum, the presence of the adsorbed molecules on the surface of the hexagonal single crystal can be perceived from the Reflection High-Energy Electron Diffraction (RHEED) pattern, for example. When the adsorbed molecules are persisting on the surface, the RHEED image assumes a ring (annular) or halo pattern instead of the form of a spot or a streak that primarily results from the surface of the hexagonal single crystal. The species of molecules adsorbed on the surface of the hexagonal single crystal can be identified, for example, by such means of analysis as the method of infrared absorption spectroscopy or the method of ultraviolet absorption spectroscopy.

Further, on the occasion of causing the hexagonal boron phosphide-based semiconductor layer to be disposed as bonded on the surface of the hexagonal single crystal, if the rate of growth falls short of 20 nm per minute or exceeds 30 nm per minute, either of the deviations will result in hindering sufficiently stable production of the hexagonal boron phosphide-based semiconductor layer capable of fulfilling the long period matching. This is because the low rate of growth falling short of 20 nm per minute induces diffusion of the phosphorus (P) atoms constituting the (0.0.0.2.) crystal face and gives rise to a numerical loss in the (0.0.0.2.) crystal faces sufficient for producing the long period matching structure. This is also because the (0.0.0.2.) crystal faces are inevitably formed in excess of the number of (0.0.0.2.) crystal faces (namely, n in this invention) enough for producing the long period matching structure when the rate of growth is so high as to exceed 30 nm per minute.

The number of the (0.0.0.2.) crystal faces of the hexagonal boron phosphide-based semiconductor layer arranged in the distance equivalent to the c-axis of the surface of the hexagonal single crystal so as to fulfill the long period matching, namely n of this invention, can be investigated, for example, from the lattice image obtained by an electron diffraction analysis or a cross-sectional TEM technique utilizing a transmission electron microscope (TEM). When the long period matching structure conforming to this invention is formed, the diffraction spots emanating from the (0.0.0.1.) crystal face of the hexagonal single crystal on the electron diffraction image appear with intervals equaling (n−1) times the diffraction spots emanating from the (0.0.0.2.) crystal faces of the hexagonal boron phosphide-based semiconductor layer (the total of intervals between a total of n (0.0.0.2.) crystal faces).

Particularly, by forming the long period matching structure the n of which is 8 or less, preferably 6 or less, it is made possible to obtain a hexagonal boron phosphide-based semiconductor layer containing misfit dislocations only in a small amount and excelling in crystallinity. The density of misfit dislocations occurring in the hexagonal boron phosphide-based semiconductor layer in a direction perpendicular to the c-axis of the hexagonal single crystal in the region neighboring the interface between the hexagonal boron phosphide-based semiconductor layer and the hexagonal single crystal increases in proportion to the value of the n mentioned above. The present inventor has been ascertained as a result of his study that the long period matching structure having an n of 6 or less brings a hexagonal boron phosphide-based semiconductor layer of superior quality that falls short of inducing a locally inferior electric breakdown voltage and reveals misfit dislocations only in a small density.

The hexagonal boron phosphide-based semiconductor layer of the long period matching structure having an n of 2 or more and 6 or less can be effectively utilized as an under layer for the formation of a grown layer of superior quality excelling in crystallinity because it contains misfit dislocations only in a small density. The layers which are suitably disposed on the boron phosphide-based semiconductor layer of the long period matching structure are the grown layers formed of such Group III nitride semiconductors as, for example, SiC, ZnO, GaN, AlN, InN and $Al_XGa_YIn_ZN$ ($0 \leq X, Y, Z \leq 1$ and $X+Y+Z=1$) which is a mixed crystal thereof. Then, as concrete examples of the Group III nitride semiconductor layer, the grown layers formed of $GaN_{1-Y}P_Y$ ($0 \leq Y<1$) and $GaN_{1-Y}As_Y$ ($0 \leq Y<1$) which contain nitrogen (N) and such Group V elements as phosphorus (P) and arsenic (As) other than nitrogen may be cited.

By utilizing such a Group III nitride semiconductor layer which is formed on a hexagonal boron phosphide-based semiconductor layer possessing a long period matching structure and containing misfit dislocations only in a small amount and serving as an under layer, it is made possible to configure a p-n junction hetero structure capable of generating light emission of high intensity. For example, a Double Hetero (DH) bond light-emitting part can be produced for use in such a light-emitting device as the LED that has an $Al_XGa_YN$ ($0 \leq X, Y \leq 1$, $X+Y=1$) layer as a clad layer and a $Ga_XIn_{1-X}N$ ($0<X<1$) layer as a light-emitting layer.

Instead of the compound semiconductor light-emitting device, a Schottky barrier MESFET can be formed by utilizing a Group III nitride semiconductor layer containing crystalline defects only in a lowered density and excelling in crystallinity as an electron transporting layer (channel layer). The channel layer can be formed, for example, of an undoped n-type GaN layer that has avoided intentional addition of an impurity. The Group III nitride semiconductor layer containing crystalline defects only in a lowered density is advantageous for the purpose of obtaining an MESFET excelling in high-frequency properties because it manifests high electron mobility.

This invention, in the configuration of invention mentioned above, enables the boron phosphide-based semiconductor layer mentioned above to be formed of a hexagonal monomeric boron phosphide and allows the hexagonal boron phosphide-based semiconductor layer to be configured so as to be provided on the surface thereof with electrodes.

The hexagonal boron phosphide-based semiconductor layer to be used in the aforementioned configuration of invention is formed by using a hexagonal single crystal layer or a single crystal substrate as its under layer. Particularly, on the surface of a single crystal layer or a single crystal substrate formed of crystal faces deficient in polarity or devoid of polarity, the hexagonal boron phosphide-based semiconductor layer can be efficiently formed. This is because the surface formed of crystal faces of a hexagonal single crystal layer or single crystal substrate that are deficient in or devoid of polarity has atoms so arranged as to bring conveniently a hexagonal boron phosphide-based semiconductor layer.

The expression "nonpolar crystal faces suitable for the disposition of a hexagonal boron phosphide-based semiconductor layer" in the single crystal of a hexagonal compound material produced by the combination of an element A and an element B, for example, refers to a surface which exposes the element A and the element B at an identical surface density. The crystal faces of this description are the (1.1.-2.0.) crystal faces of 2H-type SiC, a wurtzite GaN or AlN, for example. The (1.1.-2.0) crystal faces of sapphire also answer the description.

When a material having a small ionicity is elected for the production of a boron phosphide-based semiconductor layer that is formed on the crystal faces of a hexagonal single crystal layer or a single crystal substrate deficient in or devoid of polarity, a hexagonal boron phosphide-based semiconductor layer can be stably formed. When the boron phosphide-based semiconductor layer has a small ionicity, since it has a small difference in the ionicity from a hexagonal single crystal layer or a single crystal substrate deficient in or devoid of polarity, it enables stable formation of the hexagonal boron phosphide-based semiconductor layer of superior quality containing such crystalline defects as twins only in a small amount Of the boron phosphide-based semiconductors, only the monomeric boron phosphide (BP) serves as an ideal material for stably producing a hexagonal boron phosphide-based semiconductor layer because the ionicity (fi) as small as 0.006 (refer, for example, to "Bands and Bonds in Semiconductors," (Physics Series 38), written by J. C. Phillips and published by Yoshioka Shoten K. K. on Jul. 25, 1985, $3^{rd}$ edition, page 51). Since boron arsenide (BAs) has such a small fi as 0.002 (refer, for example, to "Bands and Bonds in Semiconductors," mentioned above, page 51), a hexagonal boron phosphide-based semiconductor layer can be stably formed also from boron arsenide phosphide ($BAs_{1-Y}P_Y$ wherein $0<Y \leq 1$) that is a mixed crystal with BP.

Particularly, a boron phosphide-based semiconductor layer having a small ionicity and grown so as to acquire a (1.1.-2.0.) crystal face as its surface can be suitably utilized as a semiconductor layer for the purpose of allowing disposition of the electrodes that conform to this invention because of containing twins and stacking faults only in a small amount.

The question whether the formed boron phosphide-based semiconductor layer is a hexagonal crystal layer or not can be investigated by such means of analysis as electron diffraction or X-ray diffraction. According to an ordinary electron diffraction analysis, for example, it can be discerned that the monomeric BP disposed as bonded on the non-polar (1.1.-2.0.) crystal face of the hexagonal GaN single crystal layer is a hexagonal wurtzite crystal layer. It can be also discerned that the surface of the hexagonal BP crystal layer constitutes a non-polar (1.1.-2.0.) crystal face.

The a-axis of the wurtzite hexagonal monomeric BP measures about 0.319 nm and, therefore, coincides with the a-axis of hexagonal $Al_XGa_{1-X}N$ ($0 \leq X \leq 1$) of the Group III nitride semiconductor layer. When the monomeric BP is elected for the formation of a hexagonal boron phosphide-based semiconductor layer, therefore, a Group III nitride semiconductor layer excelling in crystallinity can be formed on the layer owing to a good lattice matching. The boron phosphide-based semiconductor layer formed on a hexagonal crystal deficient in or devoid of polarity can contribute as an upper layer to produce a Group III nitride semiconductor layer excelling in crystallinity because the layer excels in crystallinity.

The ohmic electrodes to be disposed on the hexagonal boron phosphide-based semiconductor layer can be formed of a various metallic material or electrically conductive oxide material. For a boron phosphide-based semiconductor layer exhibiting n-type conduction, for example, an n-type ohmic electrode can be formed of an alloy, such as gold (Au)-germanium (Ge) alloy or gold-tin (Sn) alloy. The n-type ohmic electrode can be formed of an alloy containing a rare earth element, such as lanthanum (La)-aluminum (Al) alloy. Besides, the n-type ohmic electrode can be formed of an oxide material, such as ZnO.

For the p-type boron phosphide-based semiconductor layer, a p-type ohmic electrode can be formed of a gold (Au)-zinc (Zn) alloy or a gold (Au)-beryllium (Be) alloy. The p-type ohmic electrode can also be formed of an Indium (In) Tin (Sn) Oxide (ITO) composite layer. An ohmic electrode deficient in contact resistance is preferably formed of a low-resistive layer having a carrier concentration of about $1 \times 10^{18}$ $cm^{-3}$ or more. The layer on which the ohmic electrodes are disposed is preferably a low-resistive layer, no matter whether it may be a doped layer having an impurity intentionally added or au undoped layer having avoided intentional addition of an impurity. In the case of the monomeric BP layer, the n-type and the p-type low-resistive layers convenient for the formation of the electrodes can be readily obtained each in an undoped form.

The n-type and p-type ohmic electrodes are invariably disposed optimally on a hexagonal boron phosphide-based semiconductor layer containing crystalline defects only in a small amount and excelling in crystallinity. The plan to dispose one of the ohmic electrodes on a hexagonal boron phosphide-based semiconductor layer excelling in crystallinity and dispose the other ohmic electrode contiguously on a Group III nitride semiconductor layer formed on the aforementioned layer as an under layer and excelling in crystallinity can contribute to bring a semiconductor device of excellent properties.

A Schottky contact to be formed on a hexagonal boron phosphide-based semiconductor layer can be formed of such a transition metal as titanium (Ti), for example. It can also be formed of platinum (Pt), for example. The utilization of a hexagonal boron phosphide-based semiconductor layer excelling in crystallinity and conforming to this invention enables formation of a gate electrode entailing only insignificant leakage current Particularly, the structure having a Schottky contact disposed on a boron phosphide-based semiconductor layer of high resistance permits formation of a gate electrode entailing only insignificant leakage current and excelling in breakdown voltage. Thus, this construction can contribute to manufacture a high-frequency Schottky barrier FET entailing only insignificant leakage current and excelling in transconductance. A boron phosphide-based semiconductor layer of high resistance can be conveniently formed with a hexagonal monomeric BP layer of high resistance electrically compensated by undoping or doping either or both of n-type and p-type impurity.

For a hexagonal boron phosphide-based semiconductor layer, metallic electrodes serving to effect ohmic contact or Schottky contact can be formed by an ordinary vacuum deposition method, an electronic beam deposition method, a sputtering method, etc. Oxide materials, such as ITO and ZnO, can be formed by an ordinary physical film formation means, such as a sputtering method and a wet film forming method, such as a sol-gel method.

The compound semiconductor devices covered by the examples of this invention will be described with reference to the drawings. In each of the examples, similar component elements are denoted by similar reference numerals. The first example will be explained.

Example 1

This invention will be specifically explained by citing as an example the case of configuring a compound semiconductor LED by utilizing a hexagonal monomeric BP layer disposed as bonded on the surface formed of a (1.1.-2.0.) crystal face of a bulk crystal of sapphire.

Figure 2:
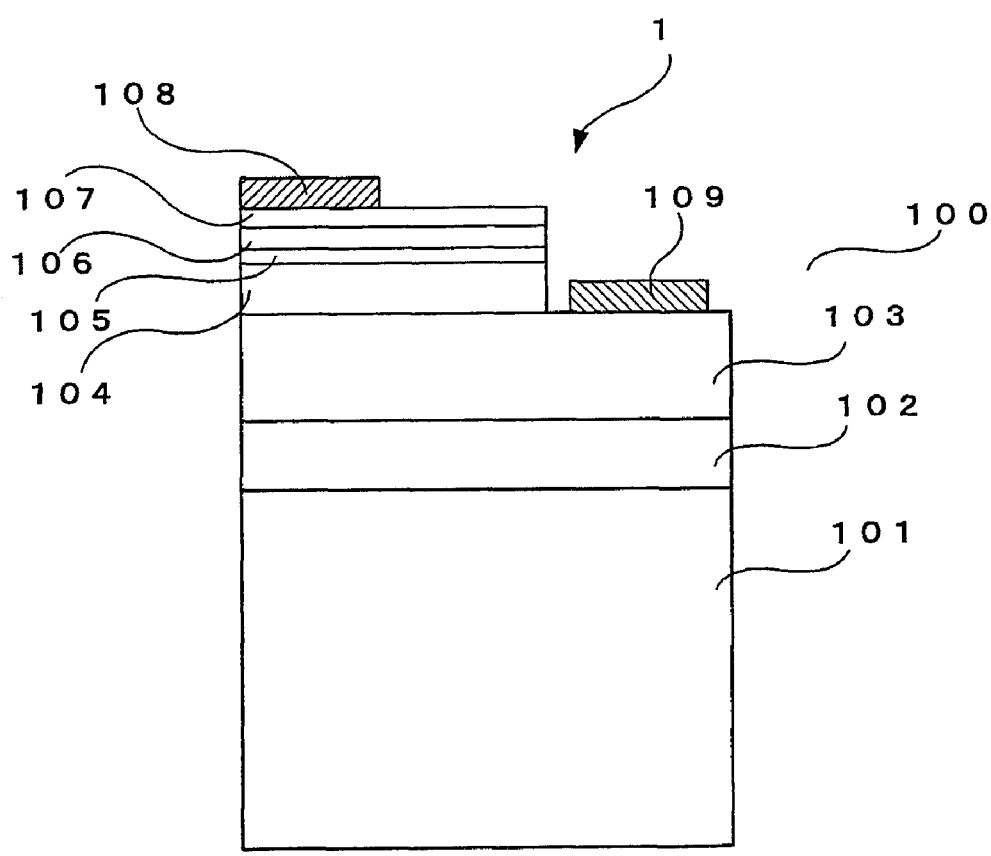
FIG. 2 is a schematic cross section illustrating the LED taken through FIG. 1 along broken line II-II.

FIG. 1 schematically illustrates the planar structure of the LED to which this Example 1 pertains. Then, FIG. 2 is a schematic cross section illustrating the compound semiconductor device LED 1, taken through FIG. 1 along the broken line II-II.

A stacked structure 100 intended to manufacture the LED 1 was formed by using as a substrate 101 a sapphire (α-alumina single crystal) having a (1.1.-2.0.) crystal face (commonly called "A-plane") as its surface. On the surface of the (1.1.-2.0.) crystal face of the substrate 101, an undoped n-type hexagonal monomeric BP layer formed in a thickness of about 290 nm was formed as a hexagonal boron phosphide-based semiconductor layer 102 by using the ordinary MOCVD method.

By an ordinary TEM analysis, the surface of the hexagonal monomeric BP layer constituting the hexagonal boron phosphide-based semiconductor layer 102 was shown to be a (1.1.-2.0.) crystal face. Then, by the electron diffraction pattern, the <1.-1.0.0.> direction of the sapphire substrate 101 and the <1.-1.0.0.> direction of the hexagonal monomeric BP layer 102 were shown to be oriented parallel to each other. Further, the observation by a cross-sectional TEM technique revealed virtually no discernible sign of the presence of twins in the hexagonal monomeric BP layer 102. In the region inside the hexagonal monomeric BP layer above the distance of about 50 nm from the interface with the sapphire substrate 101, virtually no discernible confusion was found on the lattice arrangement.

On the surface formed of a (1.1.-2.0.) crystal face of a hexagonal monomeric BP layer constituting the hexagonal boron phosphide-based semiconductor layer 102, a wurtzite hexagonal n-type GaN layer (layer thickness=2100 nm) 103 was grown. By the analysis utilizing an ordinary TEM, twins and stacking faults were scarcely discerned in the inner region of the hexagonal GaN layer 103 neighboring the interface with the hexagonal monomeric BP layer constituting the hexagonal boron phosphide-based semiconductor layer 102.

On the (1.1.-2.0.) surface of the hexagonal n-type GaN layer 103, a lower clad layer (layer thickness=150 nm) 104 formed of a hexagonal n-type $Al_{0.15}Ga_{0.85}N$, a light-emitting layer 105 of a multiple quantum well structure formed of 5 cycles severally consisting of $Ga_{0.85}In_{0.15}N$ well layer/$Al_{0.01}Ga_{0.99}N$ barrier layer, and an upper clad layer 106 formed of p-type $Al_{0.10}Ga_{0.90}N$ having a layer thickness of 50 nm were stacked in the order mentioned to complete a light-emitting part of a p-n junction DH structure. On the surface of the aforementioned upper clad layer 106, a p-type GaN layer (layer thickness=80 nm) was further stacked as a contact layer 107 to complete the formation of the stacked structure 100.

In the region of part of the aforementioned p-type contact layer 107, a p-type ohmic electrode 108 was formed with a gold (Au)•nickel oxide (NiO) alloy. An n-type ohmic electrode 109 was formed on the surface of the n-type GaN layer 103 exposed by removing such layers as the lower clad layer 104 and the light-emitting layer 105 existing in the region assigned for the disposition of the electrode 109 by a dry etching means. As a result, the LED 1 was completed.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 460 nm. The emission luminance in the state of a chip was about 1.6 cd. Since the Group III nitride semiconductor layer excelling in crystallinity could be formed by disposing the Group III nitride semiconductor layers 104 to 106 constituting the light-emitting part of the p-n junction DH structure and the n-type GaN layer 103 furnished with the n-type ohmic electrode 109 on the hexagonal BP layer, the voltage in the reverse direction assumed a high magnitude exceeding 15 V when the current in the reverse direction was fixed at 10 μA. Further, owing to the fineness of crystallinity of the Group III nitride semiconductor layer, virtually no local breakdown could be discerned.

Example 2

The contents of this invention will be specifically explained by citing as an example the case of configuring a compound semiconductor LED by adopting a bulk crystal of sapphire as a hexagonal single crystal and utilizing a hexagonal monomeric BP layer disposed thereon.

Figure 8:
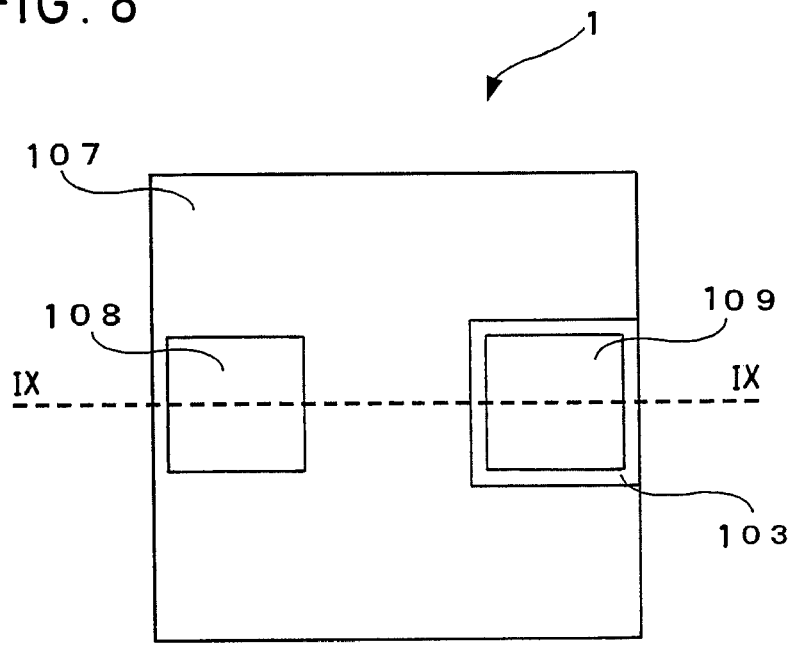
FIG. 8 is a schematic plan view illustrating the LED described in Example 2.
Figure 9:
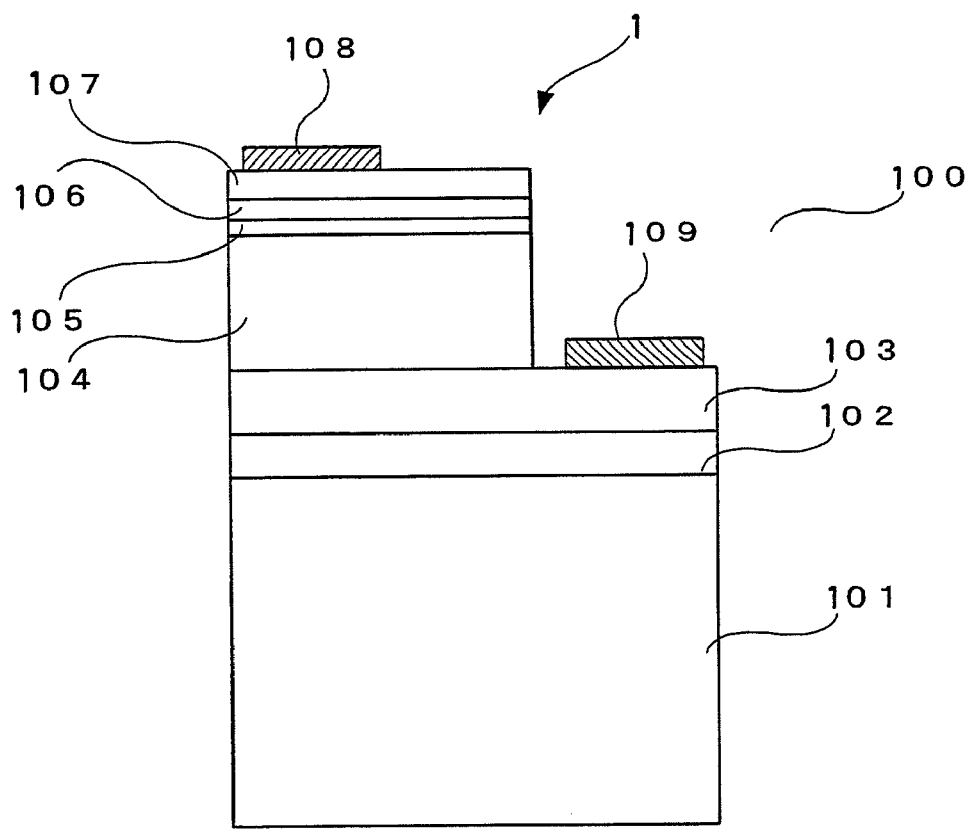
FIG. 9 is a schematic cross section illustrating the LED taken through FIG. 8 along broken line IX-IX.

FIG. 8 schematically illustrates the planar structure of a LED to which this Example 2 pertains. Then, FIG. 9 is a schematic cross section illustrating the LED 1 taken through FIG. 8 along the broken line IX-IX.

The stacked structure 100 intended for manufacture of the LED 1 was formed by using as the substrate 101 a sapphire having a (1.1.-2.0.) crystal face as its surface. On the surface of the substrate 101, the undoped n-type hexagonal monomeric BP layer 102 having a layer thickness of about 290 nm was formed by using an ordinary MOCVD method.

By an ordinary TEM analysis, the (0.0.0.1.) crystal face of the hexagonal monomeric BP layer 102 was shown to be arranged in a mutually parallel state perpendicularly to the surface of the sapphire substrate 101. Specifically, from the spacing of lattice planes of the (0.0.0.1.) crystal faces arranged in a mutually parallel manner in a direction perpendicular to the c-axis of the hexagonal unit lattice, the length of the c-axis of the hexagonal monomeric BP layer 102 was found to be 0.524 nm. Further, by the observation according to the cross-sectional TEM technique, the presence of any twin was hardly discerned in the hexagonal monomeric BP layer 102. In the region inside the hexagonal monomeric BP layer above the distance of about 50 nm from the interface with the sapphire substrate 101, the regular arrangement of the (0.0.0.1.) crystal planes in a mutually parallel manner was confirmed while virtually no discernible confusion was found on the lattice arrangement.

On the surface of the hexagonal monomeric BP layer 102 having the (0.0.0.1.) crystal faces thereof arranged parallel to the direction of increasing the layer thickness, the wurtzite hexagonal GaN layer (layer thickness=1900 nm) 103 doped with germanium (Ge) was grown. According to the analysis utilizing the ordinary TEM, the n-type GaN layer 103 grown on the hexagonal monomeric BP layer 102 serving as an under layer was found to be a single crystal layer having a (0.0.0.1.) crystal face arranged parallel to the (0.0.0.1.) crystal face of the hexagonal monomeric BP layer 102. In the inner region of the hexagonal GaN layer 103, twins and crystalline defects were hardly discerned.

On the (1.1.-2.0.) surface of the hexagonal n-type GaN layer 103, the lower clad layer (layer thickness=250 nm) 104 formed of a hexagonal n-type $Al_{0.15}Ga_{0.85}N$, the light-emitting layer 105 of a multiple quantum well structure formed of seven cycles severally consisting of a $Ga_{0.85}In_{0.15}N$ well layer and a $Al_{0.01}Ga_{0.99}N$ barrier layer, and the upper clad layer 106 having a layer thickness of 25 nm and formed of a p-type $Al_{0.10}Ga_{0.90}N$ were stacked in the order mentioned to complete the light-emitting part of the p-n junction DH structure. The whole of this light-emitting part was a single crystal layer having the (0.0.0.1.) crystal face thereof arranged parallel to the (0.0.0.1.) crystal face of the hexagonal monomeric BP layer 102. In the inner region of the whole of the light-emitting part, twins and stacking faults were scarcely discerned. The stacked structure 100 was completed by having a p-type GaN layer (layer thickness=75 nm) further deposited on the surface of the upper clad layer 106.

In the region of part of the p-type contact layer 107 mentioned above, the p-type ohmic electrode 108 was formed with a gold-nickel-oxide alloy. The n-type ohmic electrode 109 was formed on the surface of the n-type GaN layer 103 exposed by removing layers, such as the lower clad layer 104 and the light-emitting layer 105, existing in the region assigned for the disposition of the electrode 109 by a dry etching means. As a result, the LED 1 was completed.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 455 nm. The emission luminance in the state of a chip was about 1.5 cd. Since the ohmic electrodes 108 and 109 were disposed in the vertical direction of the stacked structure 100 across the light-emitting part in order that the device-operating electric current might flow parallel to the (0.0.0.1.) crystal faces of the Group III nitride semiconductor layers 104 to 106 constituting the light-emitting part of the p-n junction DH structure, the voltage in the forward direction (@20 mA) assumed such a low magnitude as 3.2 V.

Meanwhile, since the light-emitting part could be formed of a Group III nitride semiconductor layer fated to excel in crystallinity because it was disposed on the hexagonal BP layer, the voltage in the reverse direction obtained when the current in the reverse direction was fixed at 10 μA assumed a high magnitude exceeding 15 V. Owing to the fineness of crystallinity of the Group III nitride semiconductor layer constituting the light-emitting part, virtually no local breakdown could be discerned.

Example 3

This invention will be specifically explained by citing as an example the case of configuring a compound semiconductor LED from a stacked structure provided with a GaN layer having a (1.1.-2.0.) crystal face as its surface and a hexagonal monomeric BP layer disposed as bonded to the surface and having a (1.1.-2.0.) crystal face as its surface.

Figure 10:
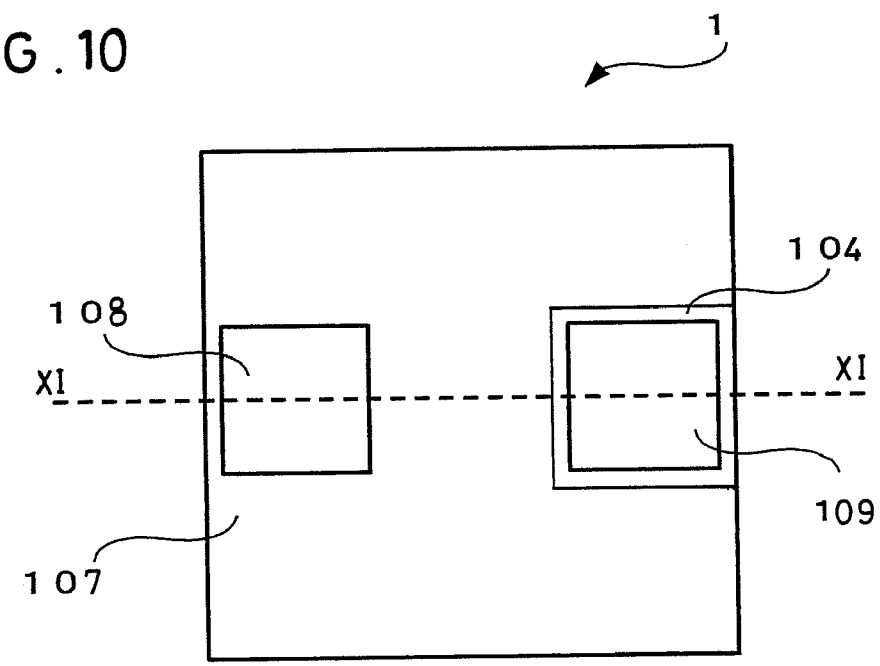
FIG. 10 is a schematic plan view illustrating the LED described in Example 3.
Figure 11:
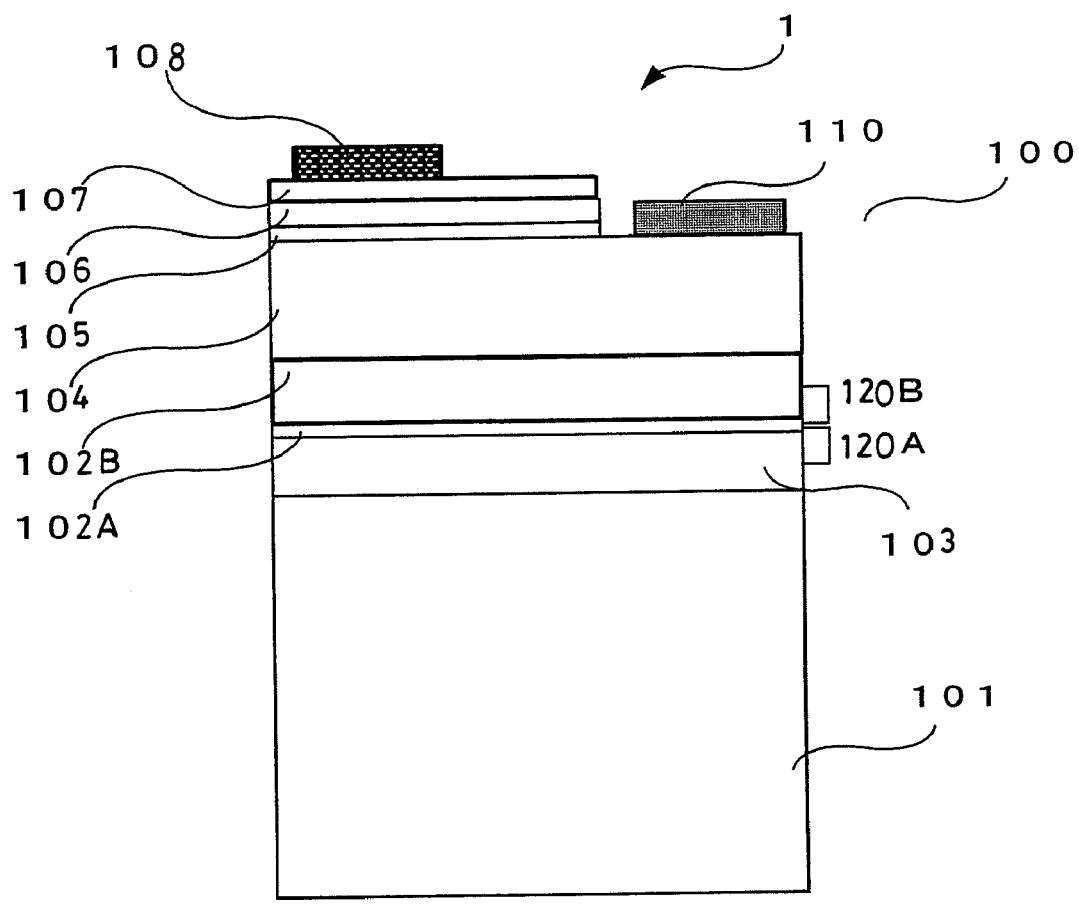
FIG. 11 is a schematic cross section illustrating of the LED taken through FIG. 10 along broken line XI-XI.

FIG. 10 schematically illustrates the planar structure of the LED 1 to which this Example 3 pertains. FIG. 11 is a schematic cross section illustrating the LED 1 taken through FIG. 10 along broken line XI-XI.

The stacked structure 100 intended to manufacture the LED 1 was formed by using as a substrate 101 a sapphire (α-alumina single crystal) having a (1.-1.0.2.) crystal face (commonly called R-plane) as its surface. On the surface of the (1.-1.0.2.) crystal face of the substrate 101, an undoped n-type GaN layer 103 having a (1.1.-2.0.) crystal face as its surface was formed by utilizing an ordinary MBE method. The dislocation density in the GaN layer 103 (layer thickness=1200 nm) determined by an ordinary cross-sectional TEM technique was about $2 \times 10^9$ cm$^{-2}$.

On the surface formed of the (1.1.-2.0.) crystal face of the GaN layer 103, an undoped n-type monomeric BP layer (layer thickness=280 nm) 102A was grown. As a result, the GaN layer 103 and the BP layer 102A formed the first stacked structure part 120A according to the designation of this invention. According to an ordinary electron diffraction analysis utilizing the TEM, the BP layer 102A was found to be a wurtzite hexagonal single crystal layer having a (1.1.-2.0.) crystal face as its surface. In the electron diffraction image of the BP layer 102A, neither extra diffraction nor diffuse-scattering caused by twins or stacking faults could be discerned. Further, by the cross-sectional TEM analysis, it was confirmed that the dislocations included in the GaN layer 103 were inhibited by the interface with the BP layer 102A, namely the interface of the first stacked structure part 120A, from permeating upwardly (toward the BP layer 102A).

On the (1.1.-2.0.) surface of the hexagonal monomeric BP layer 102, a hexagonal n-type GaN layer (layer thickness=600 nm) 102B was further disposed. Consequently, the hexagonal BP layer 102A and the hexagonal GaN layer 102B formed the second stacked structure part 120B according to the designation of this invention. Since the hexagonal GaN layer 102B was disposed as bonded to the hexagonal monomeric BP layer 102A, the density of dislocations determined by the ordinary cross-sectional TEM technique assumed a low magnitude of $1 \times 10^4$ cm$^{-2}$ or less.

On the (1.1.-2.0.) surface of the hexagonal GaN layer 102B constituting the second stacked structure part 120B, the lower clad layer (layer thickness=300 nm) 104 formed of a hexagonal n-type $Al_{0.15}Ga_{0.85}N$ differing in composition from GaN, the light-emitting layer 105 of the multi-quantum-well structure formed of five cycles severally consisting of $Ga_{0.88}In_{0.12}N$ well layer (layer thickness=3 nm)/$Al_{0.01}Ga_{0.99}N$ barrier layer (layer thickness=10 nm), and the upper clad layer 106 having a layer thickness of 90 nm and formed of p-type $Al_{0.10}Ga_{0.90}N$ were stacked in the order mentioned to complete the light-emitting part of the p-n junction DH structure.

According to the ordinary TEM analysis, the lower clad layer 104 to the upper clad layer 106 constituting the light-emitting part of the p-n junction DH structure were severally a wurtzite hexagonal single crystal layer. Further, the light-emitting part could be formed of a Group III nitride semiconductor layer excelling particularly in crystallinity because it was disposed on the GaN layer 102B containing dislocations only in a small amount and excelling in crystallinity.

On the surface of the upper clad layer 106 mentioned above, a p-type GaN layer (layer thickness=90 nm) was further deposited as the contact layer 107 to complete the formation of the stacked structure 100.

In the region of part of the p-type contact layer 107 mentioned above, a p-type ohmic electrode 108 formed of a gold•nickel oxide alloy was formed. An n-type ohmic electrode 109 was formed on the surface of the lower clad layer 104 exposed by removing layers, such as the light-emitting layer 105 on the lower clad layer 104, existing in the region assigned for the disposition of the n-type ohmic electrode 109. As a result, the LED 11 was completed.

The LED 1 was tested for light-emitting property by causing the device-operating electric current of 20 mA to flow in the forward direction between the p-type and n-type ohmic electrodes 108 and 109. The main wavelength of the light emitted from the LED 1 was about 450 nm. The emission luminance in the state of a chip was about 1.7 cd. The voltage in the reverse direction (when the current in the reverse direction was fixed at 10 µA) assumed a high magnitude exceeding 15 V, owing to the reflection of the fineness of crystallinity of the Group III nitride semiconductor layers forming the lower clad layer 104, the light-emitting layer 105, and the upper clad layer 106 that constituted the light-emitting part of the p-n junction DH structure. Then, owing to the fineness of crystallinity of the Group III nitride semiconductor layers that constituted the n-type GaN layer 102B and the light-emitting part of the p-n junction DH structure disposed thereon, virtually no local breakdown could be discerned.

Example 4

This invention will be specifically explained by citing as an example the case of configuring a compound semiconductor FET from the stacked structure provided with the GaN layer having a (1.1.-2.0.) crystal face as its surface and the hexagonal monomeric BP layer disposed as bonded to the surface and having a (1.1.-2.0.) crystal face as its surface.

Figure 12:
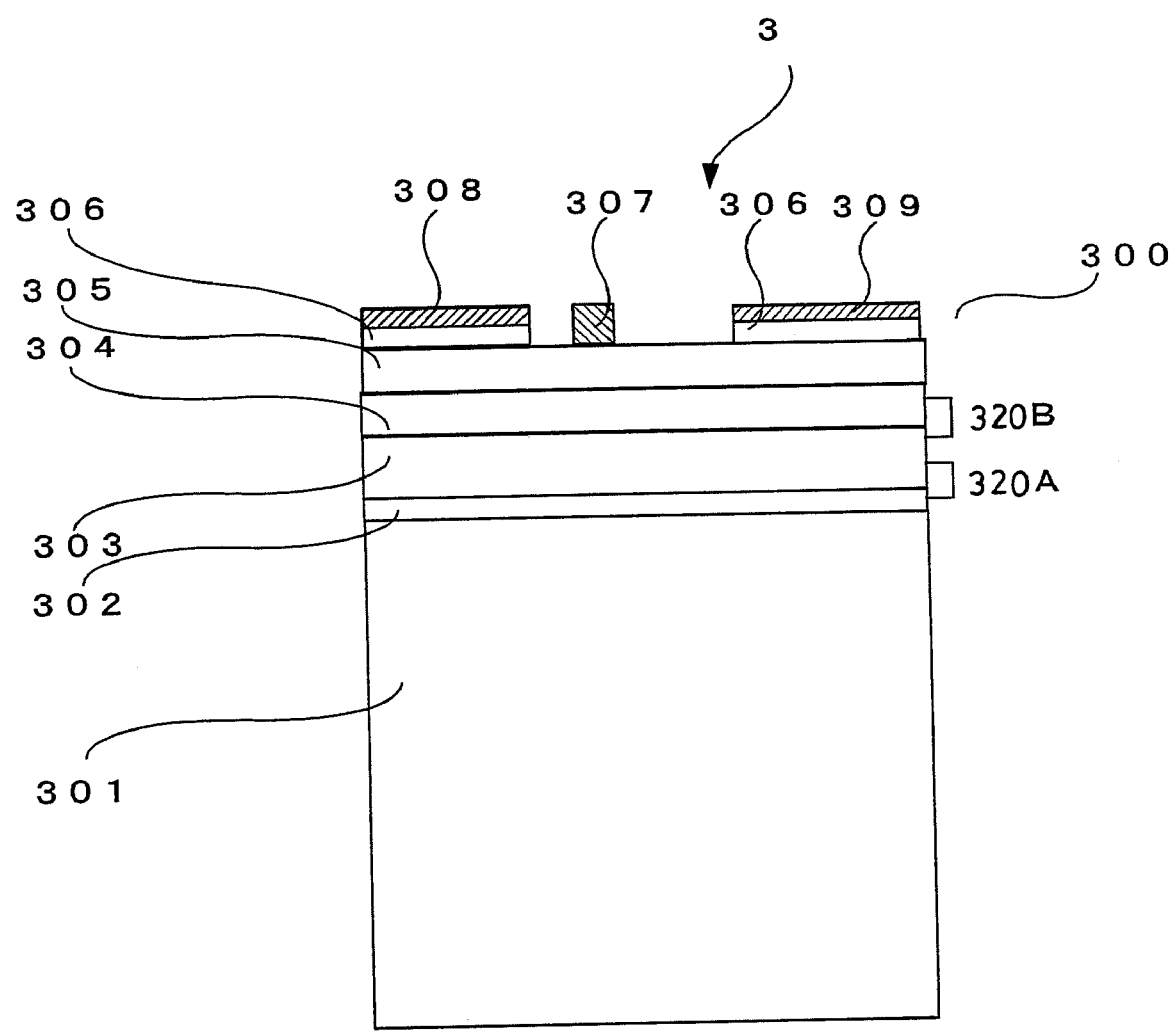
FIG. 12 is a schematic cross section illustrating the FET described in Example 4.

FIG. 12 is a schematic cross section illustrating a GaN-based high-frequency FET 3 to which this Example 4 pertains. A stacked structure 300 intended to manufacture the FET 3 was formed by using as a substrate 301 a sapphire (α-alumina single crystal) having a (1.-1.0.2.) crystal face (commonly called R-plane) as its surface. On the surface of the (1.-1.0.2.) crystal face of the substrate 301, an undoped n-type GaN layer 302 of high resistance having a (1.1.-2.0.) crystal face as its surface was formed by utilizing an ordinary MBE method. The density of dislocations in the GaN layer 302 (layer thickness=1000 nm) determined by an ordinary cross-sectional TEM technique was about $3 \times 10^9$ $cm^{-2}$.

On the surface formed of the (1.1.-2.0.) crystal face of the GaN layer 302, an undoped p-type monomeric BP layer of high resistance (layer thickness=200 nm) 303 was grown. As a result, the GaN layer 302 and the BP layer 303 formed the first stacked structure part 320A according to the designation of this invention. By the ordinary electron diffraction analysis utilizing TEM, the BP layer 303 was found to be a wurtzite hexagonal single crystal layer having a (1.1.-2.0.) crystal face as its surface. In the electron diffraction image of the BP layer 303, neither extra diffraction nor diffuse-scattering due to twins or stacking faults could be discerned. Further, by the cross-sectional TEM analysis, it was confirmed that the dislocations contained in the GaN layer 302 were inhibited by the interface with the BP layer 303, namely the interface of the first stacked structure part 320A, from permeating upwardly (toward the BP layer 303).

On the (1.1.-2.0.) surface of the hexagonal monomeric BP layer 303, an undoped hexagonal n-type GaN layer (layer thickness=110 nm) was further disposed as an electron transporting layer 304. As a result, the hexagonal BP layer 303 and the hexagonal GaN layer constituting the electron transporting layer 304 formed the second stacked structure part 320B according to the designation of this invention. The electron transporting layer 304 could be formed of a crystal layer of superior quality having a dislocation density of $1 \times 10^4$ $cm^{-2}$ or less because it was disposed as bonded to the hexagonal monomeric BP layer 303.

On the (1.1.-2.0.) surface of the electron transporting layer 304 formed of a hexagonal n-type GaN layer and constituting the second stacked structure part 320B, an electron supply layer 305 formed of a hexagonal n-type $Al_{0.25}Ga_{0.75}N$ (layer thickness=25 nm) differing in composition from GaN was disposed as bonded. The electron supply layer 305 was further provided with a contact layer 306 formed of an n-type GaN layer to complete the formation of the stacked structure 300 for use in the FET.

The electron transporting layer 304 could be formed of a Group III nitride semiconductor layer excelling in crystallinity because it was disposed on the hexagonal BP layer 303 containing twins and stacking faults only in a small density and excelling in crystallinity. Since the electron supply layer 305 was disposed as bonded to the electron transporting layer 304 excelling in crystallinity, it was found by an ordinary TEM analysis to be a single crystal layer likewise excelling in crystallinity.

On the surface of the electron supply layer 305 exposed by removing the region of part of the contact layer 306 by the ordinary dry etching technique, a Schottky gate electrode 307 was formed. On the surface of the GaN 306 contact layer allowed to survive on the opposite sides of the gate electrode 307, an ohmic source electrode 308 formed of a rare earth element-aluminum alloy and an ohmic drain electrode 309 were formed to complete the FET 3.

The FET of this invention could be materialized as a GaN-based FET which excelled in power properties and permitted use of a high-frequency electric power because it utilized as the electron transporting layer a GaN layer formed by using a hexagonal monomeric BP layer as an under layer and enabled to contain dislocations only in a low density and excel in crystallinity and further because it manifested a large transconductance and suppressed the leakage of current via dislocations. Further, since the FET was formed with a hexagonal monomeric BP layer excelling in crystallinity, a GaN electron transporting layer, and a GaN electron supply layer, it showed virtually no discernible sign of local breakdown.

Example 5

The contents of this invention will be specifically explained by citing as an example the case of configuring a compound semiconductor LED by adopting a bulk crystal of sapphire as a hexagonal single crystal and utilizing a hexagonal monomeric BP layer 110 disposed thereon and containing no anti-phase boundary.

Figure 14:
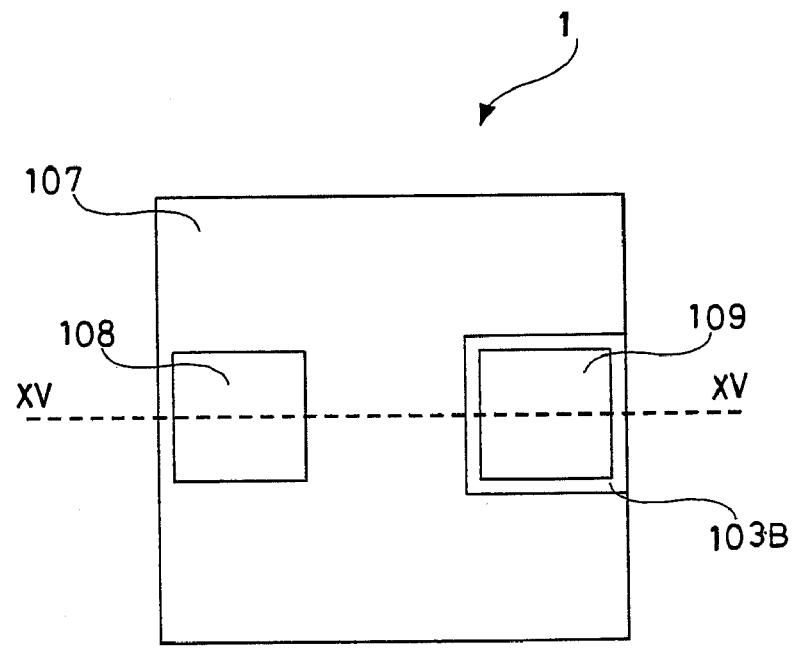
FIG. 14 is a schematic plan view illustrating the LED described in Example 5.
Figure 15:
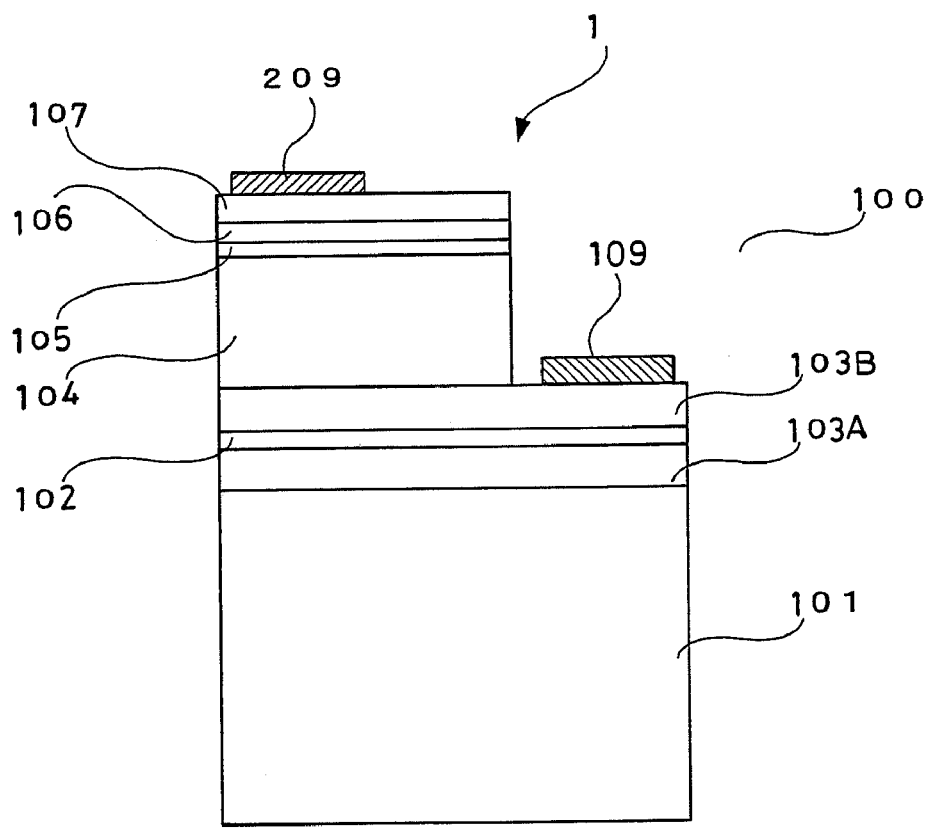
FIG. 15 is a schematic cross section illustrating the LED taken through FIG. 14 along broken line XV-XV.

FIG. 14 schematically illustrates the planar structure of the LED to which this example 5 pertains. Then, FIG. 15 is a schematic cross section illustrating the LED 1 taken through FIG. 14 along broken line XV-XV. The stacked structure 100 intended to manufacture the LED 1 is formed by using, as the substrate 101, sapphire (α-alumina single crystal) which has a (1.-1.0.2.) crystal face (commonly called R-plane) as its surface. On the surface of the substrate 101, an n-type hexagonal GaN layer 103A having a layer thickness of about 3200 nm is formed as a single crystal for an under layer by the ordinary MOCVD method. By the ordinary electron diffraction analysis, the surface of the hexagonal GaN layer 103A was identified as a (1.1.-2.0.) crystal face. Further, it was shown by an ordinary section TEM observation that the (0.0.0.1.) crystal face constituting the hexagonal GaN layer 103A was arranged perpendicularly to the surface formed of the (1.1.-2.0.) crystal face.

On the surface formed of the (1.1.-2.0.) crystal face of the hexagonal GaN layer 103A, the undoped n-type hexagonal monomeric BP layer 102 was grown. The hexagonal BP layer 102 was grown at 780° C. by an ordinary atmospheric pressure MOCVD method. By the ordinary cross-sectional TEM observation, it was shown that the hexagonal BP layer 102 was bonded via the (1.1.-2.0.) crystal face to the hexagonal GaN layer 103A and had the (1.1.-2.0.) crystal face as its surface and that the (0.0.0.1.) crystal face constituting the interior of the hexagonal BP layer 102 was arranged perpendicularly in a mutually parallel relation to the (1.1.-2.0.) crystal face.

Then, by the observation of the dark field image according to the section TEM technique, virtually no anti-phase boundary was discerned in the hexagonal BP layer 102 having the (1.1.-2.0.) crystal face as its surface. Further, in the electron diffraction pattern of the hexagonal BP layer 102, extra diffraction spots indicating the presence of a twin and a streak indicating the presence of a stacking fault were not discerned.

On the surface of the hexagonal monomeric BP layer 102 having (0.0.0.1) crystal faces arranged parallel in the direction of increasing the layer thickness, the wurtzite hexagonal n-type GaN layer (layer thickness=160 nm) 103B doped with germanium (Ge) was grown. By the analysis utilizing an ordinary TEM this n-type GaN layer 103B grown on the hexagonal monomeric BP layer 102 serving as an under layer was identified as a single crystal layer having the (0.0.0.1.) crystal faces arranged parallel to the (0.0.0.1.) crystal face of the hexagonal monomeric BP layer 102.

It was shown that the n-type GaN layer 103B was bonded via the (1.1.-2.0.) crystal face to the hexagonal monomeric BP layer 102 and had the (1.1.-2.0.) crystal face as its surface and that the (0.0.0.1.) crystal face constituting the interior of the n-type GaN layer 103B was arranged perpendicularly in a mutually parallel relation to the (1.1.-2.0.) crystal face. Further, by an ordinary TEM analysis, anti-phase boundaries, twins, and stacking faults were scarcely discerned in the hexagonal GaN layer 103B.

On the (1.1.-2.0.) surface of the hexagonal n-type GaN layer 103B, the lower clad layer (layer thickness=250 nm) 104 formed of a hexagonal n-type $Al_{0.15}Ga_{0.85}N$, the light-emitting layer 105 of the multi-quantum-well structure formed of 5 cycles severally consisting of a $Ga_{0.85}In_{0.15}N$ well layer and an $Al_{0.01}Ga_{0.99}N$ barrier layer, and the upper clad layer 106 having a layer thickness of 50 nm and formed of a p-type $Al_{0.10}Ga_{0.90}N$ were stacked in the order mentioned to produce the light-emitting part of the p-n junction DH structure. On the surface of the upper clad layer 106 mentioned above, a p-type GaN layer (layer thickness=80 nm) was further deposited as the contact layer 107 to complete the formation of the stacked structure 100.

In the region of part of the p-type contact layer 107 mentioned above, a p-type ohmic electrode 108 formed of a gold (Au) nickel oxide (NiO) alloy was formed. An n-type ohmic electrode 109 was formed on the surface of the n-type GaN layer 103B exposed by removing layers, such as the lower clad layer 104 and the light-emitting layer 105, existing in the region assigned for the disposition of the electrode 109 by the dry etching technique. As a result, the LED 1 was completed.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 460 nm. The emission luminance in the state of a chip was about 1.6 cd. Since the lower clad layer 104 to the upper clad layer 106 and the n-type ohmic electrode 109 that constituted the light-emitting part of the p-n junction DH structure were formed on the hexagonal BP layer 102 and the n-type GaN layer 103 which scarcely revealed anti-phase boundaries, twins, and stacking faults discernibly, they were enabled to form Group III nitride semiconductor layers excelling in crystallinity. Thus, the light-emitting layer 105 emitted light of uniform intensity devoid of unevenness.

Example 6

The contents of this invention will be specifically explained by citing as an example the case of configuring a LED by utilizing as a hexagonal single crystal a hexagonal monomeric BP layer disposed on the GaN layer having a (1.0.-1.0.) crystal face as its surface and containing no anti-phase boundary.

Figure 16:
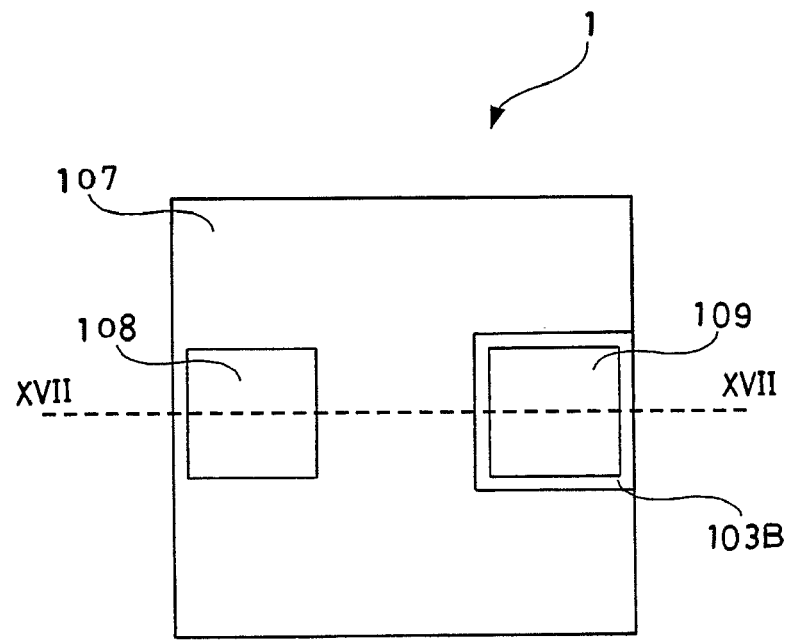
FIG. 16 is a schematic plan view illustrating the LED described in Example 6.
Figure 17:
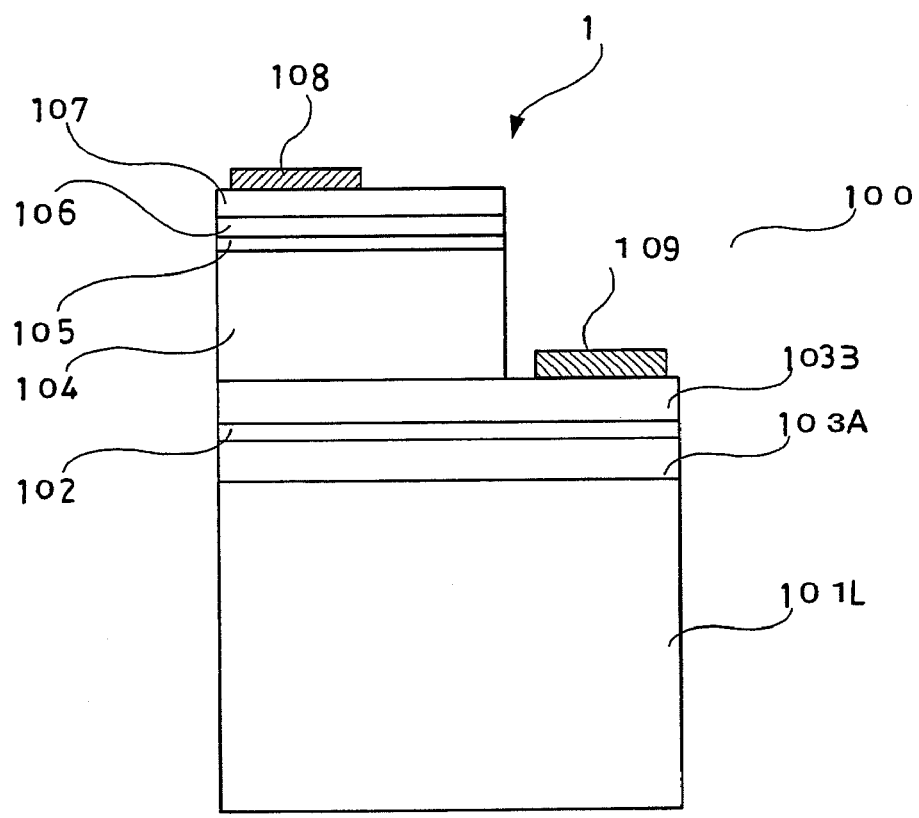
FIG. 17 is a schematic cross section illustrating the LED taken through FIG. 16 along broken line XVII-XVII.

FIG. 16 schematically illustrates the planar structure of the LED 1 to which this Example 6 pertains. Then, FIG. 17 is a schematic cross section illustrating the LED taken through FIG. 16 along broken line XVII-XVII.

The GaN layer 103A having the (1.0.-1.0.) crystal face as its face was formed by an ordinary MBE method on the surface formed of the (001) crystal face of the $LiAlO_2$ bulk single crystal substrate 101. By the ordinary cross-sectional TEM analysis, it was shown that the (0.0.0.1.) crystal face was arranged perpendicularly to the surface formed of the (1.0.-1.0.) crystal face inside the n-type hexagonal GaN layer 103A having a layer thickness of 480 nm.

On the surface of the (1.0.-1.0.) crystal face of the hexagonal GaN layer 103A formed as the single crystal of an under layer, the undoped n-type hexagonal monomeric boron phosphide (BP) layer 102 was grown. The hexagonal BP layer 102 was grown at 800° C. by an ordinary atmospheric pressure MOCVD method. By an ordinary cross-sectional TEM observation, it was shown that the hexagonal BP layer 102 was bonded via the (1.0.-1.0.) crystal face to the hexagonal GaN layer 103A and had the (1.0.-1.0.) crystal face as its surface and that the (0.0.0.1.) crystal face constituting the interior of the hexagonal BP layer 102 was arranged perpendicularly in a mutually parallel state to the (1.0.-1.0.) crystal face thereof.

By the observation of the dark field image according to the cross-sectional TEM technique, anti-phase boundaries were scarcely discerned inside the hexagonal BP layer 102 having the (1.0.-1.0.) crystal face as its surface. Further, in the electron diffraction pattern of the hexagonal BP layer 102, an extra spot indicating the presence of a twin and a streak indicating the presence of a stacking fault were not discerned.

On the surface of the hexagonal monomeric BP layer 102 having the (0.0.0.1.) crystal face arranged parallel to the direction of increasing the layer thickness, the wurtzite hexagonal n-type GaN layer (layer thickness=170 nm) 103B doped with silicon (Si) was grown. By the analysis utilizing an ordinary TEM, the n-type GaN layer 103B grown on the hexagonal monomeric BP layer 102 serving as an under layer was found to be a single crystal layer having the (0.0.0.1.) crystal face arranged parallel to the (0.0.0.1.) crystal face of the hexagonal monomeric BP layer 102.

It was also shown that the n-type GaN layer 103B was bonded via the (1.0.-1.0.) crystal face to the hexagonal monomeric BP layer 102 and had the (1.0.-1.0.) crystal face as its surface and that the (0.0.0.1.) crystal face constituting the interior of the n-type GaN layer 103B was arranged perpendicularly in a mutually parallel state to the (1.0.-1.0.) crystal face thereof.

Further, by the ordinary TEM analysis, anti-phase boundaries, twins, and stacking faults were scarcely discerned inside the hexagonal GaN layer 103B.

On the surface formed of the (1.0.-1.0.) crystal face of the hexagonal GaN layer 103B in which anti-phase boundaries, twins, and stacking faults were scarcely discerned, the lower clad layer 104, the light-emitting layer 105, and the upper clad layer 106 formed in the same structure as described in Example 5 were stacked to form the light-emitting part of the p-n junction DH structure. Then, on the upper clad layer 106 constituting the uppermost layer of the light-emitting part, the same contact layer 107 as described in Example 5 was disposed as bonded to complete the formation of the stacked structure 100 intended to manufacture the LED 1.

The p-type and n-type ohmic electrodes 108 and 109 were formed by the same means as described in the preceding Example 5 on the stacked structure 100 to produce the LED 1. This LED 1 was tested for light-emitting property by causing the device-operating electric current of 20 mA to flow in the forward direction between the p-type and n-type ohmic electrodes 108 and 109. The main wavelength of the light emitted from the LED 1 was about 460 nm. The emission luminance in the state of a chip was about 1.6 cd. Since the lower clad layer 104 to the upper clad layer 106 and the n-type ohmic electrode 109 that constituted the light-emitting part of the p-n junction DH structure were formed on the hexagonal BP layer 102 and the n-type GaN layer 103 which scarcely revealed anti-phase boundaries, twins, and stacking faults discernibly, they were enabled to form Group III nitride semiconductor layers excelling in crystallinity. Thus, the light-emitting layer 105 emitted light of uniform intensity devoid of unevenness.

Example 7

The contents of this invention will be specifically explained by citing as an example the case of configuring an LED by using the bulk crystal of sapphire as a hexagonal single and utilizing the hexagonal single crystal monomeric BP layer formed on the surface thereof.

Figure 19:
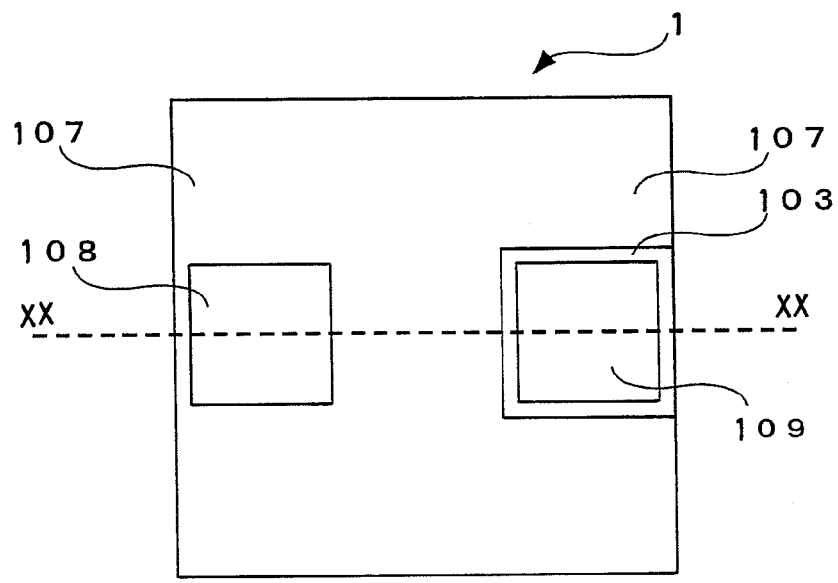
FIG. 19 is a schematic plan view illustrating the LED described in Example 7.
Figure 20:
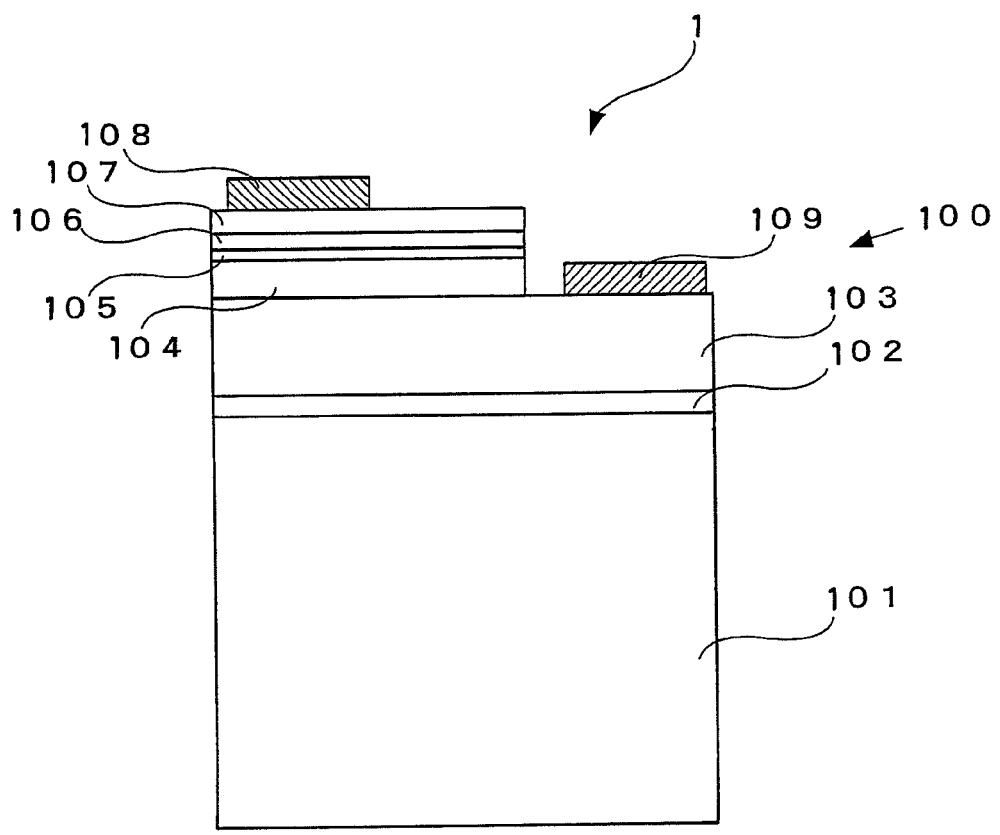
FIG. 20 is a schematic cross section illustrating the LED taken through FIG. 19 along broken line XX-XX.

FIG. 19 schematically illustrates the planar structure of the LED 1 to which this Example 7 pertains. Then, FIG. 20 is a schematic cross section illustrating the LED 1 taken through FIG. 19 along broken line XX-XX.

The stacked structure 100 intended to manufacture the LED 1 was formed on the sapphire (α-alumina single crystal) having the (1.1.-2.0.) crystal face (commonly called A-plane) as its surface and serving as the substrate 101. Before the hexagonal boron phosphide-based semiconductor layer 102 was formed on the surface of the substrate 101, the sapphire substrate 101 was heated to 1200° C. under a vacuum of about 0.01 atm. in an ordinary reduced-pressure MOCVD apparatus for the purpose of desorbing the substance adsorbed on the surface of the substrate 101 and cleaning the surface.

Then, on the cleaned surface of the sapphire substrate 101, the undoped n-type hexagonal monomeric BP layer 102 having a layer thickness of about 490 nm was formed as a hexagonal boron phosphite-based semiconductor layer by the ordinary reduced-pressure MOCVD method. By an ordinary cross-sectional TEM analysis, it was made evident that the (0.0.0.2.) crystal face of the hexagonal monomeric BP layer 102 was arranged perpendicularly in a mutually parallel relation to the cleaned surface of the sapphire substrate 101. On the surface of the sapphire substrate 101, the number of (0.0.0.2.) crystal faces of the hexagonal BP layer 102 arranged in the interval equaling the length of the c-axis of sapphire was 6, namely the n designated by this invention was 6. Besides, by the observation according to the cross-sectional TEM technique and the electron diffraction means, the presence of twins in the hexagonal monomeric BP layer 102 was scarcely discernible. Further, in the region inside the hexagonal monomeric BP layer 102 above the distance of about 30 nm from the interface with the sapphire substrate 101, virtually no discernible confusion was found on the arrangement of (0.0.0.2.) crystal faces. It was confirmed that the (0.0.0.2.) crystal faces were regularly arranged in mutually parallel relation.

On the surface of the hexagonal monomeric BP layer 102 having the (0.0.0.2.) crystal faces arranged parallel to the direction of increasing the layer thickness, the wurtzite hexagonal n-type GaN layer (layer thickness=1900 nm) 103 doped with germanium (Ge) was grown as a hexagonal Group III nitride semiconductor layer. By the analysis using an ordinary TEM, the n-type GaN layer 103 grown by using the hexagonal monomeric BP layer 102 as an under layer was found to be a single crystal layer having the (0.0.0.1.) crystal face arranged parallel to the (0.0.0.2.) crystal face of the hexagonal monomeric BP layer 102. Then, in the inner region of the hexagonal GaN layer 103, twins and stacking faults were scarcely discerned.

On the (1.1.-2.0.) surface of the hexagonal n-type GaN layer 103, the lower clad layer 104 (layer thickness=150 nm) formed of a hexagonal n-type $Al_{0.15}Ga_{0.85}N$, the light-emitting layer 105 of the multi-quantum-well structure formed of 5 cycles severally consisting of a $Ga_{0.85}In_{0.15}N$ well layer and an $Al_{0.01}Ga_{0.99}N$ barrier layer, and the upper clad layer 106 having a layer thickness of 50 nm and formed of a p-type $Al_{0.10}Ga_{0.90}N$ were stacked in the order mentioned to produce the light-emitting part of the p-n junction DH structure. By further stacking the p-type GaN layer (layer thickness=80 nm) as the contact layer 107 on the surface of the upper clad layer 106 mentioned above, the formation of the stacked structure 100 was completed.

In the region of part of the p-type contact layer 107 mentioned above, the p-type ohmic electrode 108 was formed of a gold (Au)-nickel oxide (NiO) alloy. The n-type ohmic electrode 109 was formed on the surface of the n-type GaN layer 103 exposed by removing such layers as the lower clad layer 104 and the light-emitting layer 105 existing in the region assigned for the disposition of the electrode 109 by a dry etching means. As a result, the LED 1 was completed.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 460 nm. The emission luminance in the state of a chip was about 1.8 cd. Since the Group III nitride semiconductor layer excelling in crystallinity could be formed by disposing the lower clad layer 104 to the upper clad layer 106 constituting the light-emitting part of the p-n junction DH structure and the n-type GaN layer 103 furnished with the n-type ohmic electrode 109 on the hexagonal BP layer 102, the voltage in the reverse direction assumed a high magnitude exceeding 15 V when the current in the reverse direction was fixed at 10 μA. Further, owing to the fineness of crystallinity of the Group III nitride semiconductor layer, virtually no local breakdown could be discerned in the LED 1 consequently produced.

Example 8

This invention will be specifically explained by citing as an example the case of configuring the compound semiconductor device LED provided on the hexagonal monomeric BP layer disposed as bonded on the (1.1.-2.0.) crystal face of sapphire with ohmic electrodes.

Figure 21:
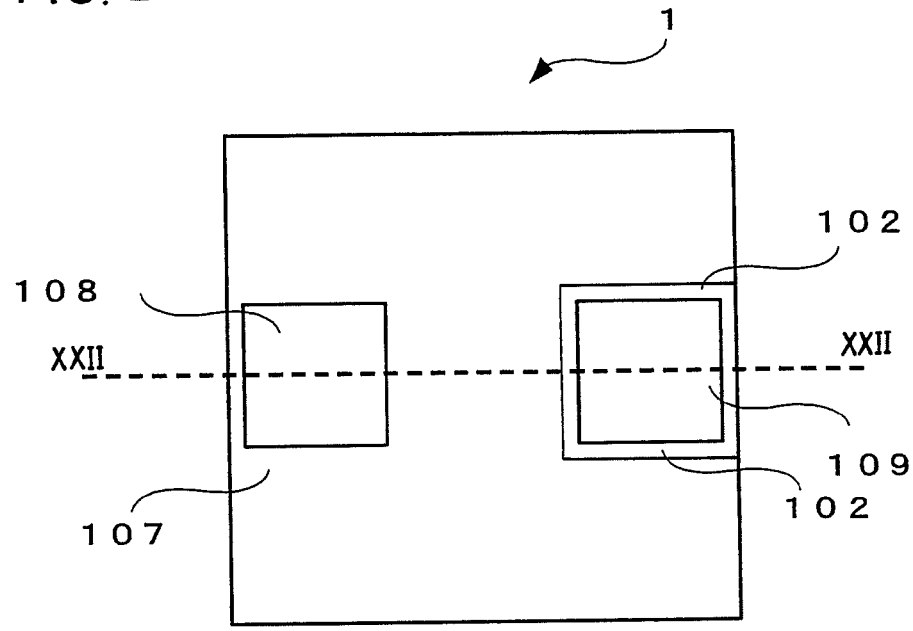
FIG. 21 is a schematic plan view illustrating the LED described in Example 8.
Figure 22:
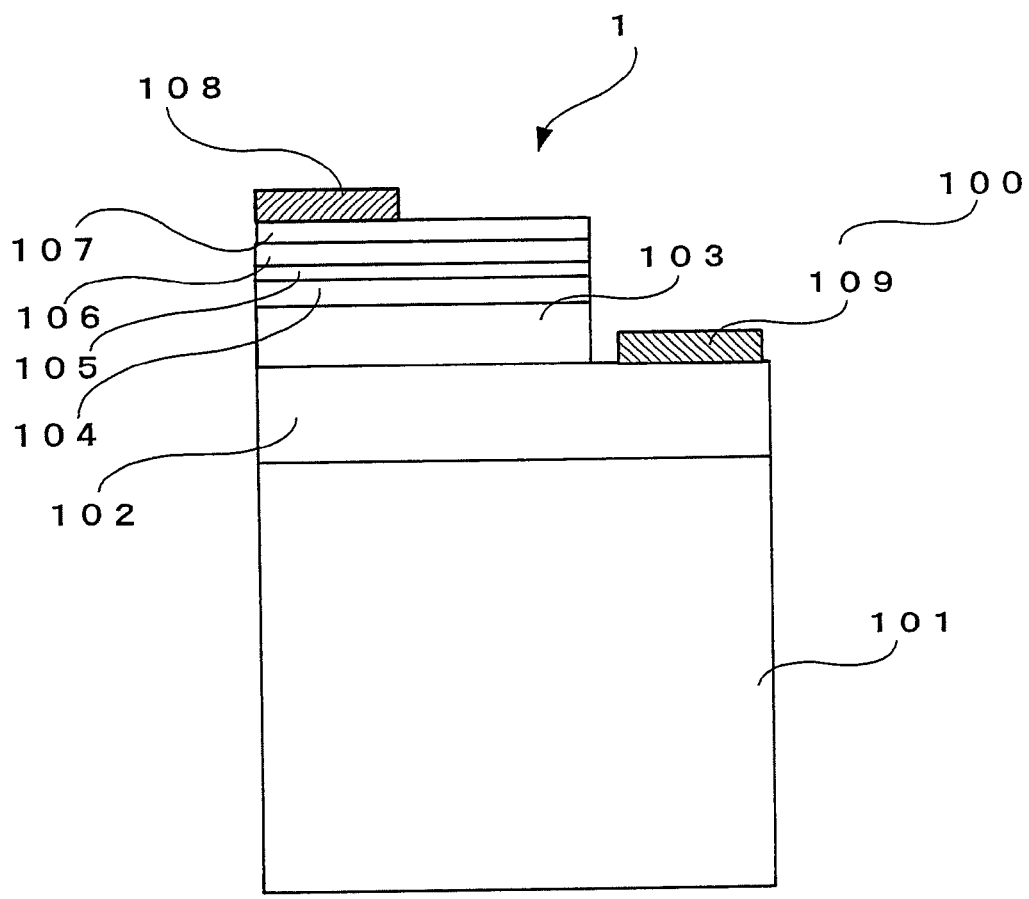
FIG. 22 is a schematic cross section illustrating the LED taken through FIG. 21 along broken line XXII-XXII.

FIG. 21 schematically illustrates the planar structure of the LED 1 to which this Example 8 pertains. Then, FIG. 22 is a schematic cross section illustrating the LED 1 taken through FIG. 21 alone broken line XXII-XXII.

The stacked structure 100 intended to manufacture the LED 1 was formed by using as the substrate 101 the sapphire (α-alumina single crystal) having the (1.1.-2.0.) crystal face (commonly called A-plane) as its surface. On the surface of the (1.1.-2.0.) crystal face of the substrate 101, the undoped n-type hexagonal monomeric BP layer (layer thickness=2000 nm) having the (1.1.-2.0.) crystal face as its surface was formed at 750° C. by utilizing an ordinary MOCVD method. The carrier concentration of the n-type BP layer 102 was determined to be $2\times10^{19}$ cm$^{-3}$.

On the surface formed of the (1.1.-2.0.) crystal face of the hexagonal BP layer 102, the undoped n-type hexagonal GaN layer (layer thickness=1200 nm) 103 was grown. By the analysis utilizing an ordinary TEM it was found that the twins and the stacking faults were contained in the hexagonal BP layer 102 at a small density of less than $1\times10^4$ cm$^{-2}$. Since the hexagonal GaN layer 103 was disposed as bonded to the hexagonal BP layer 102 excelling in crystallinity, the twins and the stacking faults were scarcely discerned in the hexagonal GaN layer 103.

On the (1.1.-2.0.) surface of the hexagonal n-type GaN layer 103, the lower clad layer (layer thickness=280 nm) 104 formed of a hexagonal n-type $Al_{0.15}Ga_{0.85}N$, the light-emitting layer 105 of the multi-quantum-well structure formed of 5 cycles severally consisting of a $Ga_{0.85}In_{0.15}N$ well layer (layer thickness=3 nm)/$Al_{0.01}Ga_{0.99}N$ barrier layer (layer thickness=8 nm), and the upper clad layer 106 having a layer thickness of 85 nm and formed of a p-type $Al_{0.10}Ga_{0.90}N$ were stacked in the order mentioned to produce the light-emitting layer of the p-n junction DH structure. By further stacking the p-type GaN layer (layer thickness=80 nm) as the contact layer 107 on the surface of the upper clad layer 106 mentioned above, the formation of the stacked structure 100 was completed.

In the region of part of the p-type contact layer 107 mentioned above, the p-type ohmic electrode 108 formed of a gold (Au)•nickel oxide (NiO) alloy was formed.

The n-type ohmic electrode 109 was formed on the surface of the hexagonal n-type BP layer 102 exposed by removing the layers 103 to 107 existing above the hexagonal n-type BP layer 102 in the region assigned for the disposition of the n-type ohmic electrode 109 by dry etching means. The n-type ohmic electrode 109 was formed of a gold (Au)-germanium (Ge) alloy layer (alloy of 90 weight % of Au and 10 weight % of Ge) obtained by an ordinary vacuum deposition method.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 460 nm. The emission luminance in the state of a chip was about 1.6 cd. Since the Group III nitride semiconductor layers 104 to 106 and the n-type ohmic electrode 109 constituting the light-emitting part of the p-n junction DH structure were disposed on the hexagonal BP layer 102 excelling in crystallinity, the voltage in the reverse direction (when the current in the reverse direction was fixed at 10 μA) assumed a high magnitude exceeding 15 V. Further, the local breakdown was scarcely discerned.

Example 9

This invention will be specifically explained by citing as an example the case of configuring a compound semiconductor LED by disposing an n-type and a p-type ohmic electrode on an n-type and a p-type hexagonal monomeric BP layer.

Figure 23:
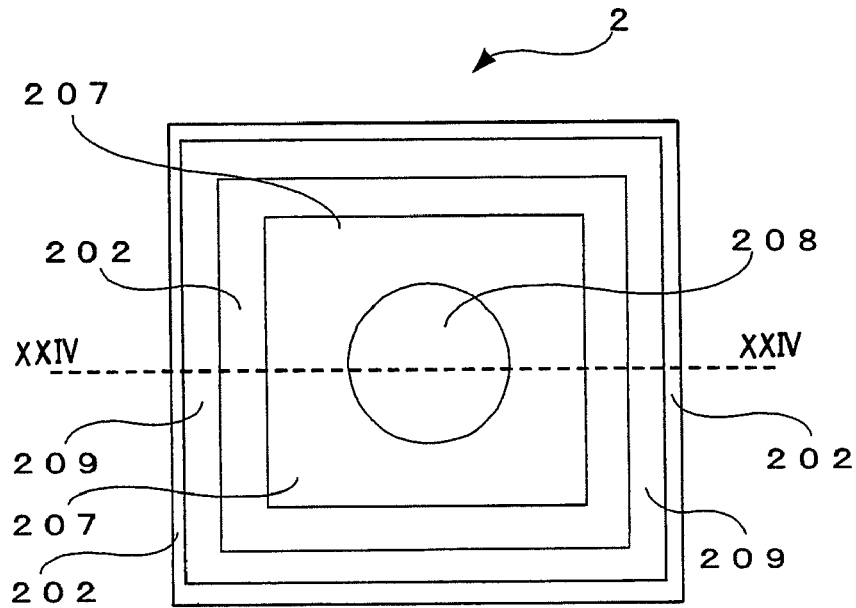
FIG. 23 is a schematic plan view illustrating the LED described in Example 9.
Figure 24:
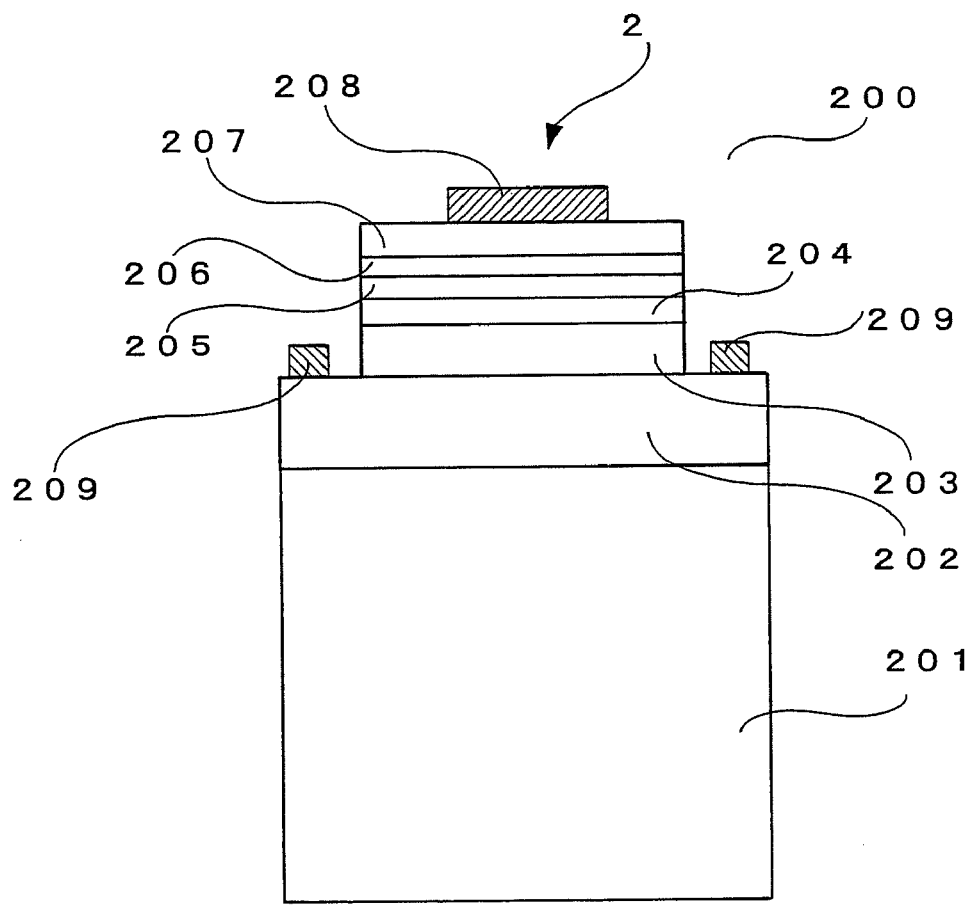
FIG. 24 is a schematic cross section illustrating the LED taken through FIG. 23 along broken line XXIV-XXIV.

FIG. 23 schematically illustrates the planar structure of a LED 2 to which this Example 9 pertains. Then, FIG. 24 is a schematic cross section illustrating the LED 2 taken through FIG. 23 along broken line XXIV-XXIV.

A stacked structure 200 intended to manufacture the LED 2 was formed, as described in the preceding Example 8, on the sapphire (α-alumina single crystal) having the (1.1-2.0.) crystal face (commonly called A-plane) as its surface and serving as a substrate 201. On the surface of the (1.1.-2.0.) crystal face of the substrate 201, an undoped n-type hexagonal monomeric BP layer (layer thickness=2000 nm) 202 having a (1.1.-2.0.) crystal face as its surface was formed at 750° C. by utilizing the ordinary MOCVD method in the same manner as described in the preceding Example 8. The carrier concentration of the n-type BP layer 202 was $2\times10^{19}$ cm$^{-3}$. By the analysis utilizing an ordinary TEM, it was found that the twins and the stacking faults were contained in the hexagonal BP layer 202 at a small density of less than $1\times10^4$ cm$^{-2}$.

On the surface formed of the (1.1.-2.0.) crystal face of the hexagonal BP layer 202, an undoped n-type hexagonal GaN layer (layer thickness=1200 nm) 203, a lower clad layer (layer thickness=280 nm) 204 formed of a hexagonal n-type $Al_{0.15}Ga_{0.85}N$ having the (1.1.-2.0.) crystal face as its surface, a light-emitting layer 205 of the multi-quantum-well structure formed of 5 cycles severally consisting of a $Ga_{0.85}In_{0.15}N$ well layer (layer thickness=3 nm)/$Al_{0.01}Ga_{0.99}N$ barrier layer (layer thickness=8 nm), and an upper clad layer 206 having a layer thickness of 85 nm and formed of a p-type $Al_{0.10}Ga_{0.90}N$ were stacked in the order mentioned as described in the preceding Example 8, to produce the light-emitting part of the p-n junction DH structure.

On the surface of the hexagonal n-type upper clad layer 206 having the (1.1-2.0.) crystal face as its surface, a p-type hexagonal undoped monomeric BP layer (layer thickness=200 nm) was deposited as a contact layer 207. By an ordinary cross-sectional TEM observation, such plane defects as twins and stacking faults and dislocations were scarcely discerned in the hexagonal undoped monomeric BP layer constituting the contact layer 207.

In the central part of the surface of the p-type contact layer 207 mentioned above, a p-type ohmic electrode 208 formed of a gold (Au)•zinc (Zn) alloy (alloy of 95 weight % of Au and 5 weight % of Zn) and assuming a circular planar shape was formed.

An n-type ohmic electrode 209 was formed in a circular shape in plan view on the surface of the hexagonal n-type BP layer 202 exposed by removing the individual layers 203 to 207 above the hexagonal n-type BP layer 202 existing in the region assigned for the disposition of the n-type ohmic electrode 209 by dry etching means. The n-type ohmic electrode 209 was formed with a gold (Au)-germanium (Ge) alloy layer (alloy of 90 weight % of Au and 10 weight % of Ge) by an ordinary vacuum deposition method.

The hexagonal monomeric BP layers 207 and 202 were tested for light-emitting property by causing the device-operating electric current of 20 mA to flow in the forward direction between the p-type and n-type ohmic electrodes 208 and 209 that were disposed respectively on the monomeric BP layers 207 and 202. The main wavelength of the light emitted from the LED 2 was about 460 nm. The emission luminance in the state of a chip was about 1.6 cd. Since the Group III nitride semiconductor layers 204 to 206 and the ohmic electrodes 208 and 209 constituting the light-emitting part of the p-n junction DH structure were disposed on the hexagonal BP layers 202 and 207 excelling in crystallinity, the voltage in the reverse direction (when the current in the reverse direction was fixed at 10 µA) assumed a high magnitude exceeding 18 V. Further, the local breakdown was scarcely discerned.

Example 10

This invention will be specifically explained by citing as an example the case of configuring a GaN-based FET by disposing a Schottky gate on high-resistance n-type hexagonal monomeric BP layers and ohmic contact source and drain electrodes.

Figure 25:
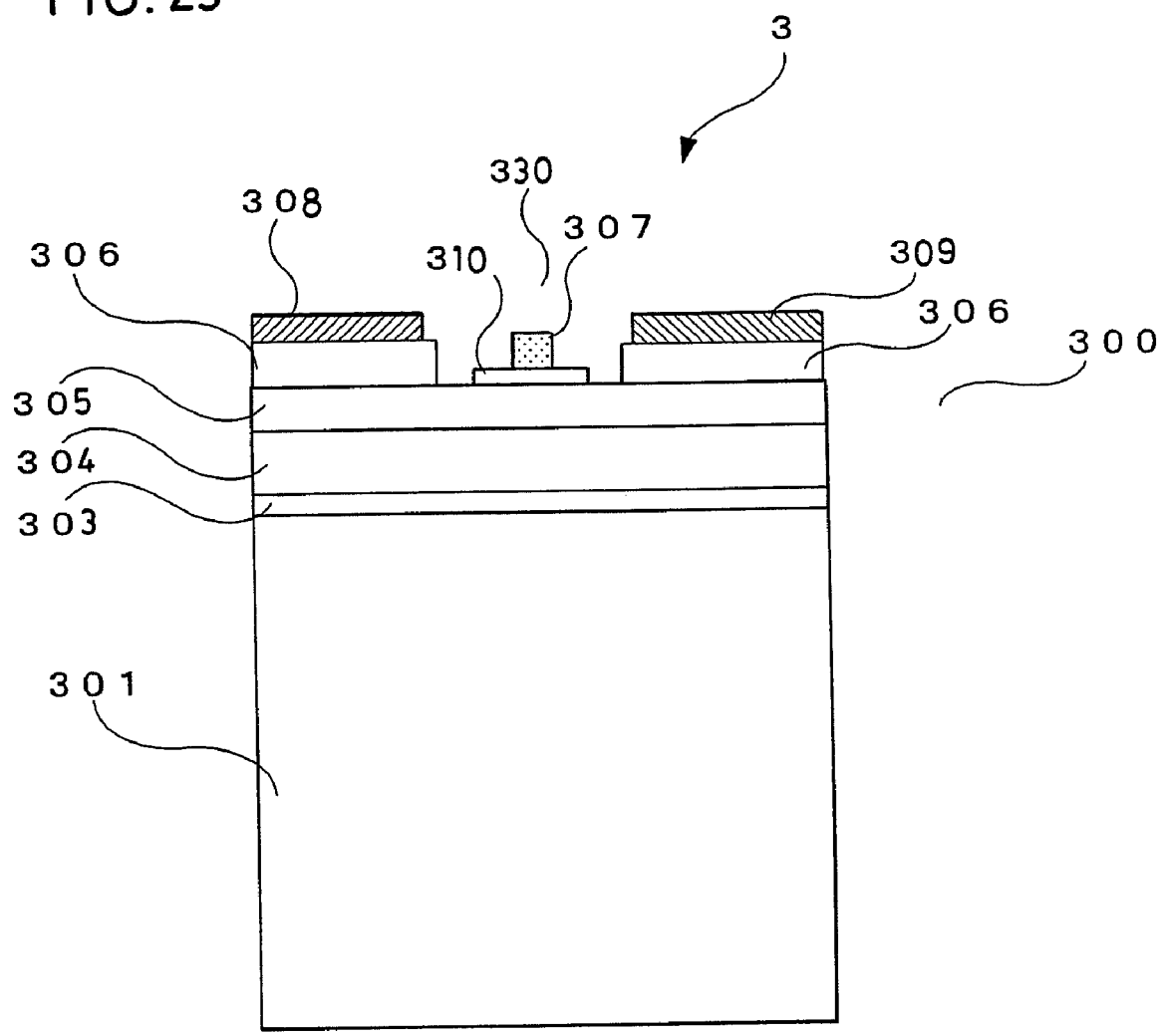
FIG. 25 is a schematic cross section illustrating the FET of the LED described in Example 10.

FIG. 25 schematically illustrates the cross-sectional structure of a GaN-based FET 3 to which this Example 10 pertains.

The stacked structure 300 intended to manufacture the FET 3 was formed, as described in the preceding Example 8, on the sapphire (α-alumina single crystal) having the (1.1.-2.0.) crystal face (commonly called A-plane) as its surface and serving as a substrate 301. On the surface of the (1.1.-2.0.) crystal face of the substrate 301, an undoped monomeric BP layer (layer thickness=720 nm) 303 of high resistance was formed at 1050° C. by utilizing an ordinary MOCVD method. The carrier concentration of the BP layer 303 of high resistance was less than $1 \times 10^{17}$ cm$^{-3}$. According to the analysis utilizing an ordinary TEM, the twins and the stacking faults were contained in the BP layer 303 in a small amount of less than $1 \times 10^4$ cm$^{-2}$.

On the surface of the BP layer 303 of high resistance, an electron transporting layer 304 formed of an undoped hexagonal GaN layer (layer thickness=48 nm) and an electron supply layer 305 (layer thickness=28 nm) having a (1.1-2.0.) crystal face as its surface and formed of a hexagonal n-type Al$_{0.25}$Ga$_{0.75}$N were stacked in the order mentioned. The electron transporting layer 304 and the electron supply layer 305 were both formed by the MOCVD method.

On the surface of the hexagonal n-type electron supply layer 305 having the (1.1.-2.0.) crystal face as its surface, a Schottky contact-forming layer 310 intended to allow disposition of a gate electrode 307 was disposed as bonded. The Schottky contact-forming layer 310 was formed of a hexagonal monomeric BP of high resistance having a layer thickness of 12 nm and a carrier concentration of less than $5 \times 10^{16}$ cm$^{-3}$. After the Schottky contact-forming layer 310 was formed, the Schottky contact-forming layer 310 was allowed to persist exclusively in the central region in plan view which was intended to allow formation of the Schottky gate electrode 307 and the Schottky contact electrode-forming layer existing in the rest of the region was removed by an ordinary dry etching means.

Then, an n-type hexagonal monomeric BP layer (layer thickness=100 nm and carrier concentration=$2 \times 10^{19}$ cm$^{-3}$) was stacked as a contact layer 306 so as to cover the whole surfaces of both the Schottky contact-forming electrode 310 allowed to persist and the electron supply layer 305 exposed in the periphery thereof. By an ordinary cross-sectional TEM observation, such plane defects as twins and stacking faults and dislocations were scarcely discerned in the hexagonal monomeric BP layer constituting the contact layer 306.

Thereafter, for the purpose of disposing the gate electrode 307, the contact layer 306 formed of a hexagonal n-type BP layer and covering the Schottky contact-forming layer 310 was removed by an ordinary dry etching means. On the surface of the Schottky contact-forming layer 310 of a recess part 330 that was exposed by removing the contact layer 306, the Schottky gate 307 formed of titanium (Ti) was disposed by the ordinary electron beam deposition means.

Then, on the surface of one of the two separated parts of the hexagonal BP layer jointly constituting the contact layer 306 and severally existing on the opposite sides across the gate 307, an ohmic contact source electrode 308 was formed. Then, on the surface of the contact layer 306 formed of the remaining separated part of the hexagonal BP layer existing at the position opposite across the gate 307, a drain electrode 309 was disposed to complete manufacture of the GaN-based FET 3. The ohmic electrodes constituting the source electrode 308 and the drain electrodes 309 were formed of a gold (Au)-germanium (Ge) alloy layer (alloy of 95 weight % of Au and 5 weight % of Ge) by an ordinary vacuum deposition method.

Since the ohmic electrodes, i.e., the source electrode 308 and the drain electrode 309, were both disposed on the contact layer 306 formed of a hexagonal monomeric BP and containing twins and stacking faults only in a small amount, the disadvantage of suffering the drain current to flow in the pattern of a short circuit and in a concentrated state between the region of part of the source electrode disposed in the region containing crystalline defects in a high density and the region of the drain electrode opposed thereto as experienced heretofore could be solved. Thus, the FET 3 possessing such distinctive features of performance as allowing the device-operating electric current to flow at a uniform current density to the electron transporting layer 304 could be produced.

Further, since the Schottky gate 307 was disposed contiguously on the Schottky contact-forming layer 310 scarcely containing twins and stacking faults and formed of a hexagonal monomeric BP of high resistance, the GaN-based FET 3 furnished with the gate 307 that revealed only insignificant leakage current and manifested high breakdown voltage could be produced.

Example 11

The contents of this invention will be specifically explained by citing as an example the case of configuring a compound semiconductor LED furnished with a hexagonal monomeric BP layer as a lower clad layer.

Figure 26:
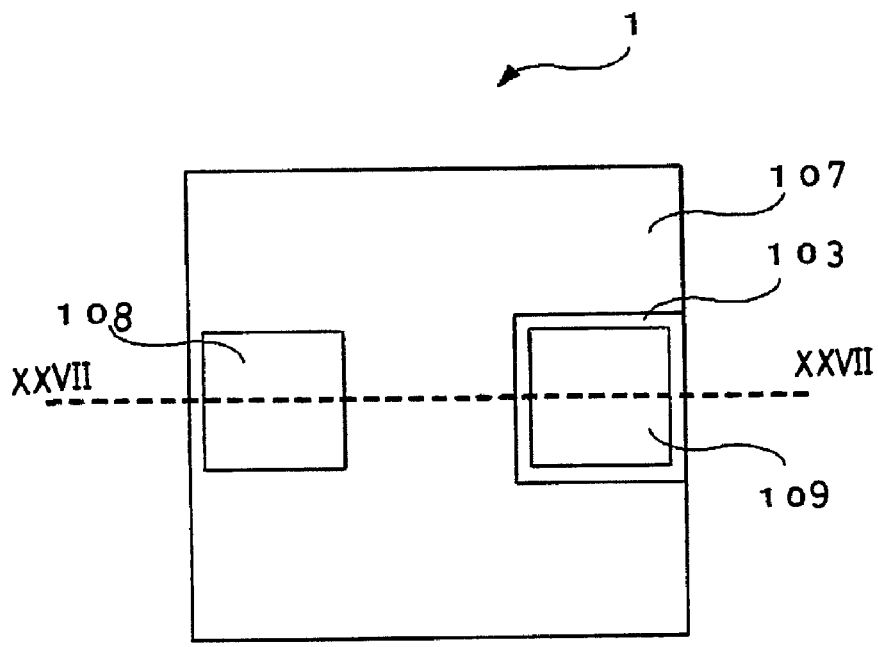
FIG. 26 is a schematic plan view illustrating the LED described in Example 11.
Figure 27:
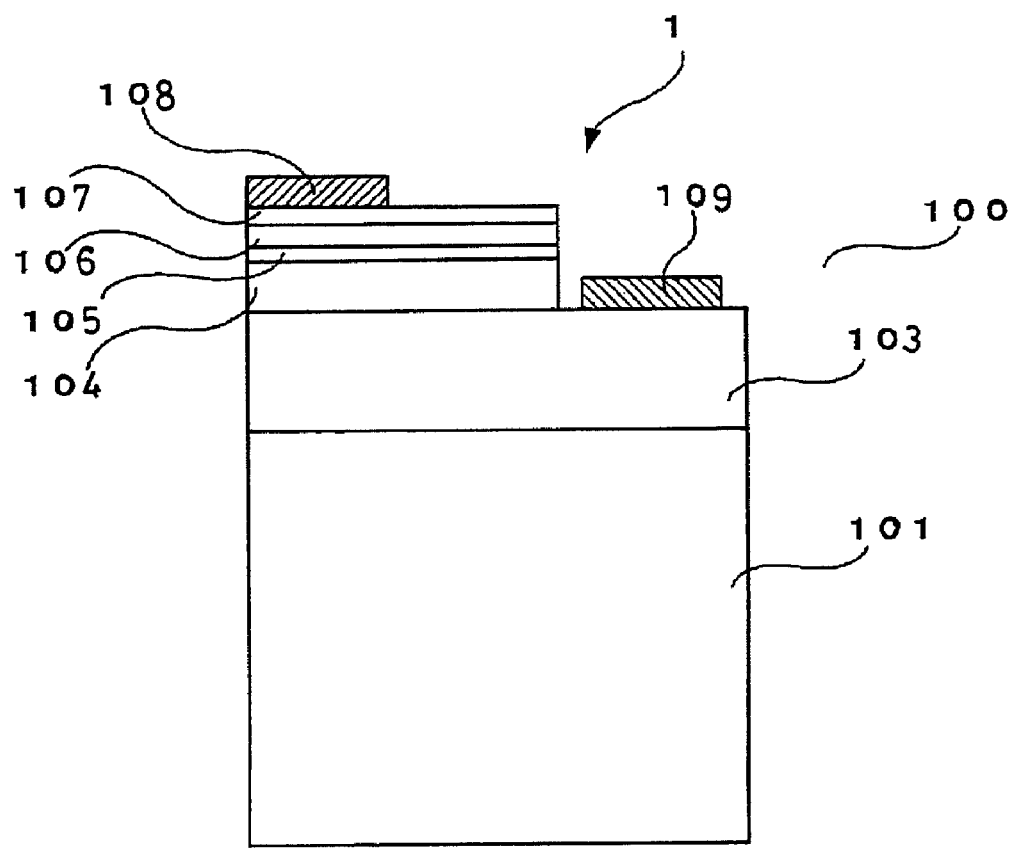
FIG. 27 is a schematic cross section illustrating the LED taken through FIG. 26 along broken line XXVII-XXVII.

FIG. 26 is a schematic plan view illustrating a compound semiconductor LED 1 described in this Example 11. Then, FIG. 27 is a schematic cross section illustrating the LED 1 taken through FIG. 26 along broken line XXVII-XXVII.

The stacked structure 100 to be used for the LED 1 was formed by using a sapphire (α-Al$_2$O$_3$ single crystal) as a substrate 101. On the surface formed of the (1.-1.0.2) crystal face (R crystal face) of the substrate 101, an n-type GaN layer 103 having a layer thickness of about 8 μm and having a (1.1.-2.0.) crystal face as its surface was formed by an ordinary reduced-pressure MOCVD method.

On the surface formed of the (1.1.-2.0.) crystal face of the n-type GaN layer 103, a boron phosphide-based semiconductor layer formed of a hexagonal undoped monomeric BP was formed as a lower clad layer 104 at 750° C. by an ordinary atmospheric pressure (roughly atmospheric pressure) MOCVD method. The boron phosphide-based semiconductor layer constituting the lower clad layer had a layer thickness of about 290 nm and had the (1.1.-2.0.) crystal face as its surface. Then, the conduction type of this layer was n-type and the carrier concentration thereof was found by an ordinary electrolyte C-V method to be about $2 \times 10^{19}$ cm$^3$. Further, by an ordinary TEM analysis, it was shown that the dislocations contained in the lower GaN layer 103 were inhibited from being propagated by the interface with the boron phosphide-based semiconductor layer serving as the lower clad layer 104.

On the surface formed of the (1.1.-2.0.) crystal face of the BP layer constituting the lower clad layer 104, a light-emitting layer 105 formed of a multi-quantum-well structure resulting from stacking 5 cycles severally consisting of two layers, i.e., an n-type Ga$_{0.85}$In$_{0.12}$N layer as a well layer and an n-type GaN layer as a buffer layer was disposed. In the Ga$_{0.88}$In$_{0.12}$N well layer assuming the multi-quantum-well structure, since the Ga$_{0.88}$In$_{0.12}$N well layer bonded to the lower clad layer 104 of a hexagonal BP layer was so formed as to have the (1.1.-2.0.) crystal face at its surface, this well layer turned out to be a hexagonal single crystal layer excelling in crystallinity. By the ordinary TEM analysis, twins were scarcely discerned in the well layer bonded to the surface of the lower clad layer 104.

Owing to the fineness of crystallinity of the well layer bonded via the (1.1.-2.0.) crystal face to the surface of the lower clad layer 104, both the GaN barrier layer and the Ga$_{0.88}$In$_{0.12}$N well layer constituting still higher layers were enabled to turn out to be hexagonal single crystal layers scarcely containing twins and excelling in crystallinity. Further, both the well layer and the barrier layer constituting the light-emitting layer 105 of the multi-quantum-well structure turned out to be hexagonal single crystal layers having the (1.1.-2.0.) crystal faces thereof stacked parallel to the (1.1.-2.0.) crystal face constituting the surface of the lower clad layer 104.

On the (1.1.-2.0.) surface of the n-type GaN layer constituting the outermost surface layer of the light-emitting layer of the multi-quantum-well structure that could be formed of the hexagonal Group III nitride semiconductor layer containing crystalline defects only in a small amount by disposing the hexagonal BP layer as the under layer, a p-type Al$_{0.15}$Ga$_{0.85}$N layer was disposed as an upper clad layer 106 at 1080° C. by an ordinary reduced-pressure MOCVD method. The upper clad layer 106 was formed of a hexagonal Al$_{0.15}$Ga$_{0.85}$N layer having a carrier concentration of about $4 \times 10^{17}$ cm$^{-3}$ and a layer thickness of about 90 nm. Thus, the light-emitting part of the p-n junction DH structure was composed of the BP layer constituting the lower clad layer 104 mentioned above, the light-emitting layer 105, and the upper clad layer 106.

On the surface of the Al$_{0.15}$Ga$_{0.85}$N formed of the (1.1.-2.0.) crystal face constituting the upper clad layer 106, a p-type GaN layer was disposed as a contact layer 107 at 1050° C. by an ordinary reduced-pressure MOCVD method. The contact layer 107 was formed of a hexagonal GaN layer having a carrier concentration of about $1 \times 10^{18}$ cm$^{-3}$ and a layer thickness of about 80 nm.

After the contact layer 107 formed of a p-type GaN layer was disposed as the uppermost surface layer to complete the formation of the stacked structure 100, a p-type ohmic electrode 108 was formed at one edge of the surface of the contact layer 107. A p-type ohmic electrode 108 was composed of gold and nickel oxide. An n-type ohmic electrode 109 was formed on the lower clad layer 104 constituting the hexagonal boron phosphide-based semiconductor layer exposed by utilizing an ordinary dry etching method. The n-type ohmic electrode 109 was composed of a gold-germanium alloy.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 450 nm. The emission luminance in the state of a chip was about 1.2 cd. The voltage in the forward direction was about 3.5 V when the current flowing in the forward direction was fixed at 20 mA. By reflecting the fineness of crystallinity of the hexagonal boron phosphide-based semiconductor layer constituting the lower clad layer 104, the light-emitting layer 105, and the Group III nitride semiconductor layer constituting the upper clad layer 106 of which the light-emitting part of the p-n junction DH structure was composed, the voltage in the reverse direction was allowed to reach a high magnitude exceeding 10 V when the current in the reverse direction was fixed at 10 μA. Further, since the hexagonal boron phosphide-based semiconductor layer constituting the lower clad layer 104 inhibited the propagation of dislocations from the n-type GaN layer 103 to the light-emitting part of the p-n junction DH structure, local breakdown was scarcely discerned in the LED 1 consequently obtained.

Example 12

The contents of this invention will be specifically explained by citing as an example the case of configuring an LED which is furnished with a light-emitting part having a hexagonal boron phosphide-based semiconductor layer formed of an upper and a lower clad layer nipping a light-emitting layer.

Figure 28:
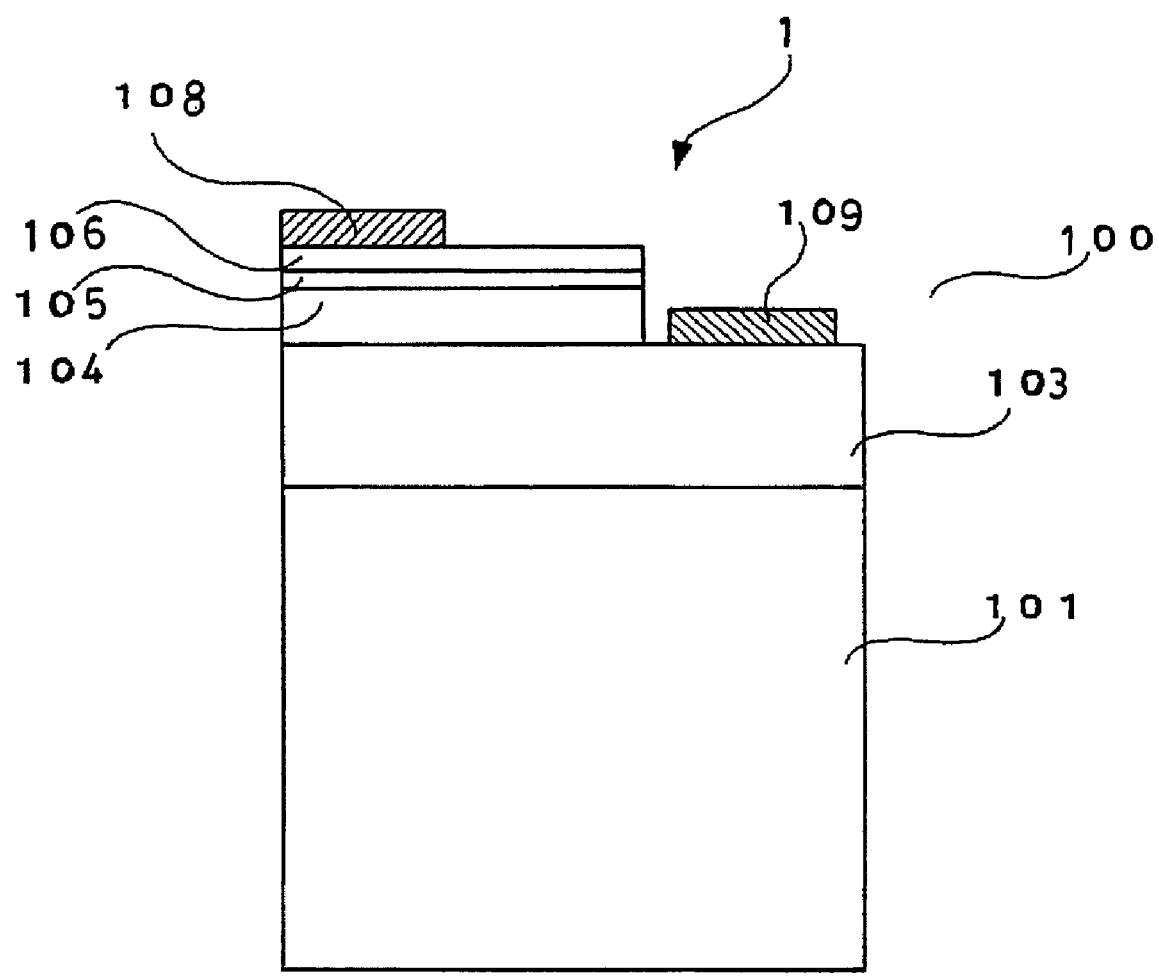
FIG. 28 is a schematic cross section illustrating the LED described in Example 12.

FIG. 28 schematically illustrates the sectional structure of a LED 1 described in this Example 12. The component elements like those shown in FIG. 26 and FIG. 27 are denoted by like reference numerals in FIG. 28.

On the surface of a sapphire substrate 101, an n-type hexagonal GaN layer 103, a lower clad layer 104 formed of an n-type hexagonal monomeric BP layer, and a light-emitting layer 105 of a multi-quantum-well structure were stacked in the order mentioned as described in the preceding Example 11. Since the light-emitting layer 105 had the lower clad layer 104 formed of a boron phosphide-based semiconductor layer as an under layer, it was ultimately composed of a hexagonal GaInN well layer containing such crystalline defects as twins only in a small amount and a GaN barrier layer.

Then, on the barrier layer formed of an n-type hexagonal GaN layer constituting the uppermost surface layer of the light-emitting layer, a hexagonal p-type boron phosphide-based semiconductor layer was disposed as an upper clad layer 106 by an ordinary MOCVD method. This upper clad layer 106 was composed of an undoped p-type hexagonal monomeric BP layer. The upper clad layer 106 had a layer thickness of about 250 nm and a carrier concentration of about $2 \times 10^{19}$ cm$^{-3}$. Then, the surface of the upper clad layer 106, like the surface of the barrier layer constituting an under layer and formed of a hexagonal GaN, was formed of a (1.1.-2.0.) crystal face.

Since the p-type hexagonal BP layer constituting the upper clad layer 106 had a forbidden band width exceeding about 3.1 eV, the boron phosphide-based semiconductor layer formed of hexagonal BP was utilized as the upper clad layer 106 and made to compose the light-emitting part of a p-n junction DH structure in conjunction with the n-type boron phosphide-based semiconductor layer 103 and the light-emitting layer 105.

Since the hexagonal boron phosphide-based semiconductor layer made to constitute the upper clad layer 106 possessed a high carrier concentration, the manufacture of the stacked structure 100 for use in the LED 1 was completed without venturing to form on the upper clad layer 106 a contact layer intended to allow disposition of a p-type ohmic electrode 108 unlike the preceding Example 11.

The p-type ohmic electrode 108, as illustrated in FIG. 28, was disposed as directly bonded to the surface of a hexagonal p-type boron phosphide-based semiconductor layer. An n-type ohmic electrode 109, as described in the preceding Example 11, was disposed on the surface of the lower clad layer 104 formed of a hexagonal n-type boron phosphide-based semiconductor layer exposed by utilizing an ordinary dry etching method, to produce the LED 1.

This LED 1 was tested for light-emitting property by causing the device-operating electric current of 20 mA to flow in the forward direction between the p-type and n-type ohmic electrodes 108 and 109. The main wavelength of the light emitted from the LED 1 was about 450 nm. The voltage generated by the LED 1 in the forward direction when the current in the forward direction was fixed at 20 mA was 3.3 V, a lower magnitude than that of the LED 1 described in the preceding Example 11, because the upper clad layer 106 was formed of a hexagonal boron phosphide-based semiconductor layer possessing a high carrier concentration and excelling in conductivity. The emission luminance in the state of a chip assumed a high magnitude of about 1.8 cd because both the upper clad layer and the lower clad layer were composed of a hexagonal boron phosphide-based semiconductor layer.

By reflecting the fineness of crystallinity of the hexagonal boron phosphide-based semiconductor layer constituting the lower clad layer 104 and the upper clad layer 106 of which the light-emitting part of the p-n junction DH structure was composed and the Group III nitride semiconductor layer constituting the light-emitting layer 105, the voltage generated in the reverse direction was allowed to reach a high magnitude exceeding 10 V when the current in the reverse direction was fixed at 10 μA. Further, since the hexagonal boron phosphide-based semiconductor serving as the lower clad layer 104 inhibited the propagation of dislocations from the n-type GaN layer 103 to the light-emitting part of a p-n junction DH structure, local breakdown was scarcely discerned in the LED 1 consequently obtained.

INDUSTRIAL APPLICABILITY

The compound semiconductor device of this invention, as explained above, is a compound semiconductor device configured by disposing electrodes on a stacked construction provided with a hexagonal single crystal, a boron phosphide-based semiconductor layer formed on the surface of the single crystal, and a compound semiconductor layer formed of a compound semiconductor formed on the boron phosphide-based semiconductor layer, and the device being adapted to have the aforementioned boron phosphide-based semiconductor layer of a hexagonal crystal disposed on the surface formed of a (1.1.-2.0.) crystal face of the aforementioned single crystal layer. Thus, this invention enables formation of a boron chloride-based semiconductor layer containing such crystalline defects as twins and stacking faults only at a small density and excelling in crystallinity.

This invention, therefore, enables the produced boron phosphide-based semiconductor layer to contain such crystalline defects as twins and stacking faults only at a small density and excel in crystallinity and consequently permits utilization of this boron phosphide-based semiconductor layer and provision of a semiconductor device having various properties enhanced for a device.

Then, this invention of the aforementioned configuration is enabled to utilize thin layers formed of a boron phosphide-based semiconductor material of superior quality containing anti-phase boundaries only in a small amount and a Group III nitride semiconductor material and consequently provide a compound semiconductor device capable of excelling in optical properties and electrical properties and a method for the production of the compound semiconductor device.

Further, this invention of the aforementioned configuration allows provision of a semiconductor device furnished with a boron phosphide-based semiconductor layer that is capable of decreasing the leakage of a device-operating electric current, heightening the efficiency of photoelectric conversion as a light-emitting device, heightening also the voltage in the reverse direction, imparting high breakdown voltage to a gate electrode for a field effect transistor, and improving the pinch-off property of the drain current.

This invention of the aforementioned configuration enables a clad layer constituting the light-emitting part of a DH structure to be formed with a boron phosphide-based semiconductor layer containing crystalline defects only in a small amount and excelling in quality and permits provision of a semiconductor light-emitting device having light-emitting properties substantially enhanced.

Then, this invention of the aforementioned configuration contemplates forming a hexagonal single crystal layer with a Group III nitride semiconductor and providing a first stacked structure part composed of a hexagonal Group III nitride semiconductor having a (1.1.-2.0.) crystal face as its surface and a hexagonal boron phosphide-based semiconductor layer disposed as bonded to the surface of the Group III nitride semiconductor and, as a result, prevents the dislocations contained in the Group III nitride semiconductor from being propagated through the interface of the stacked structure part toward the boron phosphide-based semiconductor layer. It further contemplates providing a second stacked structure part by causing the hexagonal Group III nitride semiconductor to be bonded to the upper-side surface of the hexagonal boron phosphide-based semiconductor layer constituting the aforementioned first stacked structure part. Owing to the provision of the second stacked structure part, it is enabled to produce a Group III nitride semiconductor containing such crystalline defects as penetrating dislocations only at a decreased density. This invention, therefore, is capable of producing a stacked structure furnished with a semiconductor layer excelling in crystallinity even when it is provided on the substrate with a Group III nitride semiconductor layer containing crystalline defects in a large amount and consequently providing a compound semiconductor device having enhanced the properties of a device.

The invention claimed is:

1. A compound semiconductor device comprising:
a compound semiconductor having a stacked structure of a hexagonal single crystal layer, a boron phosphide-based semiconductor layer formed on a surface of the hexagonal single crystal layer and a compound semiconductor layer disposed on the boron phosphide-based semiconductor layer; and
electrodes disposed on the stacked structure;
wherein the boron phosphide-based semiconductor layer is formed of a hexagonal crystal disposed on a surface formed of a (1.1.-2.0.) crystal face of the hexagonal single crystal layer.

2. A compound semiconductor device according to claim 1, wherein the hexagonal single crystal layer is formed of an α-alumina single crystal.

3. A compound semiconductor device according to claim 1, wherein the hexagonal single crystal layer is formed of a hexagonal Group III nitride semiconductor.

4. A compound semiconductor device according to claim 1, wherein the boron phosphide-based semiconductor layer is formed of a crystal having a (1.1.-2.0.) crystal face as its surface.

5. A compound semiconductor device according to claim 1, wherein the boron phosphide-based semiconductor layer is formed of a crystal having a (1.0.-1.0.) crystal face as its surface.

6. A compound semiconductor device according to claim 1, wherein the boron phosphide-based semiconductor layer has an interior thereof in which (0.0.0.1.) crystal faces are arranged substantially parallel to a thickness direction thereof and in which a distance of "n" continuous (0.0.0.2.) crystal faces thereof equals substantially a length of a c-axis of the single crystal layer, the "n" denoting a positive integer of 2 or more.

7. A compound semiconductor device according to claim 6, wherein the "n" denotes 6 or less.

8. A compound semiconductor device according to Claim 1, wherein the compound semiconductor layer is formed of a hexagonal semiconductor material.

9. A compound semiconductor device according to claim 1, wherein the boron phosphide-based semiconductor layer and the compound semiconductor layer are bonded via a (1.1.-2.0.) crystal face as an interface.

10. A compound semiconductor device according to claim 1, wherein the boron phosphide-based semiconductor layer and the compound semiconductor layer are bonded via a (1.0.-1.0.) crystal face as an interface.

11. A compound semiconductor device according to claim 9, wherein a (0.0.0.1.) crystal face constituting the compound semiconductor layer and a (0.0.0.1.) crystal face constituting the boron phosphide-based semiconductor layer are arranged parallel to a stacking direction of the compound semiconductor.

12. A compound semiconductor device according to claim 1, wherein the boron phosphide-based semiconductor layer does not contain an antiphase grain boundary.

13. A compound semiconductor device according to claim 1, wherein the electrodes are so disposed that a device-operating current may flow in a direction substantially parallel to both a (0.0.0.1.) crystal face constituting the boron phosphide-based semiconductor layer and a (0.0.0.1.) crystal face constituting the compound semiconductor layer.

14. A compound semiconductor device according to claim 1, wherein the electrodes are so disposed that a device-operating current may flow in a direction substantially vertical to both a (0.0.0.1.) crystal face constituting the boron phosphide-based semiconductor layer and a (0.0.0.1.) crystal face constituting the compound semiconductor layer.

15. A compound semiconductor device according to claim 1, wherein the boron phosphide-based semiconductor layer is formed of a hexagonal monomeric boron phosphide.

16. A compound semiconductor device according to claim 14, wherein the hexagonal monomeric boron phosphide has a c-axis having a length in a range of 0.52 nm or more and 0.53 nm or less.

* * * * *